(12) United States Patent
Nishimura et al.

(10) Patent No.: US 8,330,350 B2
(45) Date of Patent: Dec. 11, 2012

(54) ORGANIC ELECTROLUMINESCENCE DEVICE AND MATERIAL FOR ORGANIC ELECTROLUMINESCENCE DEVICE

(75) Inventors: Kazuki Nishimura, Sodegaura (JP); Toshihiro Iwakuma, Sodegaura (JP); Kenichi Fukuoka, Sodegaura (JP); Chishio Hosokawa, Sodegaura (JP); Masahiro Kawamura, Sodegaura (JP); Mitsunori Ito, Sodegaura (JP); Yoriyuki Takashima, Sodegaura (JP); Toshinari Ogiwara, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 542 days.

(21) Appl. No.: 12/108,066

(22) Filed: Apr. 23, 2008

(65) Prior Publication Data
US 2009/0009065 A1 Jan. 8, 2009

(30) Foreign Application Priority Data

Jul. 7, 2007 (JP) .................. 2007-179109
Jul. 7, 2007 (JP) .................. 2007-179120
Jul. 7, 2007 (JP) .................. 2007-179121

(51) Int. Cl.
  *H01L 51/54* (2006.01)
  *H05B 33/14* (2006.01)
  *C09K 11/06* (2006.01)

(52) U.S. Cl. ... 313/504; 313/506; 257/40; 257/E51.049; 428/690; 428/917

(58) Field of Classification Search .................. None
See application file for complete search history.

(56) References Cited

U.S. PATENT DOCUMENTS
2002/0182441 A1 12/2002 Lamansky et al.
(Continued)

FOREIGN PATENT DOCUMENTS
JP 2001-332384 11/2001
(Continued)

OTHER PUBLICATIONS

Baldo et al., Applied Physics Letters, (1999), vol. 75, No. 1, pp. 4-6.*
(Continued)

*Primary Examiner* — Jennifer Chriss
*Assistant Examiner* — Brett A Crouse
(74) *Attorney, Agent, or Firm* — Oblon, Spivak, McClelland, Maier & Neustadt, L.L.P.

(57) ABSTRACT

An organic electroluminescence device includes: a cathode; an anode; and a single-layered or multilayered organic thin-film layer provided between the cathode and the anode. In the organic electroluminescence device, the organic thin-film layer includes at least one emitting layer, and the at least one emitting layer includes at least one phosphorescent material and a host material represented by the following Formula (1).

$$Ra-Ar^1-Ar^2-Rb \quad (1)$$

In Formula (1):
Ra and Rb each represent a substituted or non-substituted benzene ring or a substituted or non-substituted condensed aromatic hydrocarbon ring selected from a group consisting of a naphthalene ring, a chrysene ring, a fluoranthene ring, a triphenylene ring, a phenanthrene ring, a benzophenanthrene ring, a dibenzophenanthrene ring, a benzotriphenylene ring, a benzochrysene ring and a picene ring; and
$Ar^1$ and $Ar^2$ each represent a substituted or non-substituted benzene ring or a substituted or non-substituted condensed aromatic hydrocarbon ring selected from a group consisting of a naphthalene ring, a chrysene ring, a fluoranthene ring, a triphenylene ring, a benzophenanthrene ring, a dibenzophenanthrene ring, a benzotriphenylene ring, a benzochrysene ring and a picene ring.

15 Claims, 1 Drawing Sheet

U.S. PATENT DOCUMENTS

| | | | |
|---|---|---|---|
| 2005/0175857 A1* | 8/2005 | Coggan et al. | 428/690 |
| 2006/0134456 A1* | 6/2006 | Ikeda et al. | 428/690 |
| 2006/0210828 A1* | 9/2006 | Nakayama et al. | 428/690 |

FOREIGN PATENT DOCUMENTS

| | | |
|---|---|---|
| JP | 2003-27048 | 1/2003 |
| JP | 2003-142267 | 5/2003 |
| JP | 2003-317946 | 11/2003 |
| JP | 2004-14334 | 1/2004 |
| JP | 2004-075567 | 3/2004 |
| JP | 2005-008588 | 1/2005 |
| JP | 2005-19219 | 1/2005 |
| JP | 2005-63938 | 3/2005 |
| JP | 2005-071983 | 3/2005 |
| JP | 2005-197262 | 7/2005 |
| JP | 2005-222948 | 8/2005 |
| JP | 2006-151966 | 6/2006 |
| WO | WO 2005/084083 A1 | 9/2005 |
| WO | WO 2005/112519 A1 | 11/2005 |
| WO | WO 2007/046658 A1 | 4/2007 |
| WO | WO 2007/069569 A1 | 6/2007 |

OTHER PUBLICATIONS

Ogasawara, JP(2005)-071983, machine assisted translation.*
Jeong et al., JP(2005)-197262, machine assisted translation.*
Bruno et al., CRC Handbook of Fundamental Spectroscopic Correlation Charts, p. 2.*
U.S. Appl. No. 12/275,789, filed Nov. 21, 2008, Nishimura, et al.
U.S. Appl. No. 12/376,236, filed Feb. 3, 2009, Iwakuma, et al.
A. Salinas Castillo, et al., "Heavy atom induced room temperature phosphorescence: a tool for the analytical characterization of polycyclic aromatic hydrocarbons", Analytica Chimica Acta 516, 2004, pp. 213-220.
U.S. Appl. No. 12/427,999, filed Apr. 22, 2009, Iwakuma, et al.
U.S. Appl. No. 12/122,308, filed May 16, 2008, Nishimura, et al.
U.S. Appl. No. 12/122,316, filed May 16, 2008, Nishimura, et al.
U.S. Appl. No. 12/816,030, filed Jun. 15, 2010, Nishimura, et al.
U.S. Appl. No. 13/386,766, filed Jan. 24, 2012, Ogiwara, et al.

* cited by examiner

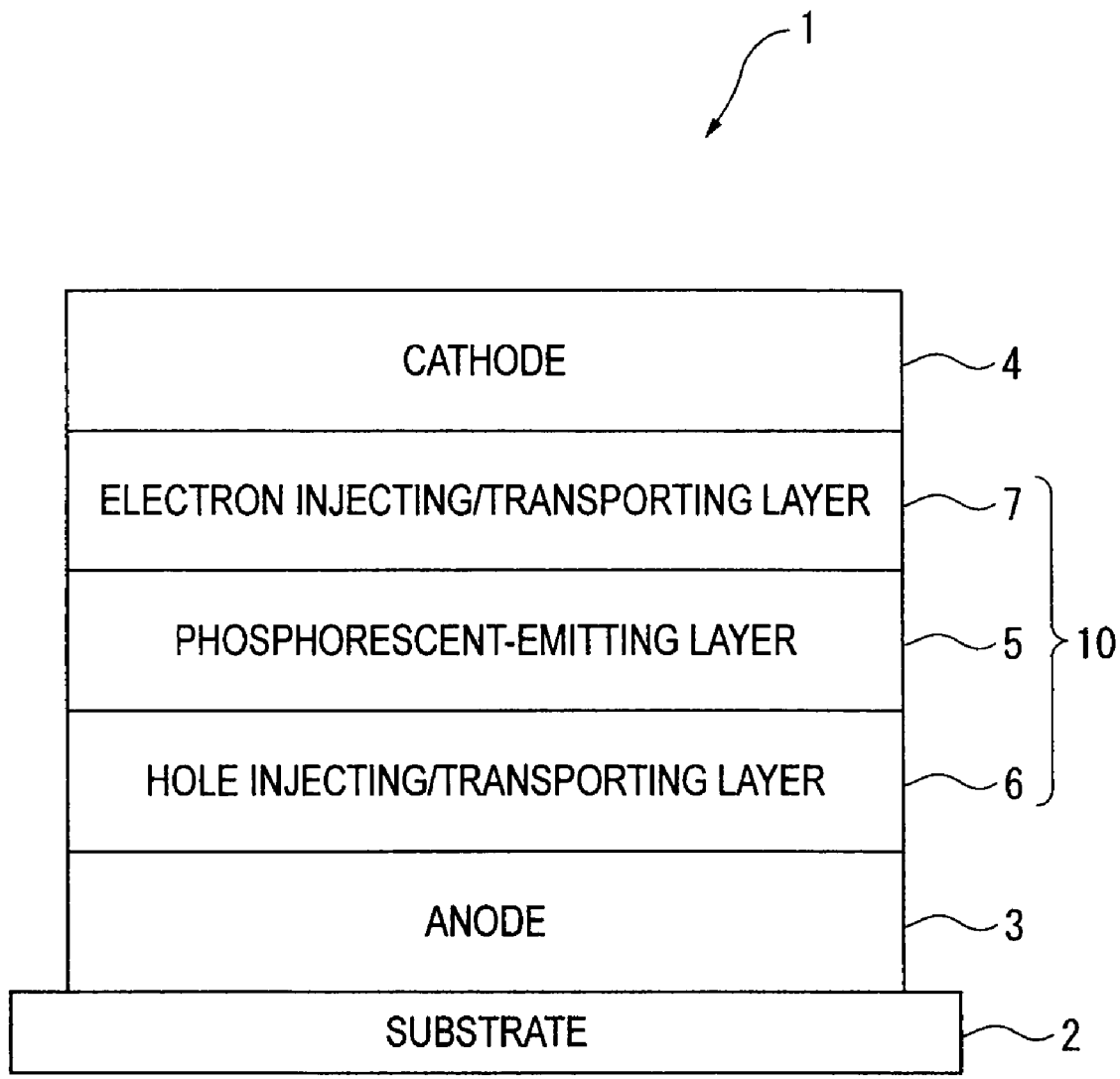

ORGANIC ELECTROLUMINESCENCE DEVICE AND MATERIAL FOR ORGANIC ELECTROLUMINESCENCE DEVICE

BACKGROUND OF THE INVENTION

1. Field of the Invention

The present invention relates to an organic electroluminescence device (hereinafter abbreviated as an organic EL device) and a material for an organic electroluminescence device. Particularly, the present invention relates to an organic electroluminescence device including an emitting layer for emitting red light and a material for the organic electroluminescence device.

2. Description of Related Art

A known organic EL device includes an organic thin-film layer between an anode and a cathode, the organic thin-film layer including an emitting layer, and such an organic EL device emits light using exciton energy produced by recombination of holes with electrons.

Such an organic EL device is expected to be applied as a light-emitting device that is excellent in luminous efficiency, image quality, power consumption and a design property of a thin size, making the best use of the advantages as a self-emitting device.

Points for further improving an organic EL device include, for example, luminous efficiency.

In this regard, development of emitting materials (phosphorescent materials) that emit light using a triplet exciton is promoted in order to enhance internal quantum efficiency. In recent years, a phosphorescent organic EL device has been reported.

Internal quantum efficiency can be enhanced up to 75% or more (up to approximately 100% in theory) by using the above phosphorescent materials to form an emitting layer (phosphorescent emitting layer), and an organic EL device having high efficiency and consuming low power can be obtained.

Further, a known method for forming an emitting layer is a doping method, according to which an emitting material is doped as a dopant into a host material.

In an emitting layer formed by the doping method, excitons can efficiently be produced from charges injected into the host material. Further, exciton energy of the produced excitons is transferred to the dopant, so that light can be emitted from the dopant with high efficiency.

In this respect, in order to intermolecularly transfer energy from a host material to a phosphorescent dopant, excited triplet energy $Eg_H$ of the host material has to be larger than excited triplet energy $Eg_D$ of the phosphorescent dopant.

CBP (4,4'-bis(N-carbazolyl)biphenyl) is known as a representative example of a material having effectively large excited triplet energy (e.g., see Document 1: US 2002/182441).

Use of CBP for a host material makes it possible to transfer energy to a phosphorescent dopant that emits light of a predetermined wavelength (for example, green and red). With this arrangement, an organic EL device having a high efficiency can be obtained.

When CBP is used as a host material, luminous efficiency is markedly enhanced because of phosphorescence emission. On the other hand, however, the life thereof is so short as to be not suitable for practical use.

The above problem is considered to be attributable to heavy degradation of molecules by holes due to a not-high oxidation stability that the molecular structure of CBP exhibits.

Further, Document 2 (WO 2005/112519) discloses a technique according to which a condensed-ring derivative having a nitrogen-containing ring such as carbazole is used as a host material for a red-phosphorescent emitting layer. Luminous efficiency and the lifetime are improved by the above technique, but it is not satisfactory in a certain case in putting into practical use.

On the other hand, various kinds of host materials (fluorescent hosts) for fluorescent dopants are known, and various proposals have been made on host materials capable of forming a fluorescent emitting layer which is excellent in luminous efficiency and lifetime by combination thereof with fluorescent dopants.

Excited singlet energy Eg(S) of a fluorescent host is larger than that of a fluorescent dopant, but excited triplet energy Eg(T) thereof is not necessarily larger than that of the fluorescent dopant. Accordingly, the fluorescent host cannot simply be applied as a host material (phosphorescent host) for a phosphorescent emitting layer.

For example, anthracene derivatives are well known as a fluorescent host.

However, anthracene derivatives have relatively-small excited triplet energy Eg(T) of approximately 1.9 eV. Accordingly, energy cannot be reliably transferred to a phosphorescent dopant for emitting light having a wavelength in a visible light region of 520 to 720 nm. Further, excited triplet energy cannot be trapped within a emitting layer. Accordingly, anthracene derivatives are unsuitable for a phosphorescent host.

Further, perylene derivatives, pyrene derivatives and naphthacene derivatives are also not preferred for a phosphorescent host for the same reasons.

An example in which aromatic hydrocarbon compounds are used for a phosphorescent host is known (e.g., see Document 3: JP-A-2003-142267). In this example, a compound in which two aromatic groups are bonded to a benzene central skeleton as substituents in meta positions is used for a phosphorescent host.

However, the aromatic hydrocarbon compounds described in Document 3 structured such that the molecules are extended in a manner symmetric relative to the benzene central skeleton, the emitting layer can be easily crystallized.

On the other hand, organic EL devices in which various aromatic hydrocarbon compounds are used are disclosed in Document 4 (WO 2007/046685), Document 5 (JP-A-2006-151966), Document 6 (JP-A-2005-8588), Document 7 (JP-A-2005-19219), Document 8 (JP-A-2005-197262) and Document 9 (JP-A-2004-75567). However, effectiveness thereof as the phosphorescent host is not referred at all.

As described above, a host material that can efficiently transfer energy to a phosphorescent material and has a practically long lifetime has not yet been known, which has hindered a practical realization of a device in which a phosphorescent material is used.

SUMMARY OF THE INVENTION

An object of the present invention is to provide a phosphorescent organic EL device having high efficiency and a long lifetime and a material for forming a phosphorescent organic EL device having high efficiency and a long lifetime.

Intensive researches repeated by the inventors in order to achieve an object described above have resulted in finding that a phosphorescent organic EL device having high efficiency and a long lifetime can be obtained by using, as a phosphorescent host, a material which includes a host material represented by the following Formula (1) or a host material represented by the following Formula (3) or (4), and thus the inventors have reached the present invention.

An organic EL device according to an aspect of the present invention includes an organic thin-film layer between a cathode and an anode, the organic thin-film layer including a single layer or plural layers, wherein the organic thin-film layer includes at least one emitting layer, and the at least one emitting layer includes at least one phosphorescent material and a host material represented by the following Formula (1).

$$Ra—Ar^1—Ar^2—Rb \quad (1)$$

In Formula (1), Ra and Rb each represent a substituted or non-substituted benzene ring or a substituted or non-substituted condensed aromatic hydrocarbon ring selected from a group consisting of a naphthalene ring, chrysene ring, fluoranthene ring, triphenylene ring, phenanthrene ring, benzophenanthrene ring, dibenzophenanthrene ring, benzotriphenylene ring, benzochrysene ring, and picene ring.

$Ar^1$ and $Ar^2$ each represent a substituted or non-substituted benzene ring or a substituted or non-substituted condensed aromatic hydrocarbon ring selected from a group consisting of a naphthalene ring, chrysene ring, fluoranthene ring, triphenylene ring, benzophenanthrene ring, dibenzophenanthrene ring, benzotriphenylene ring, benzochrysene ring, and picene ring.

When $Ar^1$ is a substituted or non-substituted benzene ring, Ra and $Ar^2$ are substituted or non-substituted condensed aromatic hydrocarbon rings which are different from each other.

When $Ar^2$ is a substituted or non-substituted benzene ring, Rb and $Ar^1$ are substituted or non-substituted condensed aromatic hydrocarbon groups which are different from each other.

When both of $Ar^1$ and $Ar^2$ are naphthalene rings, not both of Ra and Rb are benzene rings.

Substituents for $Ar^1$, $Ar^2$, Ra and Rb are not aryl groups.

A material for an organic EL device according to another aspect of the present invention includes a host material represented by the following Formula (3).

$$Ra—Ar^1—Ar^2—Rb \quad (3)$$

In Formula (3), Ra and $Ar^1$ each represent a substituted or non-substituted naphthalene ring.

Rb represents a substituted or non-substituted condensed aromatic hydrocarbon ring selected from a group consisting of a phenanthrene ring, triphenylene ring, benzophenanthrene ring, dibenzophenanthrene ring, benzotriphenylene ring, fluoranthene ring, benzochrysene ring and picene ring.

$Ar^2$ represents a substituted or non-substituted condensed aromatic hydrocarbon group selected from a group consisting of a benzene ring, naphthalene ring, chrysene ring, fluoranthene ring, triphenylene ring, benzophenanthrene ring, dibenzophenanthrene ring, benzotriphenylene ring, benzochrysene ring and picene ring.

Substituents for $Ar^1$, $Ar^2$, Ra and Rb are not aryl groups.

A material for an organic EL device according to still further aspect of the present invention includes a host material represented by the following Formula (4).

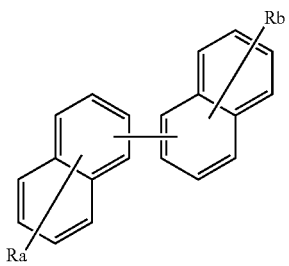

In Formula (4), Ra and Rb each represent a substituted or non-substituted condensed aromatic hydrocarbon ring selected from a group consisting of a phenanthrene ring, triphenylene ring, benzophenanthrene ring, dibenzophenanthrene ring, benzotriphenylene ring, fluoranthene ring, benzochrysene ring and picene ring.

Substituents for Ra, Rb and a naphthalene ring are not aryl groups.

According to the aspect of the present invention, use of the host material represented by Formula (1) as the phosphorescent host makes it possible to provide a phosphorescent organic EL device having high efficiency and a long lifetime.

Further, a phosphorescent organic EL device having high efficiency and a long lifetime can be obtained by using a material containing the host material represented by Formula (3) or (4) as the phosphorescent host.

BRIEF DESCRIPTION OF THE DRAWINGS

FIG. 1 schematically shows an exemplary arrangement of an organic EL device according to an exemplary embodiment of the present invention.

DETAILED DESCRIPTION OF PREFERRED EMBODIMENT(S)

An exemplary embodiment of the present invention shall be explained below. Arrangement of Organic EL Device:

First, an arrangement of an organic EL device shall be explained.

Representative exemplary arrangements of the organic EL device are as follows:
(1) Anode/emitting layer/cathode;
(2) Anode/hole injecting layer/emitting layer/cathode;
(3) Anode/emitting layer/electron injecting•transporting layer/cathode;
(4) Anode/hole injecting layer/emitting layer/electron injecting•transporting layer/cathode;
(5) Anode/organic semiconductor layer/emitting layer/cathode;
(6) Anode/organic semiconductor layer/electron blocking layer/emitting layer/cathode;
(7) Anode/organic semiconductor layer/emitting layer/adhesion improving layer/cathode;
(8) Anode/hole injecting•transporting layer/emitting layer/electron injecting•transporting layer/cathode;
(9) anode/insulating layer/emitting layer/insulating layer/cathode;
(10) anode/inorganic semiconductor layer/insulating layer/emitting layer/insulating layer/cathode;
(11) anode/organic semiconductor layer/insulating layer/emitting layer/insulating layer/cathode;
(12) anode/insulating layer/hole injecting•transporting layer/emitting layer/insulating layer/cathode; and

(13) anode/insulating layer/hole injecting•transporting layer/ emitting layer/electron injecting•transporting layer/cathode.

Among the above, the arrangement (8) is preferably used, but the arrangement of the present invention is not limited to the above.

FIG. 1 schematically shows an exemplary arrangement of an organic EL device according to the exemplary embodiment of the present invention.

An organic EL device 1 includes a transparent substrate 2, an anode 3, a cathode 4 and an organic thin-film layer 10 disposed between the anode 3 and the cathode 4.

While the organic thin-film layer 10 includes a phosphorescent emitting layer 5 containing a phosphorescent host and a phosphorescent dopant, the organic thin-film layer 10 may include a hole injecting/transporting layer 6 and the like between the phosphorescent emitting layer 5 and the anode 3 and an electron injecting/transporting layer 7 and the like between the phosphorescent emitting layer 5 and the cathode 4.

Further, an electron blocking layer may be provided on the phosphorescent emitting layer 5 adjacent to the anode 3 while a hole blocking layer may be provided on the phosphorescent emitting layer 5 adjacent to the cathode 4.

With this arrangement, electrons and holes can be trapped in the phosphorescent emitting layer 5 to enhance a production rate of excitons in the phosphorescent emitting layer 5.

In the present specification, the "fluorescent host" and the "phosphorescent host" respectively mean a host combined with a fluorescent dopant and a host combined with a phosphorescent dopant. The fluorescent host and the phosphorescent host shall not definitely be classified in a limited manner only from a viewpoint of a molecular structure.

In other words, the fluorescent host in the present specification means a material for forming the fluorescent emitting layer containing a fluorescent dopant, and does not mean a material which can be used only as a host of a fluorescent material.

In a similar way, the phosphorescent host means a material for forming the phosphorescent emitting layer containing a phosphorescent dopant, and does not mean a material which can be used only as a host of a phosphorescent material.

In the present specification, the "hole injecting/transporting layer" (or "hole injecting•transporting layer") means "at least either one of a hole injecting layer and a hole transporting layer", while the "electron injecting/transporting layer" (or "electron injecting•transporting layer") means "at least either one of an electron injecting layer and an electron transporting layer".

Light Transmitting Substrate

The organic EL device of the present invention is formed on a light transmitting substrate. The light transmitting substrate herein is a substrate for supporting the organic EL device, and preferably a flat substrate that can transmit 50% or more of light in a visible region of 400 to 700 nm.

To be specific, the light transmitting substrate may be a glass plate, a polymer plate and the like.

In particular, the glass plate may be soda lime glass, barium strontium-containing glass, lead glass, aluminosilicate glass, borosilicate glass, barium borosilicate glass, quartz and the like.

The polymer plate may be polycarbonate, acryl, polyethylene terephthalate, polyether sulfide, polysulfone and the like.

Anode and Cathode

An anode in the organic EL device of the present invention injects holes into the hole injecting layer, the hole transporting layer or the emitting layer, and it is effective that the anode has a work function of 4.5 eV or more.

The specific examples of a material for the anode include indium tin oxide alloy (ITO), tin oxide (NESA), indium zinc oxide, gold, silver, platinum, copper and the like.

The anode can be prepared by forming a thin film from the above electrode substances by a method such as vapor deposition, sputtering or the like.

When light emitted from the emitting layer is taken out from the anode as in the present embodiment, the anode preferably transmits more than 10% of light in a visible light region. A sheet resistance of the anode is preferably several hundred Ω/square or less. A film thickness of the anode is, though depending on the material, usually in a range of 10 nm to 1 μm, preferably in a range of 10 to 200 nm.

The cathode is preferably formed of a material having a small work function for the purpose of injecting an electron into the electron injecting layer, the electron transporting layer or the emitting layer.

A material for the cathode is not specifically limited. Examples of the material are indium, aluminum, magnesium, magnesium-indium alloys, magnesium-aluminum alloys, aluminum-lithium alloys, aluminum-scandium-lithium alloys, magnesium-silver alloys and the like.

The cathode can be formed, as is the case with the anode, by forming a thin film by a method such as a vapor deposition or sputtering. Further, light may be emitted from a cathode side.

Emitting Layer

The emitting layer in the organic EL device has the following functions:

(1) injecting function: a function in which holes can be injected from an anode or a hole injecting layer when an electric field is applied and in which electrons can be injected from a cathode or an electron injecting layer when an electric field is applied;

(2) transporting function: a function in which injected charge (electrons and holes) is transferred by virtue of a force of an electric field; and (3) emitting function: a function in which a field for recombination of electrons and holes is provided, so that light is emitted therefrom.

Injectability of the holes may differ from that of the electrons and transporting capabilities of the hole and the electrons (represented by mobilities of the holes and the electrons) may differ from each other.

A publicly known method such as vapor deposition, spin coating or an LB method can be applied as a method for forming the above emitting layer.

The emitting layer is preferably a molecular deposit film.

In this regard, the molecular deposit film means a thin film formed by depositing a material compound in a gas phase state or a film formed by solidifying a material compound in a solution state or a liquid phase. Usually, the above molecular deposit film can be distinguished from a thin film (molecular accumulation film) formed by an LB method by a difference in an aggregation structure, a higher order structure and a functional difference originating therefrom.

Also, as disclosed in JP-A-57-51781, the emitting layer can be formed as well by dissolving a binding agent such as a resin and the material compound in a solvent to prepare a solution and then forming a thin film of the solution by spin coating.

A film thickness of the emitting layer is preferably 5 to 50 nm, more preferably 7 to 50 nm and most preferably 10 to 50 nm. If the film thickness is less than 5 nm, forming of the emitting layer and controlling the chromaticity of the emitting layer can be difficult. On the other hand, if the thickness exceeds 50 nm, the driving voltage can be raised.

In the present invention, the emitting layer includes at least one phosphorescent material and the host material represented by the following Formula (1).

$$Ra—Ar^1—Ar^2—Rb \quad (1)$$

In Formula (1), Ra and Rb each represent a substituted or non-substituted benzene ring or a substituted or non-substituted condensed aromatic hydrocarbon ring selected from a group consisting of a naphthalene ring, chrysene ring, fluoranthene ring, triphenylene ring, phenanthrene ring, benzophenanthrene ring, dibenzophenanthrene ring, benzotriphenylene ring, benzochrysene ring and picene ring.

$Ar^1$ and $Ar^2$ each represent a substituted or non-substituted benzene ring or a substituted or non-substituted condensed aromatic hydrocarbon ring selected from a group consisting of a naphthalene ring, chrysene ring, fluoranthene ring, triphenylene ring, benzophenanthrene ring, dibenzophenanthrene ring, benzotriphenylene ring, benzochrysene ring and picene ring.

When $Ar^1$ is a substituted or non-substituted benzene ring, Ra and $Ar^2$ are substituted or non-substituted condensed aromatic hydrocarbon rings which are different from each other.

When $Ar^2$ is a substituted or non-substituted benzene ring, Rb and $Ar^1$ are substituted or non-substituted condensed aromatic hydrocarbon rings which are different from each other.

When both of $Ar^1$ and $Ar^2$ are naphthalene rings, not both of Ra and Rb are benzene rings.

Substituents for Ra, Rb, $Ar^1$ and $Ar^2$ are not aryl groups.

The host material represented by Formula (1) has a large excited triplet energy gap (excited triplet energy), and therefore the host material can transfer energy to the phosphorescent dopant so that the phosphorescent dopant can emit phosphorescent light.

An anthracene derivative, which is well known as a fluorescent host, is unsuitable as a host for a red-emitting phosphorescent dopant. However, since the host of the present invention has a large excited triplet energy gap, the host can be used for a red-emitting phosphorescent dopant to effectively emit light.

While CBP, which has so far been well known as a phosphorescent host, serves as a host for a phosphorescent dopant that emits light having a shorter wavelength than green light, the host material of the present invention can be used as a host for a green-emitting phosphorescent dopant to emit light but cannot be used as a host for a phosphorescent dopant that emits light having a shorter wavelength than green light.

The present invention, which employs a polycyclic condensed ring containing no nitrogen atom for a skeleton of the host material, can enhance stability of the molecules and extend the device lifetime.

In this case, if the number of atoms for forming the ring contained in the skeleton is too small, stability of the molecules is not sufficiently enhanced. On the other hand, if the polycyclic condensed ring has too many rings, a HOMO-LUMO gap is so narrowed that an excited triplet energy gap becomes insufficient for a useful emission wavelength. In this respect, the host material represented by Formula (1) has the suitable number of the ring atoms, and therefore can suitably be used as a phosphorescent host for a highly-stable phosphorescent emitting layer that emits light of a useful wavelength.

Host materials widely usable for phosphorescent dopants that emit light of a broad wavelength region ranging from green to red colors have so far been selected, and therefore a material which has a wide triplet energy gap such as CBP has been used as a host material.

CBP has certainly a wide triplet energy gap Eg(T) but has a short lifetime.

In this regard, the host material of the present invention can not be applied as a host for a phosphorescent dopant having such a wide gap as that of a blue color, but the host material can serves as a host for a red or green-emitting phosphorescent dopant. Further, if the triplet energy gap is too broad as is the case with CBP, energy is not efficiently intermolecularly transferred to a red-emitting phosphorescent dopant because of a large difference in an energy gap. According to the host of the present invention, however, since an energy gap is suited to a red or green-emitting phosphorescent dopant, energy can efficiently be transferred from an exciton of the host to the phosphorescent dopant, and a phosphorescent emitting layer having considerably high efficiency can be formed.

As described above, a phosphorescent emitting layer having high efficiency and a long lifetime can be formed according to the present invention.

In this regard, an excited triplet energy gap Eg(T) of the material for forming the organic EL device may be exemplarily defined based on a phosphorescence spectrum. For instance, in the present invention, the triplet energy gap Eg(T) may be defined in the following manner.

That is, the respective materials are dissolved in an EPA solvent (diethyl ether:isopentane:ethanol=5:5:2 in terms of a volume ratio) in a rate of 10 μmol/L to prepare a sample for measuring phosphorescence.

Then, the sample for measuring phosphorescence is put in a quartz cell, cooled down to 77 K, and irradiated with exciting light to measure a wavelength of phosphorescence radiated therefrom.

A tangent line is drawn to be tangent to a rise of a phosphorescence spectrum thus obtained at a short wavelength side, and a wavelength value of an intersection point of the above tangent line and a base line is converted into energy value, so that the converted energy value is set as an triplet energy gap Eg(T).

A commercially-available measuring equipment F-4500 (manufactured by Hitachi, Ltd.), for instance, can be used for the measurement.

However, the triplet energy gap does not need to be defined by the above method, but may be defined by any other suitable method as long as an object and a spirit of the present invention are not impaired.

When Ra, Rb, $Ar^1$ or $Ar^2$ in Formula (1) has one or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom.

Since the substituent(s) has no nitrogen atom, the stability of the host material can be further enhanced while and the device lifetime can be further extended.

Examples of the alkyl group having 1 to 20 carbon atoms include methyl, ethyl, propyl, isopropyl, n-butyl, s-butyl, isobutyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, neopentyl, 1-methylpentyl, 2-methylpentyl, 1-pentylhexyl, 1-butylpentyl, 1-heptyloctyl, 3-methylpentyl and the like.

Examples of the haloalkyl group having 1 to 20 carbon atoms include chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl and the like.

Examples of the cycloalkyl group having 5 to 18 carbon atoms include cyclopentyl, cyclohexyl, cyclooctyl, 3,5-tetramethylcyclohexyl and the like, and it includes preferably cyclohexyl, cyclooctyl, 3,5-tetramethylcyclohexyl.

The silyl group having 3 to 20 carbon atoms is preferably, for example, an alkylsilyl group, an arylsilyl group or an aralkylsilyl group, and the examples thereof include trimethylsilyl, triethylsilyl, tributylsilyl, trioctylsilyl, triisobutylsilyl, dimethylethylsilyl, dimethylisopropylsilyl, dimethylpropylsilyl, dimethylbutylsilyl, dimethyltertiarybutylsilyl, diethylisopropylsilyl, phenyldimethylsilyl, diphenylmethylsilyl, diphenyltertiarybutylsilyl, triphenylsilyl and the like.

The halogen atom includes a fluorine atom, a chlorine atom, a bromine atom and an iodine atom.

In Formula (1), Ra and $Ar^1$ are naphthalene rings, and Rb is preferably a group selected from group consisting of a phenanthrene ring, a triphenylene ring, a benzophenanthrene ring, a dibenzophenanthrene ring, a benzotriphenylene ring, a fluoranthene ring, a benzochrysene ring and a picene ring.

By selecting the ring structure as described above, a thin film for an organic EL device having excellent stability can be formed, and when used together with a red-emitting phosphorescent material, the device having high efficiency and a long lifetime can be formed.

The host material represented by Formula (1) is represented preferably by the following Formula (2).

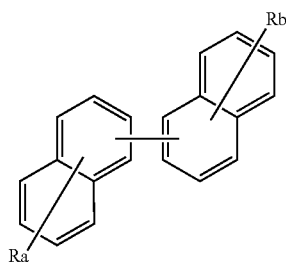

(2)

A phosphorescent organic EL device formed using the above host material represented by Formula (2) and particularly a red-emitting phosphorescent material has high efficiency and a long lifetime.

In Formula (2), Ra and Rb each are preferably groups selected from a group consisting of a phenanthrene ring, a triphenylene ring, a benzophenanthrene ring, a dibenzophenanthrene ring, a benzotriphenylene ring, a fluoranthene ring, a benzochrysene ring and a picene ring.

By selecting the ring structure as described above, a thin film for an organic EL device having excellent stability can be formed, and when used together with a red-emitting phosphorescent material, the device having high efficiency and a long lifetime can be formed.

When Ra, Rb and the naphthalene ring(s) in Formula (2) have one or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom.

Since the substituent(s) has no nitrogen atom, the stability of the host material can be further enhanced while the device lifetime can be extended.

A material for an organic EL device containing a host material represented by the following Formula (3) or Formula (4) can also suitably be used as a phosphorescent host.

A material for an organic EL device according to the present invention includes the host material represented by the following Formula (3).

Ra—$Ar^1$—$Ar^1$—Rb (3)

In Formula (3), Ra and $Ar^1$ each represent a substituted or non-substituted naphthalene ring.

Rb represents a substituted or non-substituted condensed aromatic hydrocarbon ring selected from a group consisting of a phenanthrene ring, triphenylene ring, benzophenanthrene ring, dibenzophenanthrene ring, benzotriphenylene ring, fluoranthene ring, benzochrysene ring and picene ring.

$Ar^2$ represents a substituted or non-substituted condensed aromatic hydrocarbon ring selected from a group consisting of a benzene ring, naphthalene ring, chrysene ring, fluoranthene ring, triphenylene ring, benzophenanthrene ring, dibenzophenanthrene ring, benzotriphenylene ring, benzochrysene ring and picene ring.

Substituents for Ra, Rb, $Ar^1$ and $Ar^2$ are not aryl groups.

When $Ar^2$ is a benzene ring, the skeletons of the ring structures bonded to both sides of $Ar^2$ are not the same as each other. With this arrangement, a thin film for an organic EL device having excellent stability can be formed, and when used together with a red-emitting phosphorescent material, the device having high efficiency and a long lifetime can be formed.

When Ra, Rb, $Ar^1$ or $Ar^2$ in Formula (3) has one or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom.

Since the substituent(s) has no nitrogen atom, the stability of the host material can be further enhanced while the device lifetime can be further extended.

A material for an organic EL device according to the present invention includes the host material represented by the following Formula (4).

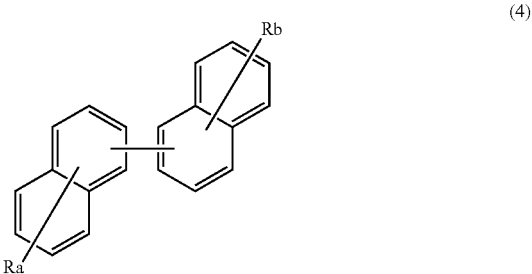

(4)

In Formula (4), Ra and Rb represent a substituted or non-substituted condensed aromatic hydrocarbon group selected from a group consisting of a phenanthrene ring, triphenylene ring, benzophenanthrene ring, dibenzophenanthrene ring, benzotriphenylene ring, fluoranthene ring, benzochrysene ring and picene ring.

A substituent for Ra, Rb or the naphthalene ring(s) is not an aryl group.

By selecting the ring structure as described above, the thin film for an organic EL device having excellent stability can be formed, and when used together with a red-emitting phosphorescent material, the device having high efficiency and a long lifetime can be formed.

When Ra, Rb or the naphthalene ring(s) in Formula (4) described above have one or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom.

Since the substituent(s) has no nitrogen atom, the stability of the host material can be further enhanced while the device lifetime can be extended.

In the present invention, an excited triplet energy of the host material described above is preferably in a range of 2.0 eV to 2.8 eV.

The excited triplet energy of 2.0 eV or more makes it possible to transfer energy to a phosphorescent material which emits light in a range of 520 nm to 720 nm. The excited triplet energy of 2.8 eV or less makes it possible to prevent the problem that a red-emitting phosphorescent dopant does not efficiently emit light because of a large difference in an energy gap.

An excited triplet energy of the host material is more preferably in a range of 2.0 eV to 2.7 eV, further preferably in a range of 2.1 eV to 2.7 eV.

Examples of compounds for the host material of the present invention include, for example, the following compounds.

(A1)
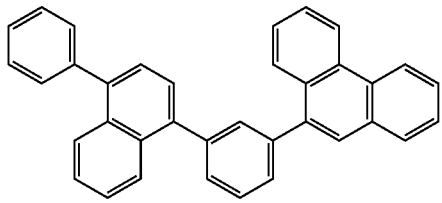

(A2)
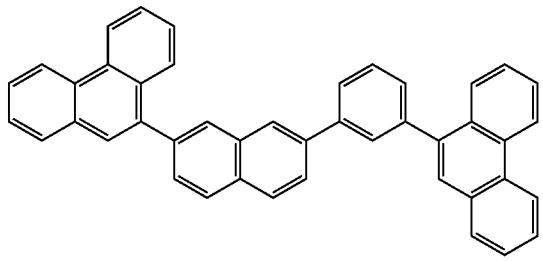

(A3)
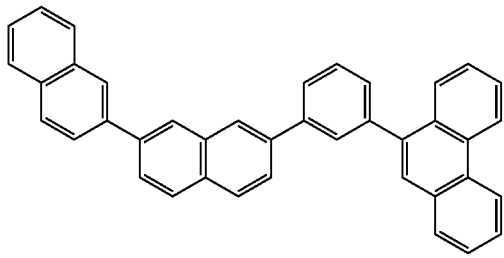

(A4)
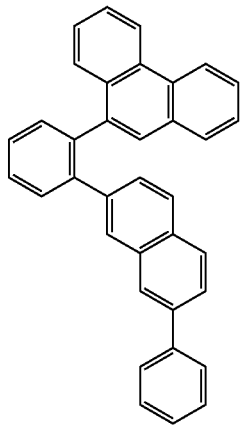

(A5)
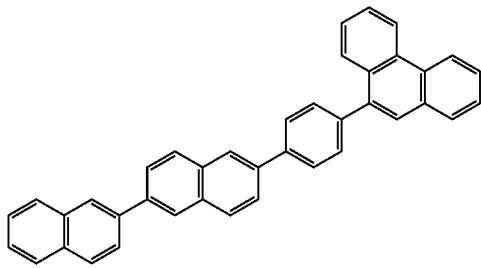

(A6)
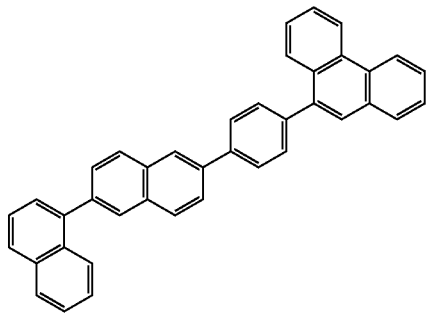

-continued
(A7)
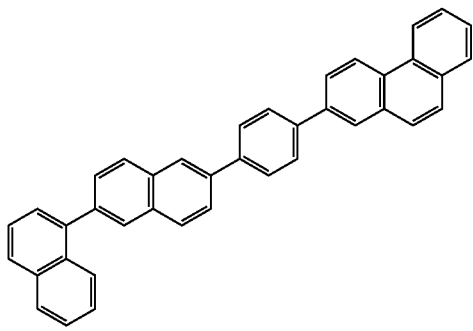
(A8)
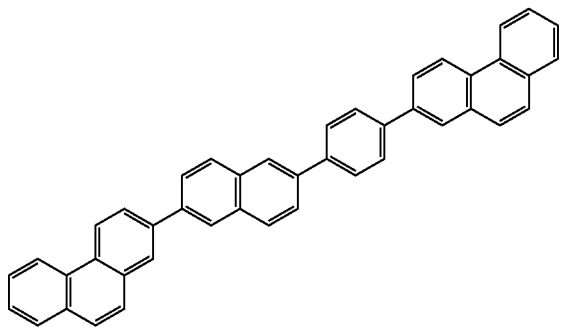
(A9)
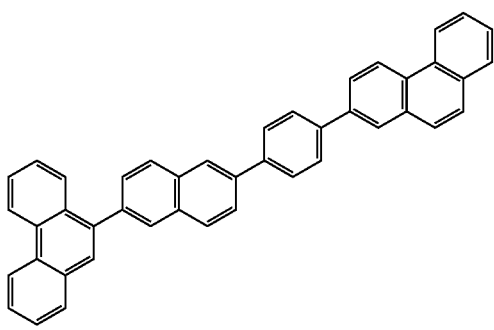
(A10)
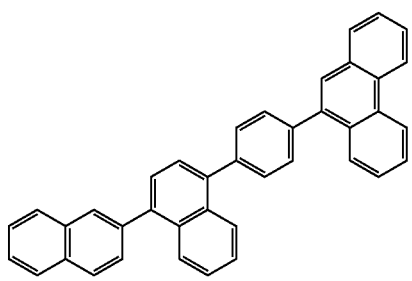
(A11)
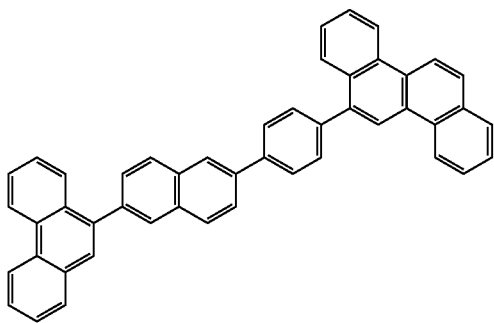
(A12)
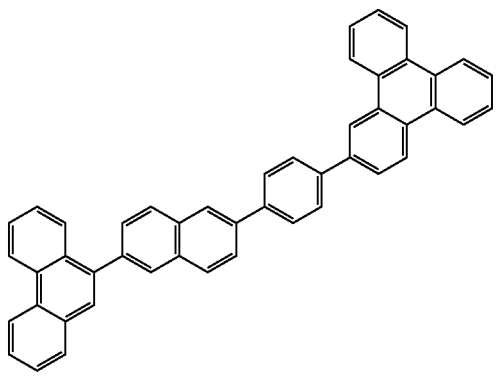
(A13)
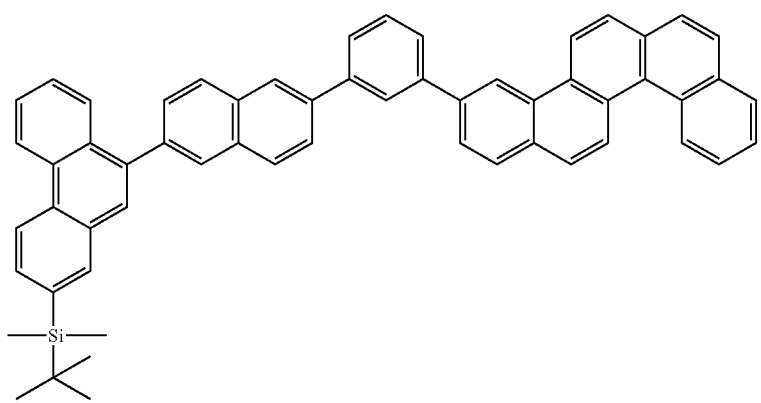

-continued
(A14)
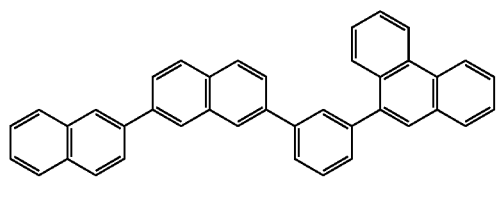
(A15)
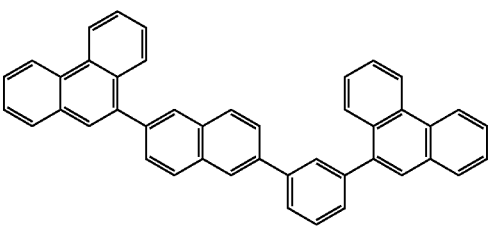
(A16)
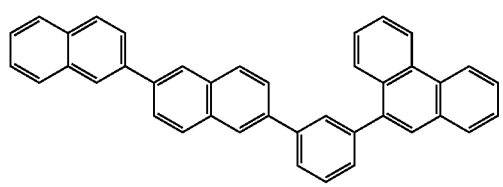
(A17)
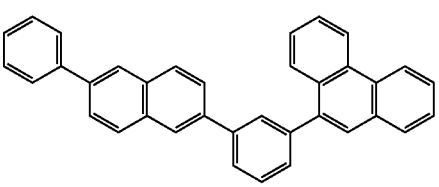
(A18)
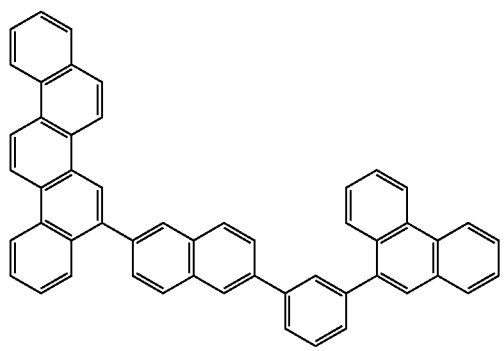
(A19)
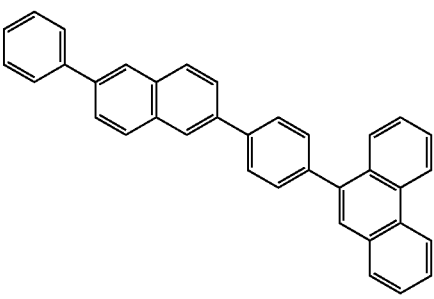
(A20)
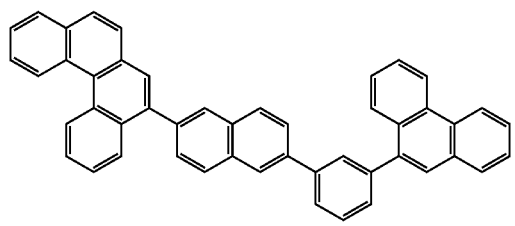
(A21)
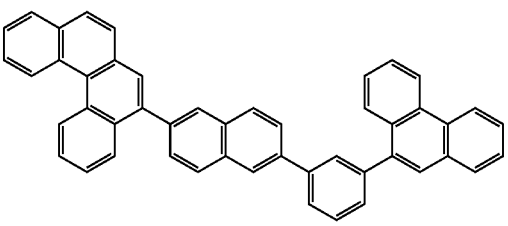
(A22)
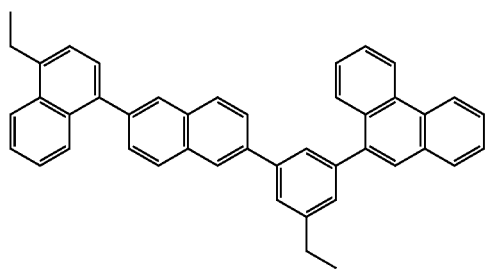
(A23)
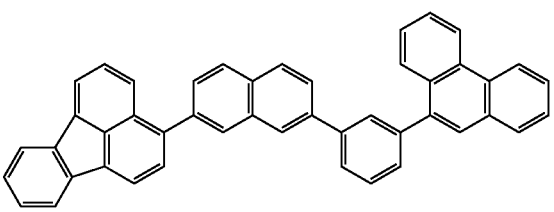
(A24)
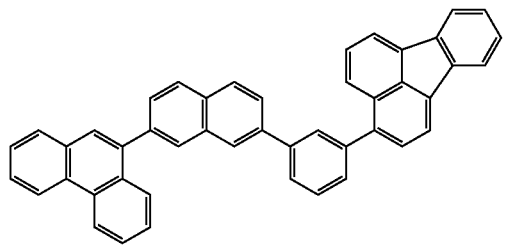
(A25)
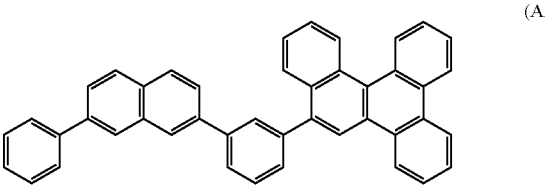

-continued (B1)

(B2)

(B3)

(B4)

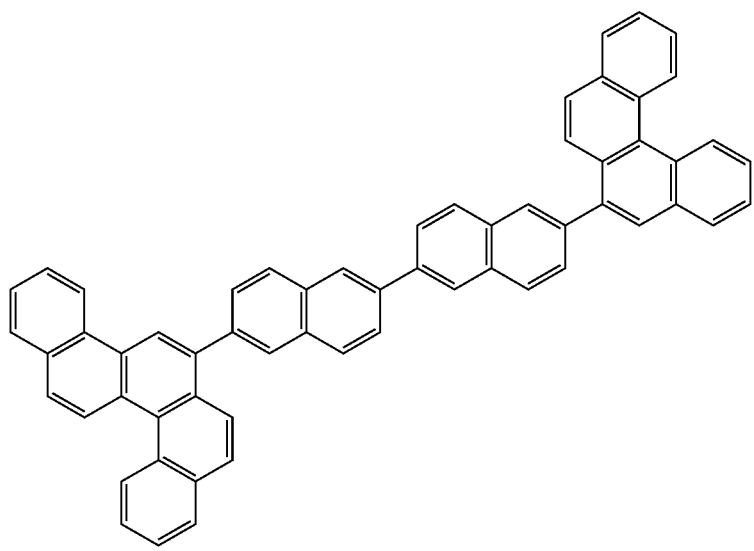
(B5)
(B6)
(B7)
(B8)
(B9)

-continued
(B10)
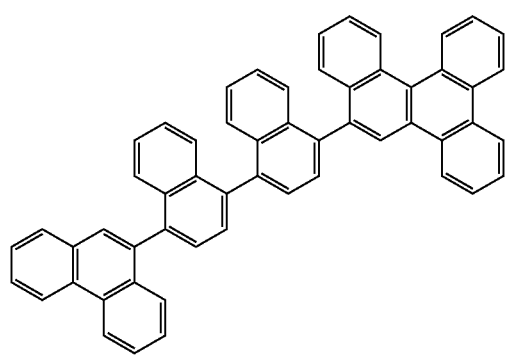
(B11)
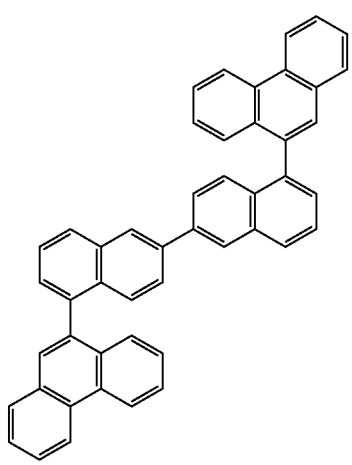
(B12)
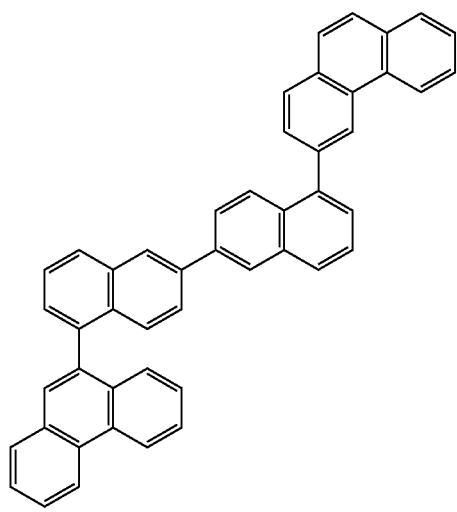
(B13)
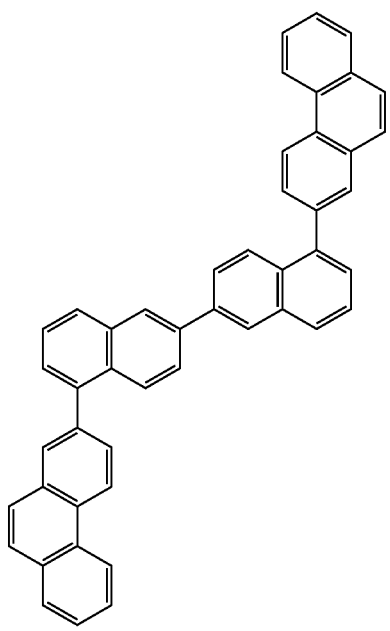
(B14)
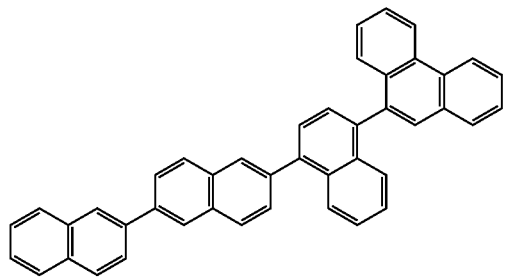
(B15)
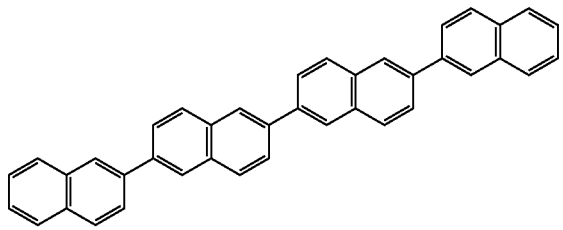

(B16)
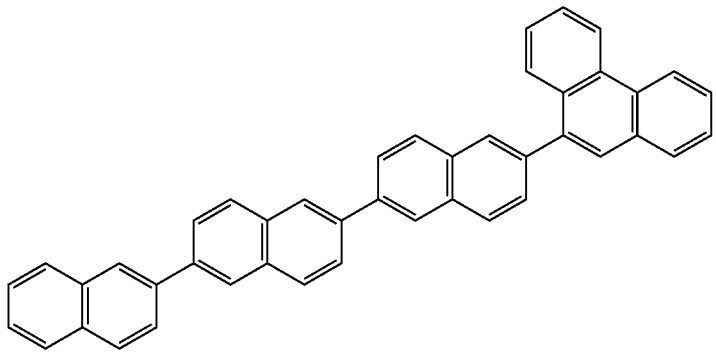
(B17)
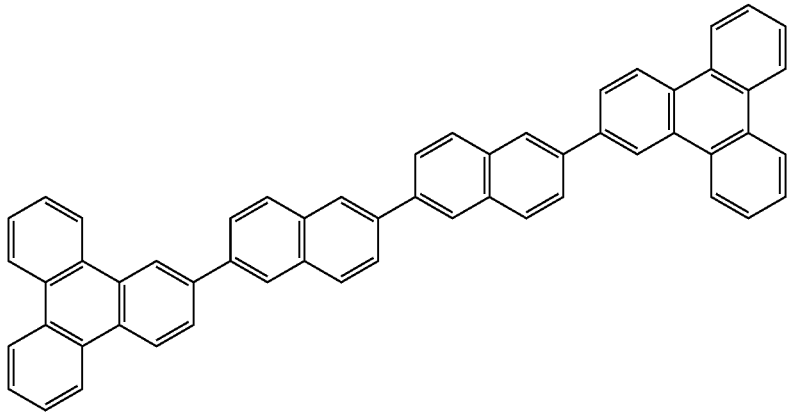
(B18)
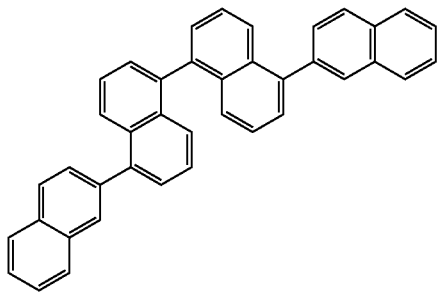
(B19)
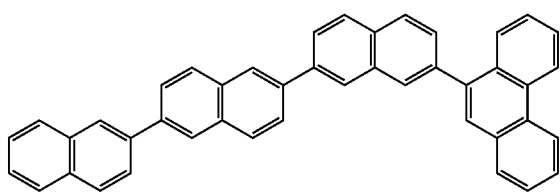
(B20)
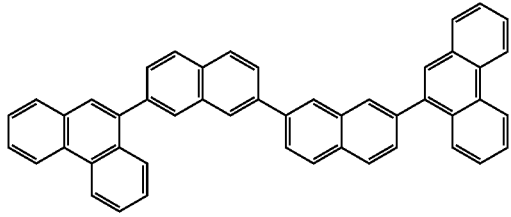
(B21)
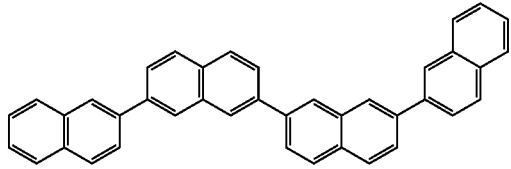
(B22)
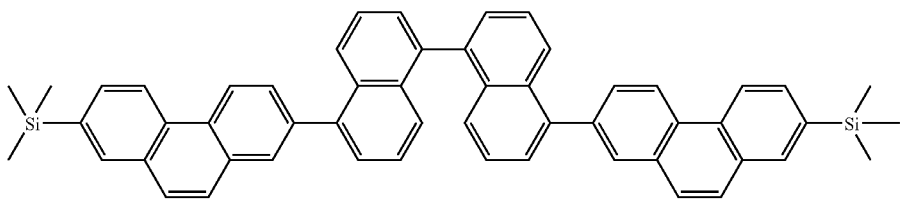

(B23)
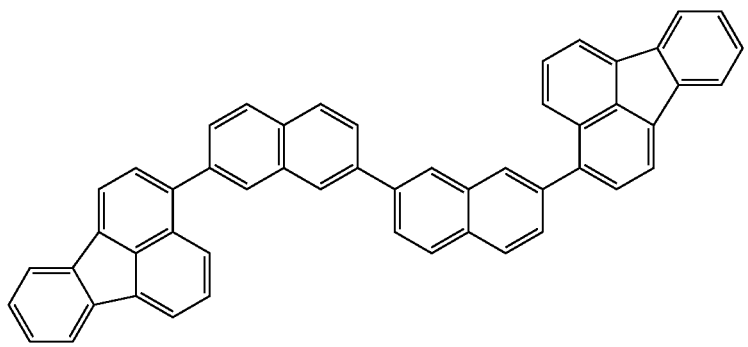
(B24)
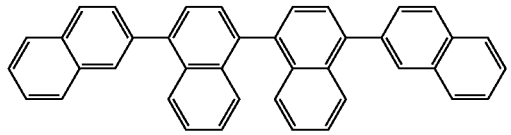
(C1)
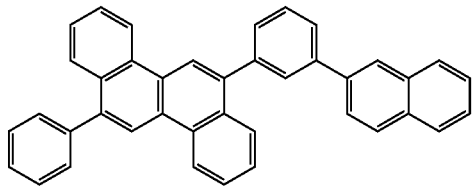
(C2)
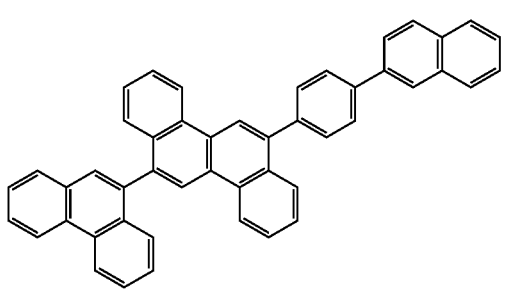
(C3)
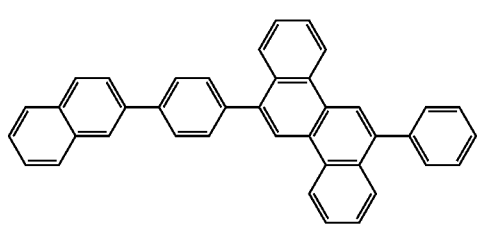
(C4)
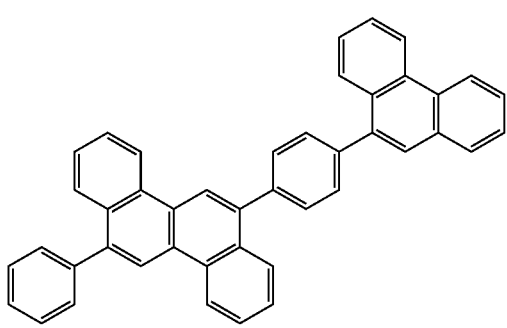
(C5)
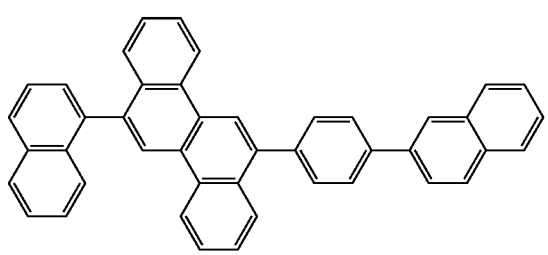
(C6)
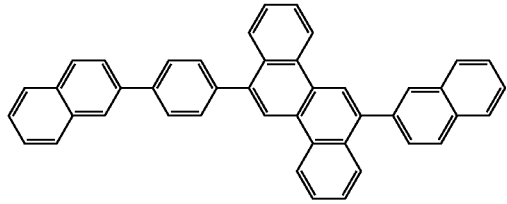
(C7)
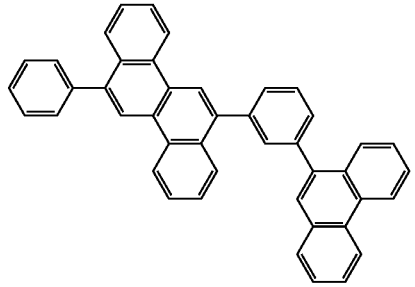

-continued
(C8)
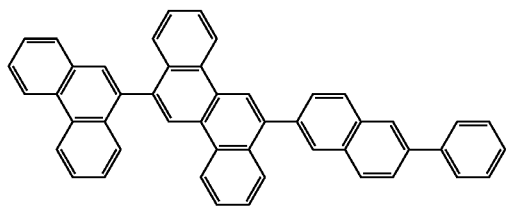
(C9)
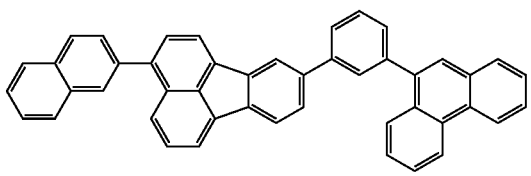
(C10)
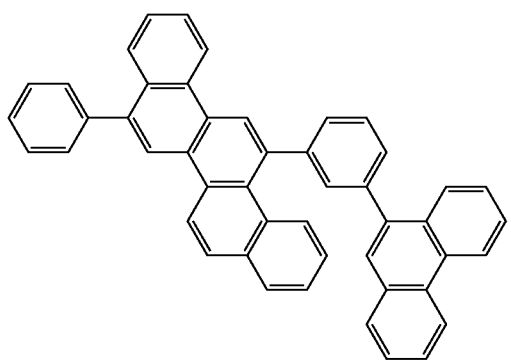
(C11)
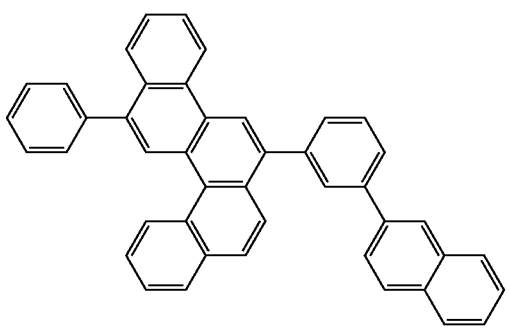
(C12)
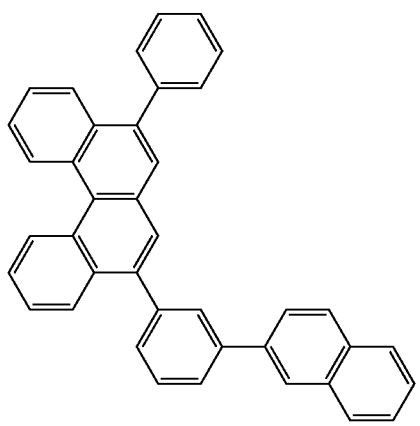
(C13)
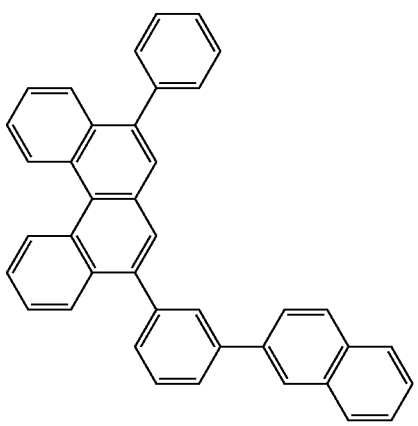
(C14)
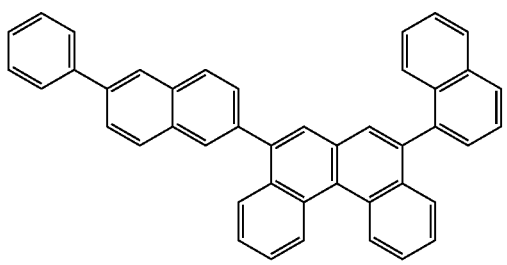
(C15)
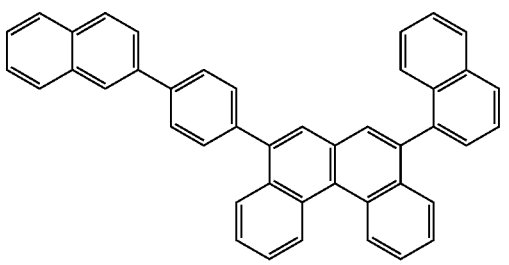

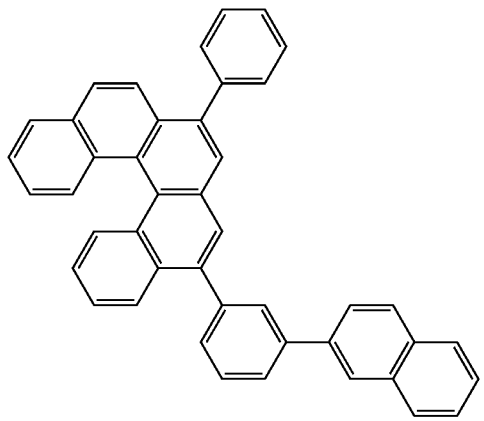

(C16)

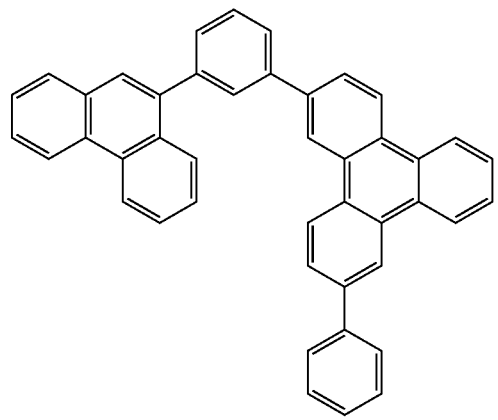

(C17)

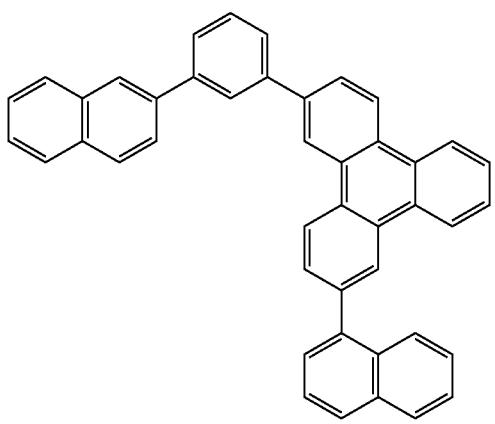

(C18)

In the present invention, the phosphorescent material preferably contains a metal complex, and the metal complex includes preferably a metal atom selected from a group consisting of Ir, Pt, Os, Au, Cu, Re and Ru and a ligand. In particular, the ligand preferably has an ortho-metal bond.

The phosphorescent material preferably includes a compound containing a metal selected from iridium (Ir), osmium (Os) and platinum (Pt) because such a metal has a high phosphorescent quantum yield and can further enhance an external quantum yield of the emitting device. More preferably, the phosphorescent material includes a metal complex such as an iridium complex, an osmium complex or a platinum complex. Among them, the iridium complex and the platinum complex are more preferred, and an ortho-metallized iridium complex is most preferred.

Examples of the preferred metal complexes are shown below.

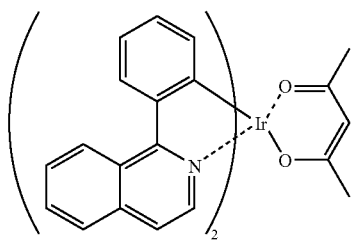

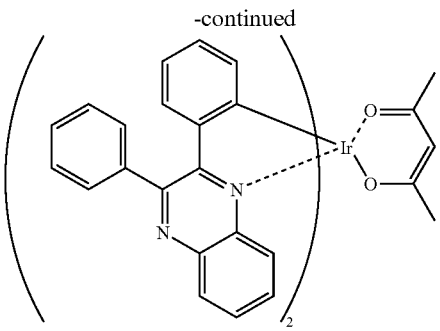

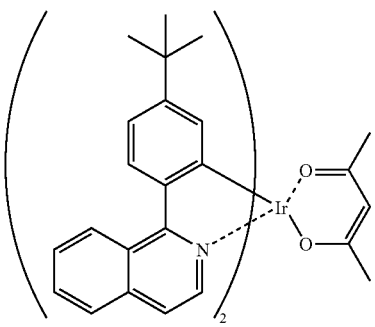

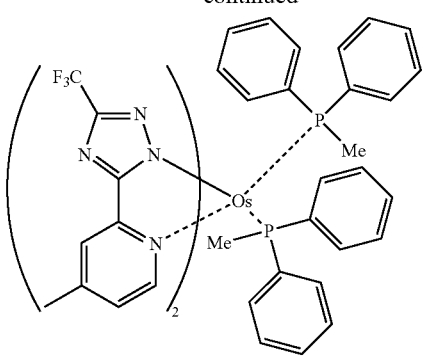
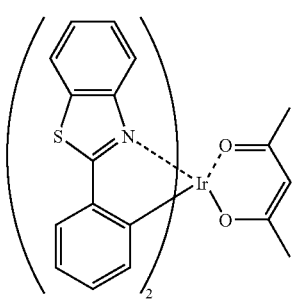
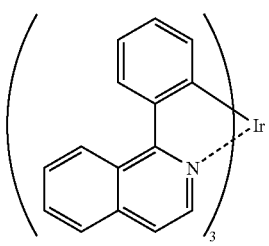
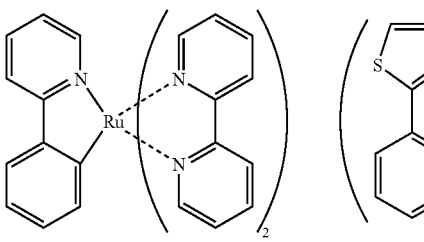
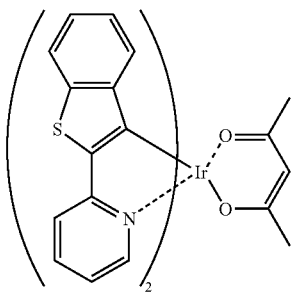
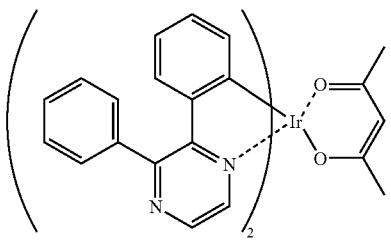
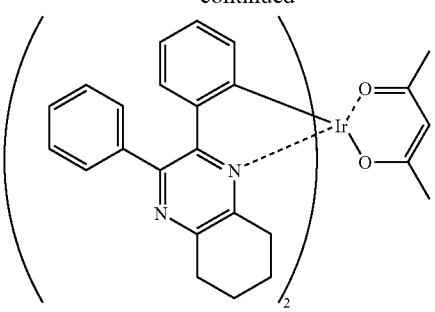
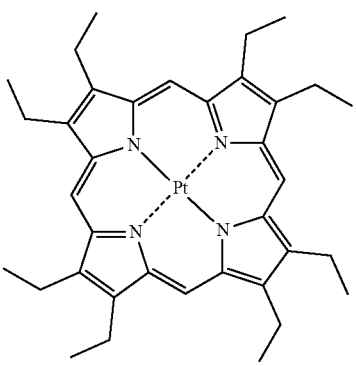
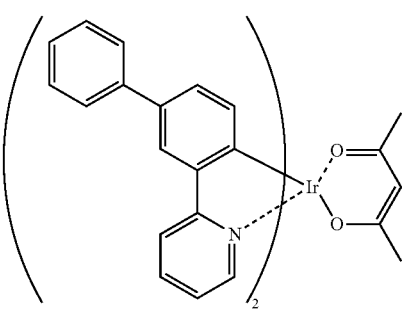
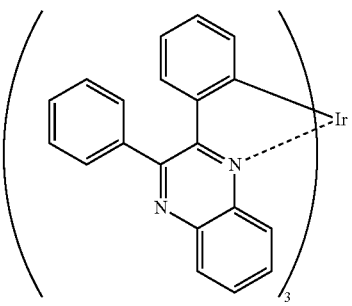
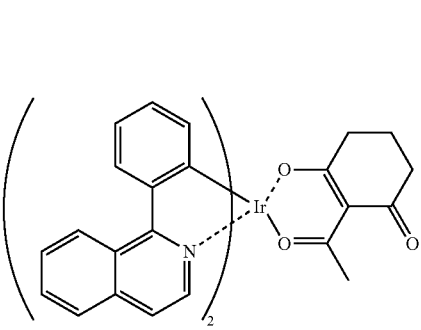

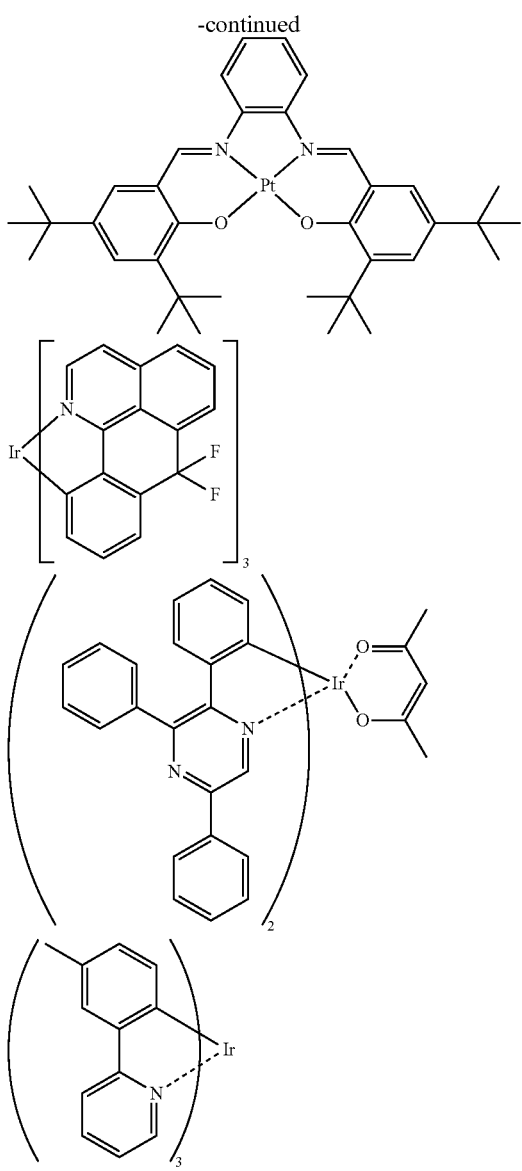

In the present invention, the at least one phosphorescent material contained in the phosphorescent emitting layer preferably emits light with a maximum wavelength of 520 nm to 720 nm, more preferably 570 nm to 720 nm.

The phosphorescent material (phosphorescent dopant) having such an emission wavelength is doped into the specific host material used in the present invention to form the emitting layer, whereby the organic EL device having high efficiency can be provided.

The organic EL device of the present invention includes a hole transporting layer (hole injecting layer), and the above hole transporting layer (hole injecting layer) may preferably contain the material for an organic EL device according to the present invention. Also, the organic EL device of the present invention includes an electron transporting layer and/or a hole blocking layer, and the above electron transporting layer and/or the hole blocking layer may preferably contain the material for an organic EL device according to the present invention.

The organic EL device of the present invention preferably contains a reductive dopant in an interfacial region between the cathode and the organic thin-film layer.

With this arrangement, the organic EL device can emit light with enhanced luminance intensity and have a longer lifetime.

The reductive dopant includes at least one selected from a group of alkali metals, alkali metal complexes, alkali metal compounds, alkali earth metals, alkali earth metal complexes, alkali earth metal compounds, rare earth metals, rare earth metal complexes, rare earth metal compounds and the like.

Examples of the alkali metal include Na (work function: 2.36 eV), K (work function: 2.28 eV), Rb (work function: 2.16 eV), Cs (work function: 1.95 eV) and the like, and compounds having a work function of 2.9 eV or less are particularly preferred. Among them, the alkali metal is preferably K, Rb or Cs, more preferably Rb or Cs and most preferably Cs.

Examples of the alkali earth metal include Ca (work function: 2.9 eV), Sr (work function: 2.0 to 2.5 eV), Ba (work function: 2.52 eV) and the like, and the compounds having a work function of 2.9 eV or less are particularly preferred.

Examples of the rare earth metal include Sc, Y, Ce, Tb, Yb and the like, and the compounds having a work function of 2.9 eV or less are particularly preferred.

Among the metals described above, the preferred metals have particularly a high reducing ability, and addition of a relatively small amount thereof to the electron injecting region can enhance an luminance intensity and extend a lifetime in the organic EL device.

Examples of the alkali metal compound include alkali oxides such as $Li_2O$, $Cs_2O$ and $K_2O$ and alkali halides such as LiF, NaF, CsF and KF. Among the above, LiF, $Li_2O$ and NaF are preferred.

Examples of the alkali earth metal compound include BaO, SrO, CaO, a mixture thereof such as $Ba_xSr_{1-x}O$ (0<x<1) or $Ba_xCa_{1-x}O$ (0<x<1). Among the above, BaO, SrO and CaO are preferred.

Examples of the rare earth metal compound include $YbF_3$, $ScF_3$, $ScO_3$, $Y_2O_3$, $Ce_2O_3$, $GdF_3$, $TbF_3$ and the like, and $YbF_3$, $ScF_3$ and $TbF_3$ are preferred.

The alkali metal complex, the alkali earth metal complex and the rare earth metal complex are not specifically limited as long as they contain at least one metal ion of alkali metal ions, alkali earth metal ions and rare earth metal ions. The ligand is preferably quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfulvorane, bipyridyl, phenanthroline, phthalocyanine, porphyrin, cyclopentadiene, β-diketones, azomethines and derivatives thereof. However, the alkali metal complex, the alkali earth metal complex and the rare earth metal complex are not limited to the above compounds.

The reductive dopant is formed in an interfacial region preferably in a layer form or an island form. The reductive dopant is preferably formed by depositing the reductive dopant by resistance heating deposition while simultaneously depositing an organic substance such as an emitting material or an electron injecting material for forming an interfacial region, and, and dispersing the reductive dopant in the organic substance. The dispersion concentration is organic substance: reducing dopant=100:1 to 1:100, preferably 5:1 to 1:5 in terms of a mole ratio.

When the reducing dopant is formed in a layer form, the emitting material and the electron injecting material (i.e., organic layer for forming the interfacial region) are formed in a layer form, and then the reductive dopant is deposited alone by the resistance heating deposition to form the layer preferably of a thickness of 0.1 to 15 nm.

When the reducing dopant is formed in an island form, the emitting material and the electron injecting material (i.e., organic layer for forming the interfacial region) are formed in an island form, and then the reducing dopant is deposited alone by the resistance heating deposition to form the island preferably in a thickness of 0.05 to 1 nm.

A mole ratio of the main component to the reductive dopant in the organic EL device of the present invention is preferably main component:reductive dopant=5:1 to 1:5, more preferably 2:1 to 1:2.

The organic EL device of the present invention preferably includes an electron injecting layer between the emitting layer and the cathode, and the electron injecting layer preferably contains a nitrogen-containing ring derivative as a main component. In this regard, the electron injecting layer may serve as an electron transporting layer.

The term "as a main component" means that the electron injecting layer contains 50 mass % or more of the nitrogen-containing ring derivative.

The electron injecting layer or the electron transporting layer is for assisting injection of electrons into the emitting layer, and has a large electron mobility. The electron injecting layer is provided in order to adjust an energy level, by which, for instance, a sudden change in the energy level can be reduced.

An electron transporting material used for the electron injecting layer is preferably an aromatic heterocyclic compound having at least one hetero atom in its molecule, and particularly preferably a nitrogen-containing ring derivative. The nitrogen-containing ring derivative is preferably an aromatic ring having a nitrogen-containing six-membered or five-membered ring skeleton or a condensed aromatic ring compound having a nitrogen-containing six-membered or five-membered ring skeleton.

The above nitrogen-containing ring derivative is preferably, for example, a nitrogen-containing ring metal chelate complex represented by the following Formula (A).

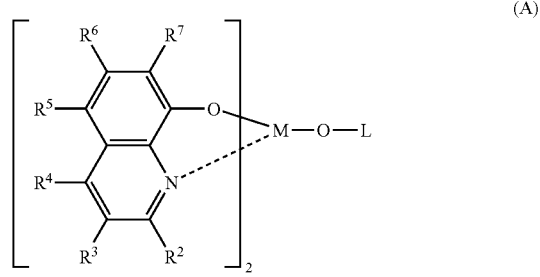

(A)

$R^2$ to $R^7$ each independently represent a hydrogen atom, a halogen atom, an oxy group, an amino group, a hydrocarbon group having 1 to 40 carbon atoms, an alkoxy group, an aryloxy group, an alkoxycarbonyl group or a heterocyclic group, and they may be substituted.

Examples of the halogen atom include fluorine, chlorine, bromine and iodine. Examples of the substituted or non-substituted amino group include an alkylamino group, an arylamino group and an aralkylamino group.

Examples of the hydrocarbon group having 1 to 40 carbon atoms include a substituted or non-substituted alkyl group, an alkenyl group, a cycloalkyl group, an aryl group, an aralkyl group and the like.

Examples of the alkyl group include methyl, ethyl, propyl, isopropyl, n-butyl, s-butyl, isobutyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, neopentyl, 1-methylpentyl, 2-methylpentyl, 1-pentylhexyl, 1-butylpentyl, 1-heptyloctyl, 3-methylpentyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 1,2-dinitroethyl, 2,3-dinitro-t-butyl, 1,2,3-trinitropropyl and the like.

Among the above, preferred examples are methyl, ethyl, propyl, isopropyl, n-butyl, s-butyl, isobutyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, neopentyl, 1-methylpentyl, 1-pentylhexyl or 1-butylpentyl and 1-heptyloctyl.

Examples of the alkenyl group include vinyl, allyl, 1-butenyl, 2-butenyl, 3-butenyl, 1,3-butanedienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl and the like, and preferable examples are 2,2-diphenylvinyl, 1,2-diphenylvinyl and the like.

Examples of the cycloalkyl group include cyclopentyl, cyclohexyl, cyclooctyl, 3,5-tetramethylcyclohexyl and the like, and cyclohexyl, cyclooctyl and 3,5-tetramethylcyclohexyl are preferred.

The alkoxy group is a group represented by —OY, and the specific examples of Y include the same groups as explained in the alkyl group described above. The preferred examples thereof include the same groups.

Examples of the non-condensed aryl group include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, m-quarterphenyl and the like.

Among the above, preferred examples are phenyl, biphenyl-2-yl, biphenyl-3-yl, biphenyl-4-yl, m-terphenyl-4-yl, m-terphenyl-3-yl, m-terphenyl-2-yl, p-tolyl, 3,4-xylyl and m-quarterphenyl-2-yl.

The condensed aryl group includes, for example, 1-naphthyl and 2-naphthyl.

The heterocyclic group is a monocyclic or condensed ring, and the heterocyclic group preferably has 1 to 20 ring carbon atoms, more preferably 1 to 12 ring carbon atoms and further preferably 2 to 10 ring carbon atoms. In addition, the heterocyclic group is an aromatic heterocyclic group having at least one hetero atom selected from a nitrogen atom, an oxygen atom, a sulfur atom and a selenium atom. The examples of the above heterocyclic group include, for example, groups derived from pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzimidazole, benzoxazole, benzothiazole, benzotriazole, tetrazaindene, carbazole, azepine and the like. The heterocyclic group is preferably a group derived from furan, thiophene, pyridine, pyrazine, pyrimidine, pyridazine, triazine, quinoline, phthalazine, naphthyridine, quinoxaline or quinazoline, more preferably furan, thiophene, pyridine or quinoline and further preferably quinolinyl.

Examples of the aralkyl group include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, 1-chloro-2-phenylisopropyl and the like.

Among the above, preferred examples are benzy, p-cyanobenzyl, m-cyanobenzyl, o-cyanobenzyl, 1-phenylethyl, 2-phenylethyl, 1-phenylisopropyl and 2-phenylisopropyl.

The aryloxy group is represented by —OY', and the examples of Y' include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4''-t-butyl-p-terphenyl-4-yl and the like.

Among the aryloxy groups, a heteroaryloxy group is represented by —OZ', and the examples of Z' include 2-pyrrolyl, 3-pyrrolyl, pyrazinyl, 2-pyridinyl, 3-pyridinyl, 4-pyridinyl, 2-indolyl, 3-indolyl, 4-indolyl, 5-indonyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl and the like.

The alkoxylcarbonyl group is represented by —COOY', and the examples of Y' include the same groups as in the alkyl group described above.

The alkylamino group and the alrakylamino group are represented by —NQ$^1$Q$^2$, and the specific examples of Q$^1$ and Q$^2$ each include the same groups as explained in the alkyl group and the aralkyl group described above. The preferred examples thereof are the same. One of Q$^1$ and Q$^2$ may be a hydrogen atom.

The arylamino group is represented by —NAr$^1$Ar$^2$, and the specific examples of Ar$^1$ and Ar$^2$ each include the same groups as explained in the non-condensed aryl group and the condensed aryl group described above. One of Ar$^1$ and Ar$^2$ may be a hydrogen atom.

M is aluminum (Al), gallium (Ga) or indium (In). M is preferably In.

L in Formula (A) is a group represented by the following Formula (A') or (A").

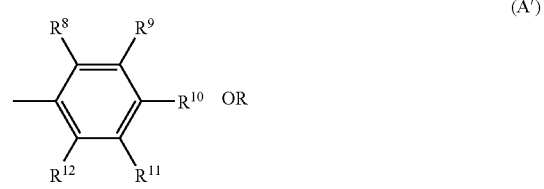

(A')

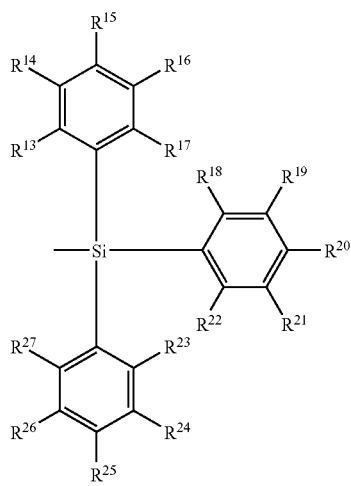

(A″)

In the formulae described above, $R^8$ to $R^{12}$ each independently represent a hydrogen atom or a substituted or non-substituted hydrocarbon group having 1 to 40 carbon atoms, and the groups which are adjacent to each other may form a cyclic structure. $R^{13}$ to $R^{27}$ each independently represent a hydrogen atom or a substituted or non-substituted hydrocarbon group having 1 to 40 carbon atoms, and the groups which are adjacent to each other may form a cyclic structure.

Examples of the hydrocarbon group having 1 to 40 carbon atoms represented by $R^8$ to $R^{12}$ and $R^{13}$ to $R^{27}$ in Formulae (A′) and (A″) each includes the same groups as the specific examples of $R^2$ to $R^7$.

Examples of a divalent group for the cyclic structure formed by the adjacent groups of $R^8$ to $R^{12}$ and $R^{13}$ to $R^{27}$ includes tetramethylene, pentamethylene, hexamethylene, diphenylmethane-2,2′-diyl, diphenylethane-3,3′-diyl, diphenylpropane-4,4′-diyl and the like.

Examples of the nitrogen-containing ring metal chelate complex represented by Formula (A) are shown below, but the nitrogen-containing ring metal chelate complex is not limited to these exemplary compounds.

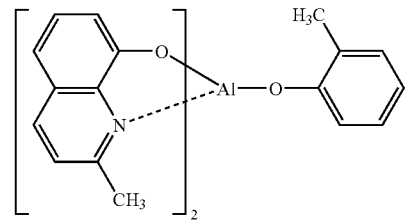

(A-1)

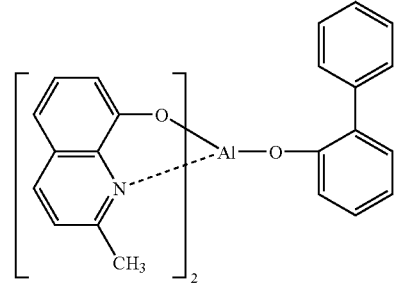

(A-2)

(A-3)

(A-4)

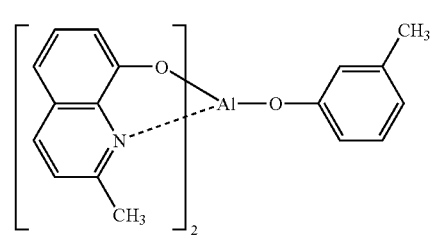

(A-5)

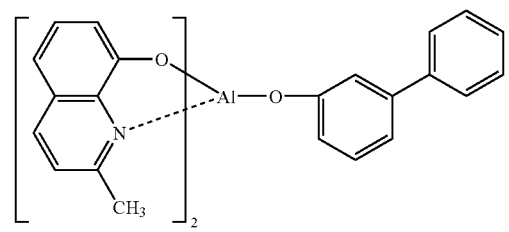

(A-6)

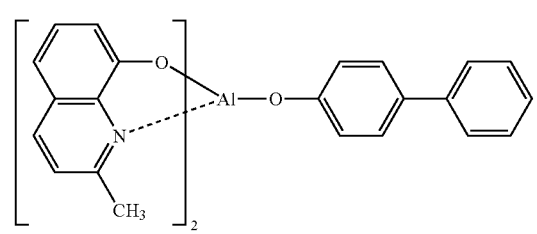

(A-7)

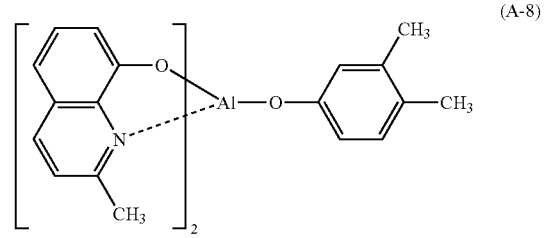

(A-8)

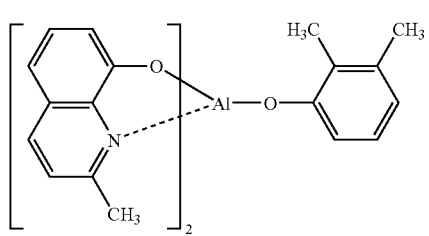 (A-9)
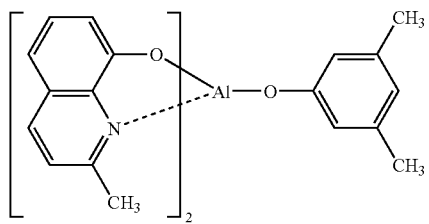 (A-10)
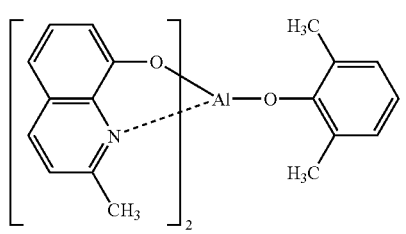 (A-11)
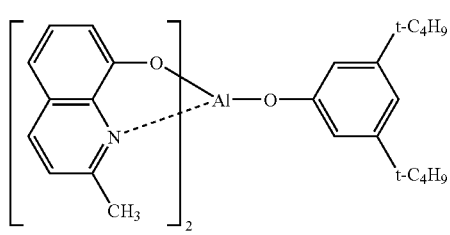 (A-12)
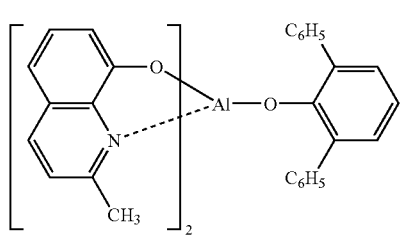 (A-13)
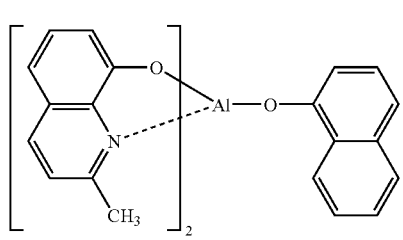 (A-14)
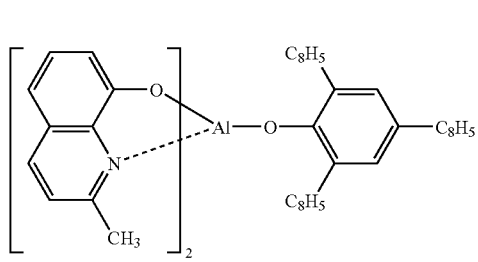 (A-15)
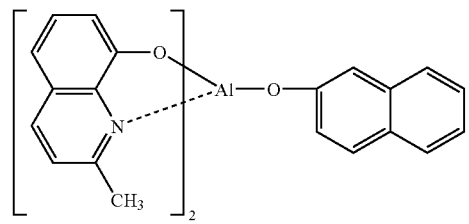 (A-16)
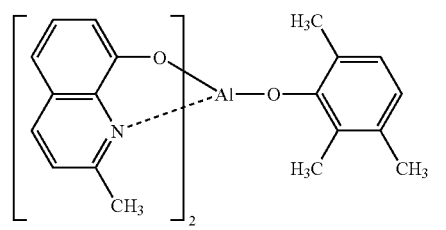 (A-17)
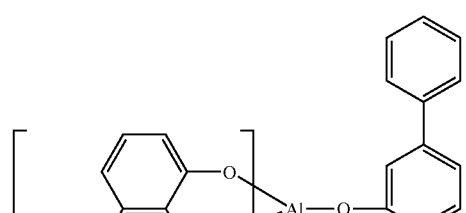 (A-18)
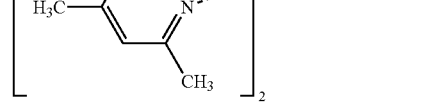 (A-19)
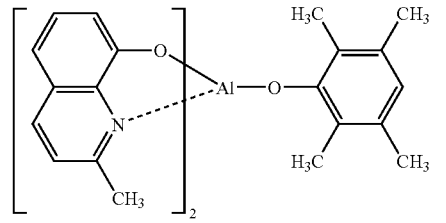 (A-20)
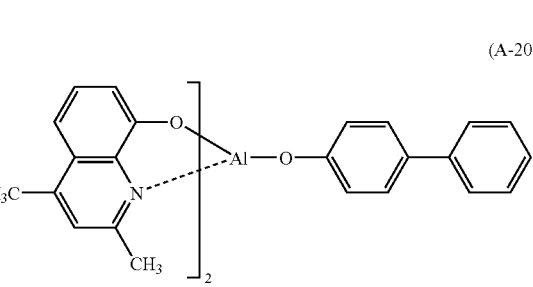 (A-20)
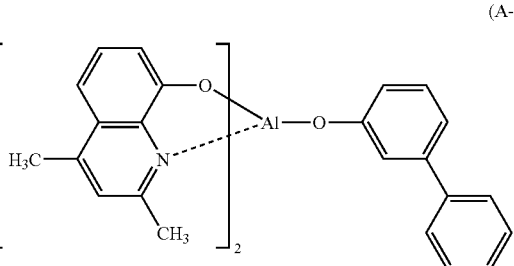 (A-21)

(A-22) 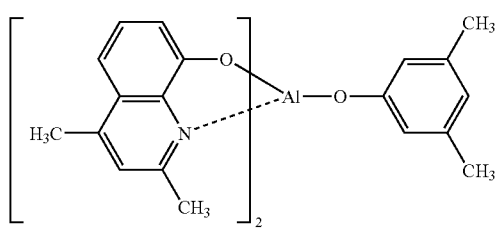
(A-23) 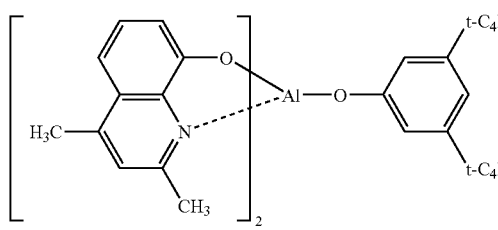
(A-24) 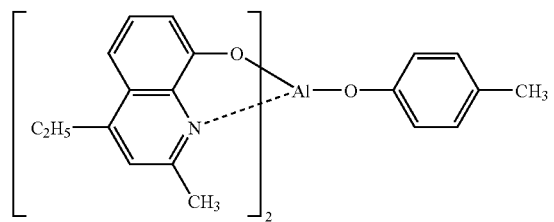
(A-28) 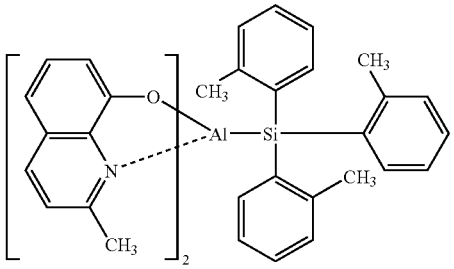
(A-29) 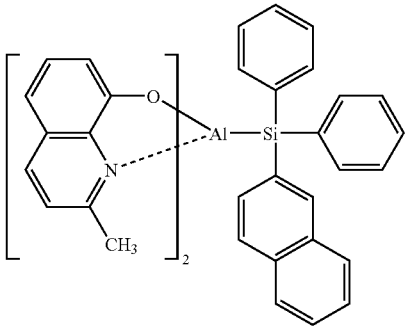
(A-30) 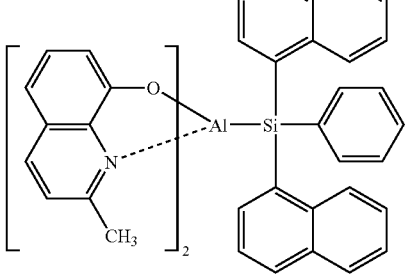
(A-25)
(A-26)
(A-27)
(A-31) 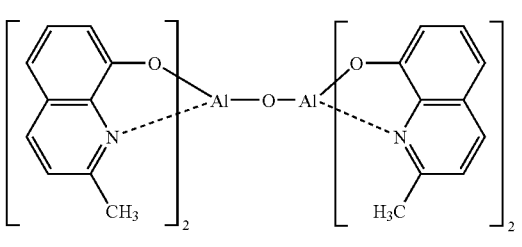
(A-32) 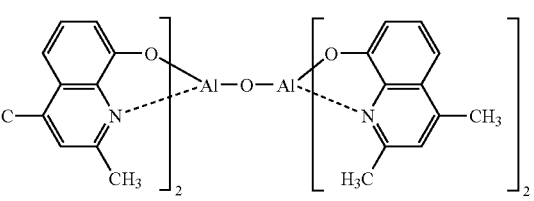
(A-33) 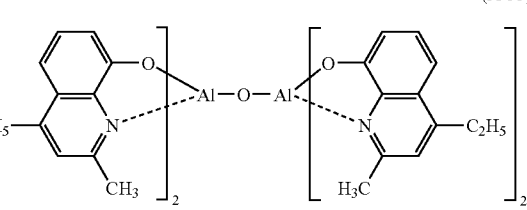

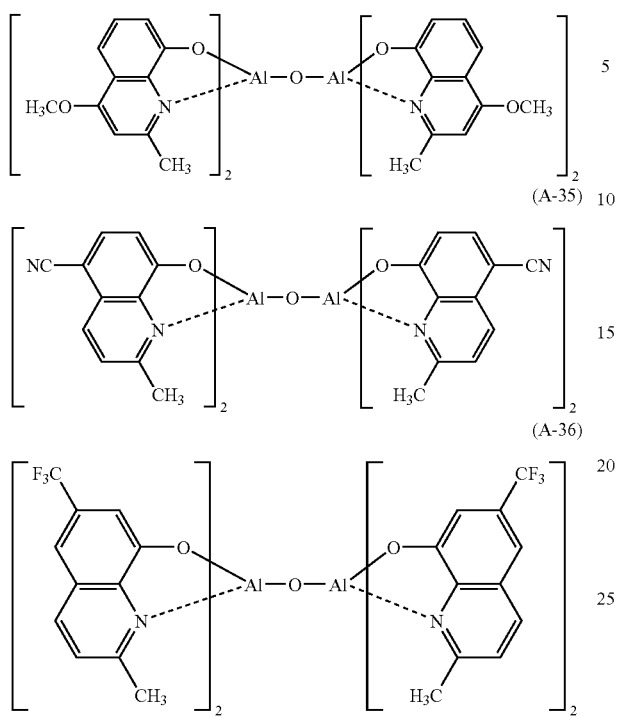

In the present invention, the electron injecting layer and the electron transporting layer preferably contain a nitrogen-containing heterocyclic derivative.

The electron injecting layer or the electron transporting layer, which is a layer for assisting injection of electrons into the emitting layer, has a large electron mobility. The electron injecting layer is provided in order to adjust an energy level, by which, for instance, sudden changes in the energy level can be reduced. A material used for the electron injecting layer or the electron transporting layer is preferably 8-hydroxyquinoline or metal complexes of derivatives thereof, oxadiazole derivatives and nitrogen-containing heterocyclic derivatives. Examples of the metal complexes of 8-hydroxyquinoline or the derivatives thereof include metal chelate oxynoid compounds containing chelates of oxine (in general, 8-quinolinol or 8-hydroxyquinoline), for example, tris(8-quinolinol)aluminum. The oxadiazole derivative includes the following compounds.

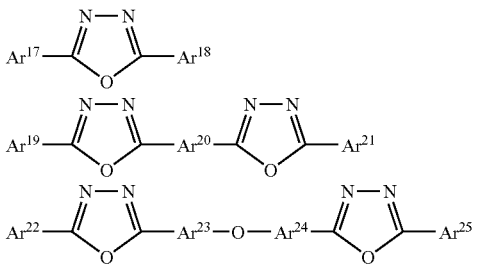

In the formulae, $Ar^{17}$, $Ar^{18}$, $Ar^{19}$, $Ar^{21}$, $Ar^{22}$ and $Ar^{25}$ each represent a substituted or non-substituted aryl group, and $Ar^{17}$ and $Ar^{18}$, $Ar^{19}$ and $Ar^{21}$ and $Ar^{22}$ and $Ar^{25}$ may be the same as or different from each other. $Ar^{20}$, $Ar^{23}$ and $Ar^{24}$ each represent a substituted or non-substituted arylene group, and $Ar^{23}$ and $Ar^{24}$ may be the same as or different from each other.

Examples of the arylene group includes phenylene, naphthylene, biphenylene, anthranylene, perylenylene, pyrenylene and the like. Substituents therefor include an alkyl group having 1 to 10 carbon atoms, an alkoxy group having 1 to 10 carbon atoms or a cyano group. Compounds that can be favorably formed into thin film(s) are preferably used as the above electron transfer compound. The following compounds are the specific examples of the electron transfer compound.

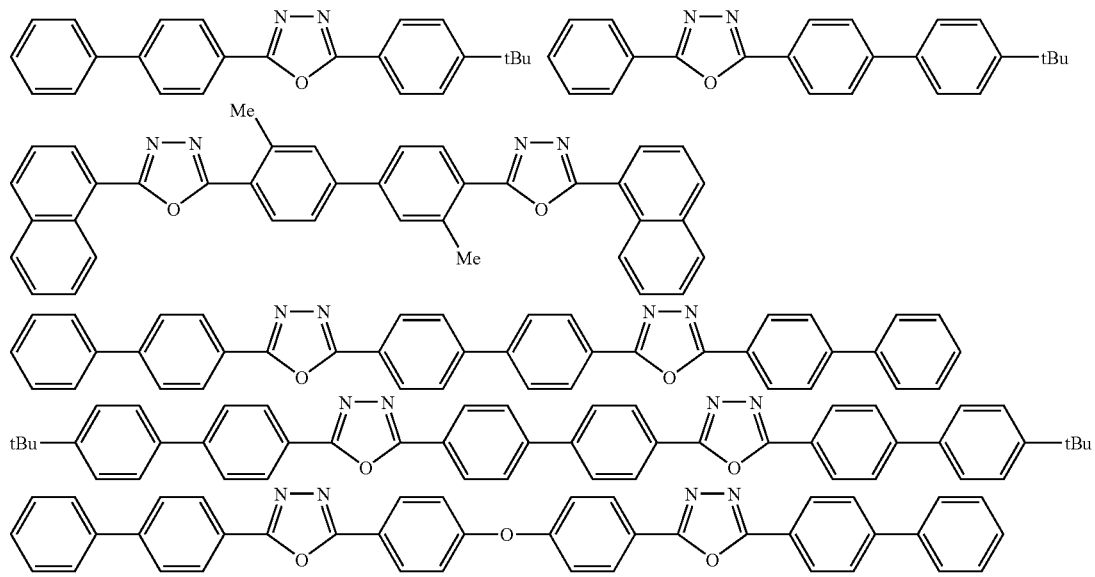

Examples of the nitrogen-containing heterocyclic derivative are nitrogen-containing compounds formed of organic compounds represented by the following formulae, the nitrogen-containing compounds not being metal complexes. The nitrogen-containing heterocyclic derivative may exemplarily be a five-membered or six-membered ring having a skeleton represented by the following formula (A) or a compound having a structure represented by the following formula (B).

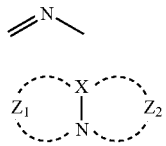
(A)

(B)

In the formula (B), X represents a carbon atom or a nitrogen atom. $Z_1$ and $Z_2$ each independently represent an atomic group which can form a nitrogen-containing heterocycle.

(C)

The nitrogen-containing heterocyclic derivative is preferably an organic compound having a nitrogen-containing aromatic polycyclic group including a five-membered ring or a six-membered ring. When the nitrogen-containing heterocyclic derivative is a nitrogen-containing aromatic polycyclic group having plural nitrogen atoms, the nitrogen-containing heterocyclic derivative is preferably a nitrogen-containing aromatic polycyclic organic compound having a skeleton obtained by combining the formula (A) with the formula (B) or the formula (A) with the formula (C).

A nitrogen-containing group of the nitrogen-containing organic compound is selected from, for example, nitrogen-containing heterocyclic groups represented by the following general formulae.

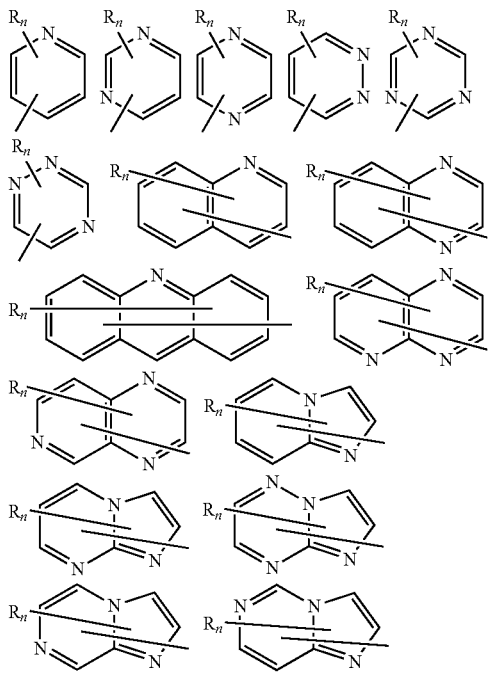

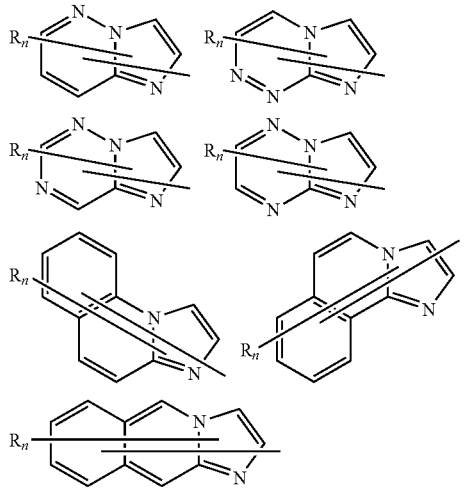

In the formulae, R represents an aryl group having 6 to 40 carbon atoms, a heteroaryl group having 3 to 40 carbon atoms, an alkyl group having 1 to 20 carbon atoms or an alkoxy group having 1 to 20 carbon atoms. n is an integer of 0 to 5, and when n is an integer of 2 or more, plural R may be the same as or different from each other.

The preferable compounds for the nitrogen-containing heterocyclic derivative are nitrogen-containing heterocyclic derivatives represented by the following formula.

In the formula: HAr represents a substituted or non-substituted nitrogen-containing heterocycle having 3 to 40 carbon atoms; $L^1$ represents a single bond, a substituted or non-substituted arylene group having 6 to 40 carbon atoms or a substituted or non-substituted heteroarylene group having 3 to 40 carbon atoms; $Ar^1$ is a substituted or non-substituted divalent aromatic hydrocarbon group having 6 to 40 carbon atoms; and $Ar^2$ is a substituted or non-substituted aryl group having 6 to 40 carbon atoms or a substituted or non-substituted heteroaryl group having 3 to 40 carbon atoms.

HAr is selected from, for example, the following groups.

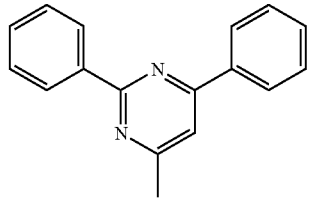

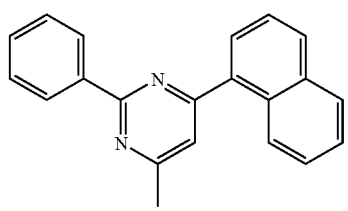

-continued
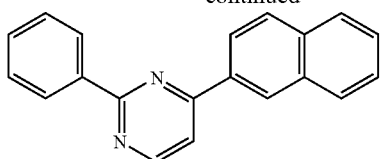
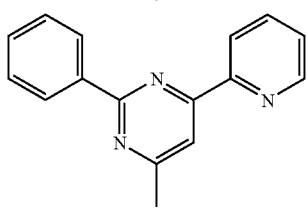
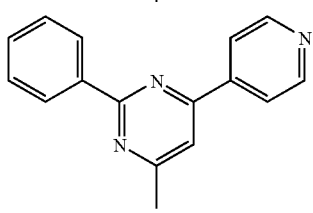
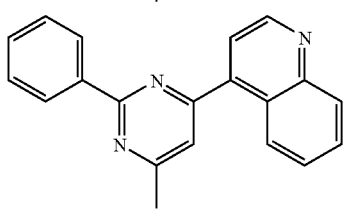
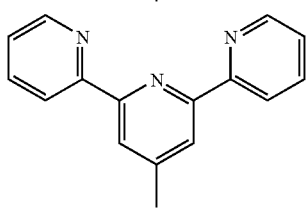
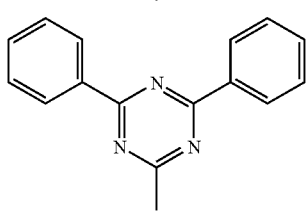
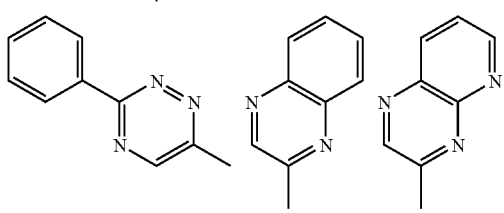
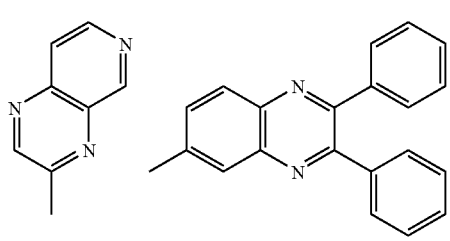
-continued
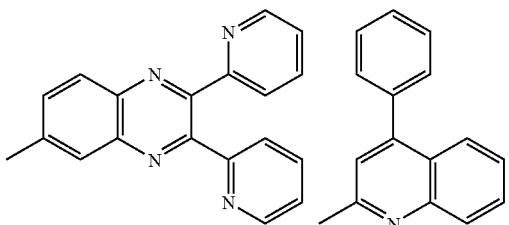
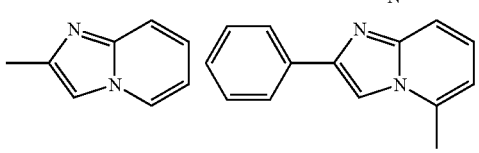
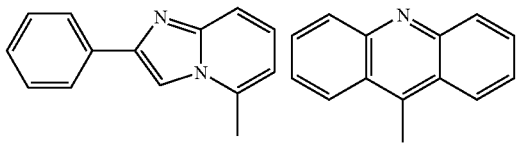
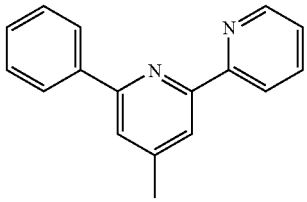
$L^1$ is selected from, for example, the following groups.
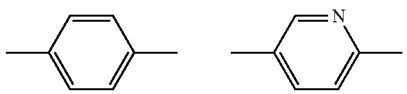
$Ar^2$ is selected from, for example, the following groups.
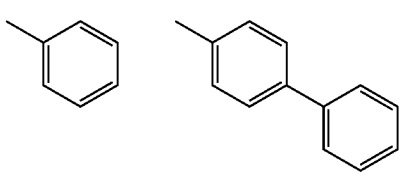
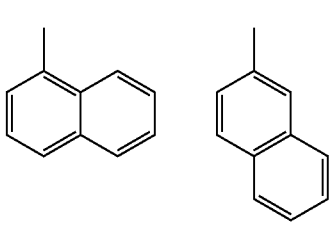
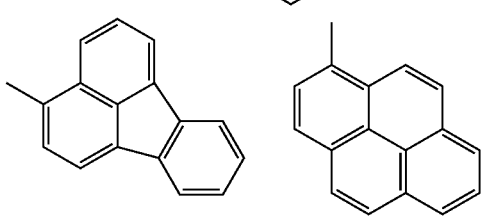

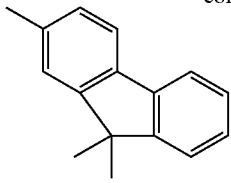

Ar¹ is selected from, for example, the following arylanthranyl groups.

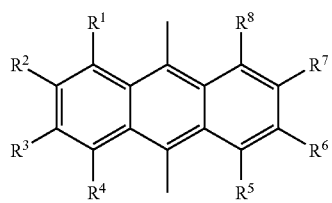

-continued

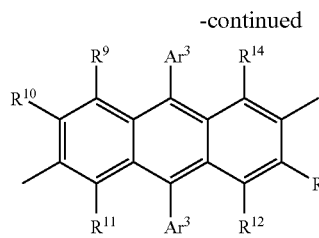

In the formulae: $R^1$ to $R^{14}$ each independently represent a hydrogen atom, a halogen atom, an alkyl group having 1 to 20 carbon atoms, an alkoxy group having 1 to 20 carbon atoms, an aryloxy group having 6 to 40 carbon atoms, a substituted or non-substituted aryl group having 6 to 40 carbon atoms or a substituted or non-substituted heteroaryl group having 3 to 40 carbon atoms; and $Ar^3$ represents a substituted or non-substituted aryl group having 6 to 40 carbon atoms or a heteroaryloxy group having 3 to 40 carbon atoms.

The nitrogen-containing heterocyclic derivative is preferably the nitrogen-containing heterocyclic derivative in which all of $R^1$ to $R^8$ are hydrogen atoms in $Ar^1$ represented by the formula described above.

In addition thereto, the following compound (refer to JP-A-9-3448) is suitably usable as well.

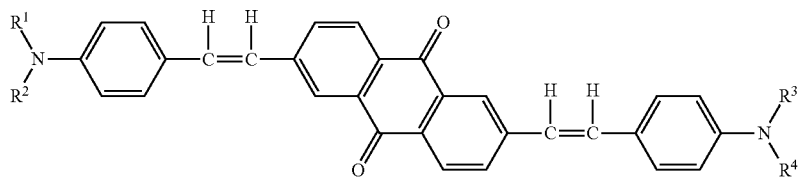

In the formula: $R_1$ to $R_4$ each independently represent a hydrogen atom, a substituted or non-substituted aliphatic group, a substituted or non-substituted alicyclic group, a substituted or non-substituted carbocyclic aromatic ring group or a substituted or non-substituted heterocyclic group; and $X_1$ and $X_2$ each independently represent an oxygen atom, a sulfur atom or a dicyanomethylene group.

The following compound (refer to JP-A-2000-173774) is suitably usable as well.

In the formula, $R^1$, $R^2$, $R^3$ and $R^4$, which are the same as or different from each other, each represent an aryl group represented by the following formula.

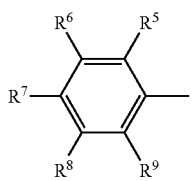

In the formula, $R^5$, $R^6$, $R^7$, $R^8$ and $R^9$, which are the same as or different from each other, each represent a hydrogen atom, a saturated or unsaturated alkoxyl group, an alkyl group, an amino group or an alkylamino group. At least one of $R^5$, $R^6$, $R^7$, $R^8$ and $R^9$ represents a saturated or unsaturated alkoxyl group, an alkyl group, an amino group or an alkylamino group.

A polymer compound containing the above nitrogen-containing heterocyclic group or nitrogen-containing heterocyclic derivative may be used.

The electron transporting layer preferably contains at least one of nitrogen-containing heterocyclic derivatives represented by the following Formulae (201) to (203).

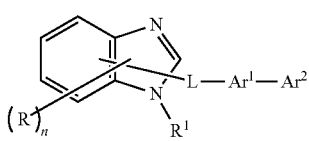

(201)

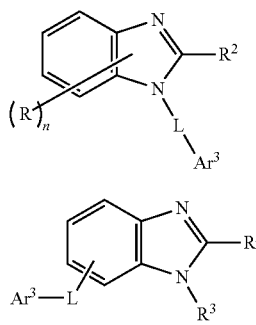

(202)

(203)

In Formulas (201) to (203): R represents a hydrogen atom, a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms; n represents an integer of 0 to 4; $R^1$ represents an aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms; $R^2$ and $R^3$ each independently represents a hydrogen atom, a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms; L is a substituted or non-substituted arylene group having 6 to 60 carbon atoms, a substituted or non-substituted pyridinylene group, a substituted or non-substituted quinolinylene group or a substituted or non-substituted fluorenylene group; $Ar^1$ represents a substituted or non-substituted arylene group having 6 to 60 carbon atoms, a substituted or non-substituted pyridinylene group or a substituted or non-substituted quinolinylene group; $Ar^2$ is a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms.

$Ar^3$ is a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms, a substituted or non-substituted alkoxy group having 1 to 20 carbon atoms or a group represented by —$Ar^1$—$Ar^2$ ($Ar^1$ and $Ar^2$ each are the same as described above).

In Formulae (201) to (203), R represents a hydrogen atom, a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms.

The aryl group having 6 to 60 carbon atoms is preferably an aryl group having 6 to 40 carbon atoms, more preferably an aryl group having 6 to 20 carbon atoms. Examples of the aryl group having 6 to 60 carbon atoms are phenyl, naphthyl, anthryl, phenanthryl, naphthacenyl, chrysenyl, pyrenyl, biphenyl, terphenyl, tolyl, t-butylphenyl, (2-phenylpropyl) phenyl, fluoranthenyl, fluorenyl, a monovalent group including spirobifluorene, perfluorophenyl, perfluoronaphthyl, perfluoroanthryl, perfluorobiphenyl, a monovalent group including 9-phenylanthracene, a monovalent group including 9-(1'-naphthyl)anthracene, a monovalent group including 9-(2'-naphthyl)anthracene, a monovalent group including 6-phenylchrysene, a monovalent group including 9-[4-(diphenylamino)phenyl]anthracene and the like. Phenyl, naphthyl, biphenyl, terphenyl, 9-(10-phenyl)anthryl, 9-[10-(1'-naphthyl)anthryl, 9-[10-(2'-naphthyl)anthryl and the like are preferred.

The alkyl group having 1 to 20 carbon atoms is preferably an alkyl group having 1 to 6 carbon atoms. Examples of the alkyl group having 1 to 20 carbon atoms are not only methyl, ethyl, propyl, butyl, pentyl, hexyl and the like but also a haloalkyl group such as trifluoromethyl and the like. The alkyl group having 3 or more carbon atoms may be linear, cyclic or branched.

The alkoxy group having 1 to 20 carbon atoms is preferably an alkoxy group having 1 to 6 carbon atoms. Examples of the alkoxy group having 1 to 20 carbon atoms are methoxy, ethoxy, propoxy, butoxy, pentyloxy, hexyloxy and the like, and the alkoxy group having 3 or more carbon atoms may be linear, cyclic or branched.

A substituent for the groups represented by R each may be a halogen atom, a substituted or non-substituted alkyl group having 1 to 20 carbon atoms, a substituted or non-substituted alkoxy group having 1 to 20 carbon atoms, a substituted or non-substituted aryloxy group having 6 to 40 carbon atoms, a substituted or non-substituted aryl group having 6 to 40 carbon atoms or a substituted or non-substituted heteroaryl group having 3 to 40 carbon atoms.

The halogen atom includes fluorine, chlorine, bromine and iodine.

Examples of the alkyl group having 1 to 20 carbon atoms, the alkoxy group having 1 to 20 carbon atoms and the aryl group having 6 to 40 carbon atoms each are the same groups as described above.

The aryloxy group having 6 to 40 carbon atoms includes, for example, phenoxy, biphenyloxy and the like.

The heteroaryl group having 3 to 40 carbon atoms includes, for example, pyrrolyl, furyl, thienyl, silolyl, pyridyl, quinolyl, isoquinolyl, benzofuryl, imidazolyl, pyrimidyl, carbazolyl, selenophenyl, oxadiazolyl, triazolyl and the like.

n is an integer of 0 to 4, preferably 0 to 2.

In Formula (201), $R^1$ is a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms.

Examples of the above respective groups and the preferred carbon number and substituents thereof are the same as explained for R described above.

In Formulas (202) and (203), $R^2$ and $R^3$ each independently represent a hydrogen atom, a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms.

Examples of the above respective groups and the preferred carbon number and substituents thereof are the same as explained for R described above.

In Formulas (201) to (203), L is a substituted or non-substituted arylene group having 6 to 60 carbon atoms, a substituted or non-substituted pyridinylene group, a substituted or non-substituted quinolinylene group or a substituted or non-substituted fluorenylene group.

The arylene group having 6 to 60 carbon atoms is preferably an arylene group having 6 to 40 carbon atoms, more preferably an arylene group having 6 to 20 carbon atoms. Examples of the arylene group having 6 to 60 carbon atoms are divalent groups formed by removing one hydrogen atom from the aryl groups explained for R described above. Substituents for the respective groups represented by L are the same as explained for R described above.

L is preferably a group selected from the group consisting of the following groups.

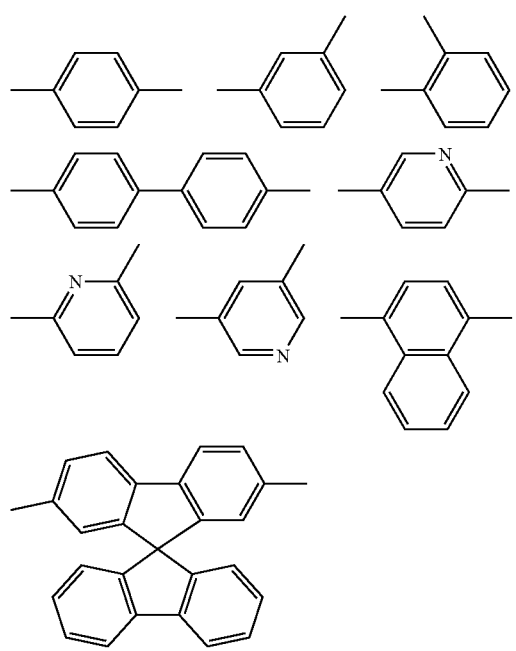

In Formula (201), Ar$^1$ is a substituted or non-substituted arylene group having 6 to 60 carbon atoms, a substituted or non-substituted pyridinylene group or a substituted or non-substituted quinolinylene group. Substituents for the respective groups represented by Ar$^1$ and Ar$^3$ each are the same as explained for R described above.

Ar$^1$ is preferably a group selected from condensed ring groups represented by the following Formulae (101) to (110).

(101)

(102)

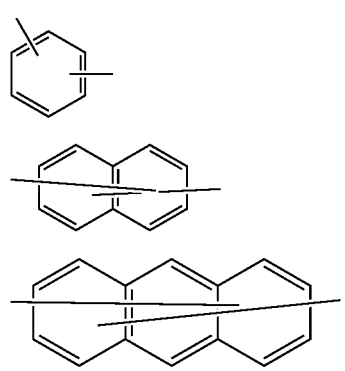

(103)

(104)

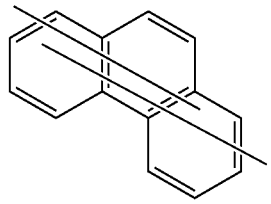

(105)

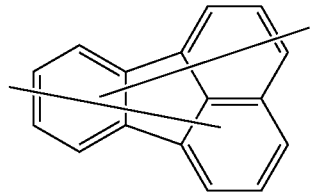

(106)

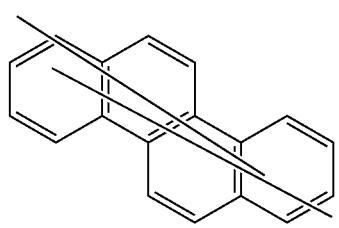

(107)

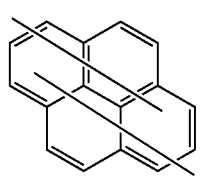

(108)

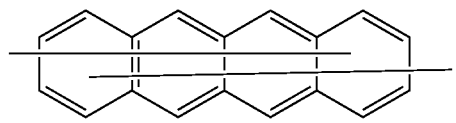

(109)

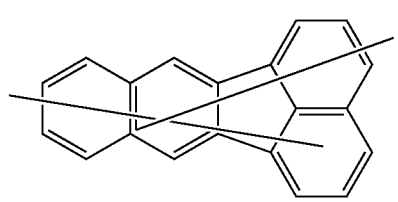

(110)

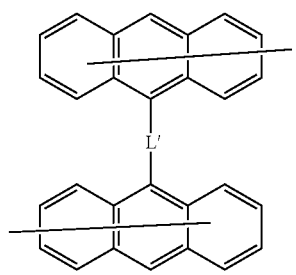

In Formulas (101) to (110), the respective condensed rings may be bonded with a bonding group including a halogen atom, a substituted or non-substituted alkyl group having 1 to 20 carbon atoms, a substituted or non-substituted alkoxy group having 1 to 20 carbon atoms, a substituted or non-substituted aryloxy group having 6 to 40 carbon atoms, a substituted or non-substituted aryl group having 6 to 40 carbon atoms or a substituted or non-substituted heteroaryl group having 3 to 40 carbon atoms. When a plurality of bonding groups are bonded thereto, the plurality of bonding groups may be the same as or different from each other. Examples of the above respective groups include the same groups as described above.

In Formula (110), L' represents a single bond or a group selected from the group consisting of the following groups.

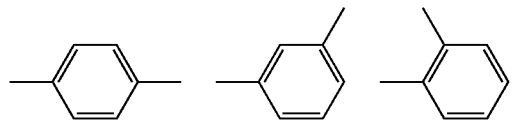

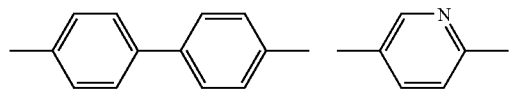

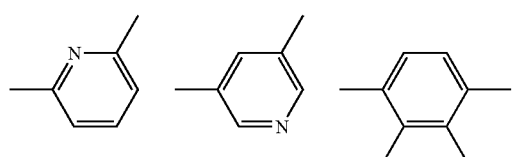

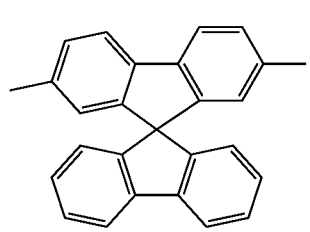

The structure of Ar¹ represented by Formula (103) is preferably a condensed ring group represented by the following Formulae (111) to (125).

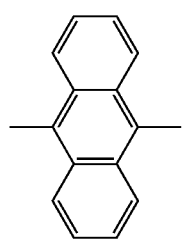
(111)

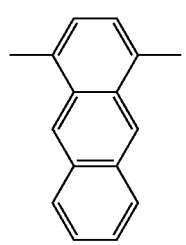
(112)

(113)

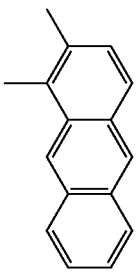
(114)

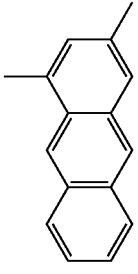
(115)

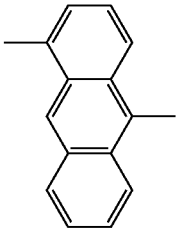
(116)

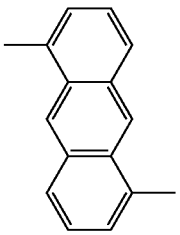
(117)

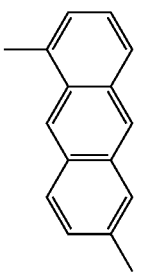
(118)

(119)
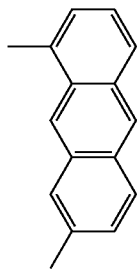

(120)
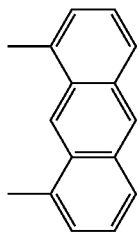

(121)
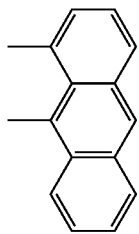

(122)
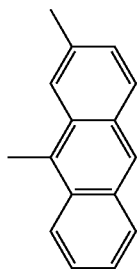

(123)
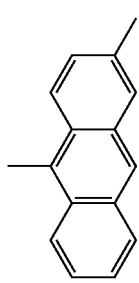

(124)

(125)
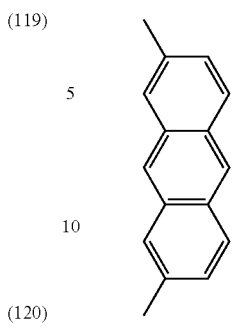

In Formula (111) to (125), the respective condensed rings may be bonded with a bonding group including a halogen atom, a substituted or non-substituted alkyl group having 1 to 20 carbon atoms, a substituted or non-substituted alkoxy group having 1 to 20 carbon atoms, a substituted or non-substituted aryloxy group having 6 to 40 carbon atoms, a substituted or non-substituted aryl group having 6 to 40 carbon atoms or a substituted or non-substituted heteroaryl group having 3 to 40 carbon atoms, and when a plurality of bonding groups are bonded thereto, the plurality of bonding groups may be the same as or different from each other. Examples of the above respective groups include the same groups as described above.

In Formula (201), $Ar^2$ represents a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms or a substituted or non-substituted alkoxy group having 1 to 20 carbon atoms.

Examples of the above respective groups and the preferred carbon number and substituents thereof are the same as explained for R described above.

In Formulae (202) and (203), $Ar^3$ represents a substituted or non-substituted aryl group having 6 to 60 carbon atoms, a substituted or non-substituted pyridyl group, a substituted or non-substituted quinolyl group, a substituted or non-substituted alkyl group having 1 to 20 carbon atoms, a substituted or non-substituted alkoxy group having 1 to 20 carbon atoms or a group represented by —$Ar^1$—$Ar^2$ ($Ar^1$ and $Ar^2$ each are the same as described above).

Examples of the above respective groups and the preferred carbon number and substituents thereof are the same as explained for R described above.

$Ar^3$ is preferably a group selected from condensed ring groups represented by the following Formulas (126) to (135).

(126)

(127)

(128)

-continued

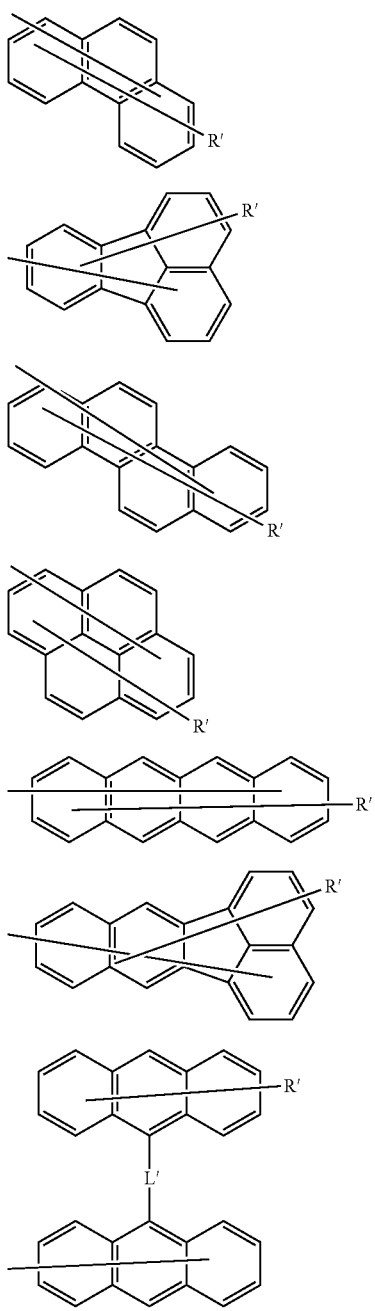

In Formulae (126) to (135), the respective condensed rings may be bonded with a bonding group including a halogen atom, a substituted or non-substituted alkyl group having 1 to 20 carbon atoms, a substituted or non-substituted alkoxy group having 1 to 20 carbon atoms, a substituted or non-substituted aryloxy group having 6 to 40 carbon atoms, a substituted or non-substituted aryl group having 6 to 40 carbon atoms or a substituted or non-substituted heteroaryl group having 3 to 40 carbon atoms, and when a plurality of bonding groups are bonded thereto, the plurality of bonding groups may be the same as or different from each other. Examples of the above respective groups include the same groups as described above.

In Formula (135), L' is the same as described above.

In Formulae (126) to (135), R' is a hydrogen atom, a substituted or non-substituted alkyl group having 1 to 20 carbon atoms, a substituted or non-substituted aryl group having 6 to 40 carbon atoms or a substituted or non-substituted heteroaryl group having 3 to 40 carbon atoms. Examples of the above respective groups include the same groups as described above.

The structure of $Ar^3$ represented by Formula (128) is preferably a condensed ring group represented by the following Formulas (136) to (158).

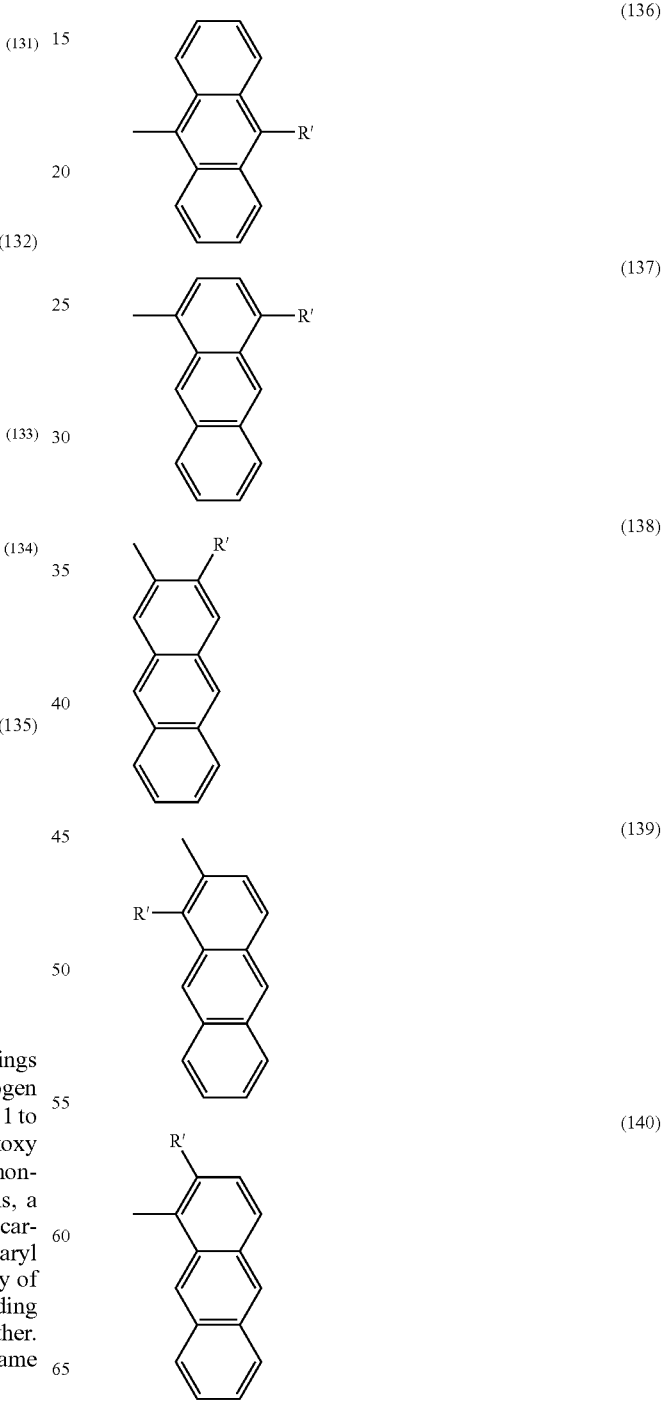

(141) 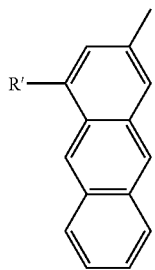
(142) 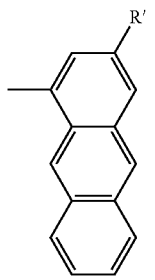
(143) 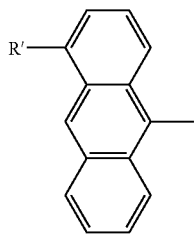
(144) 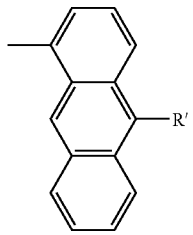
(145) 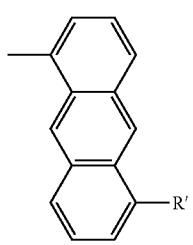
(146) 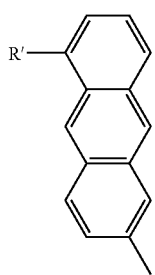
(147) 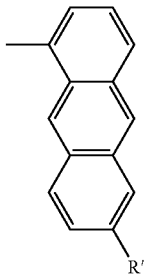
(148) 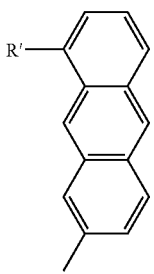
(149) 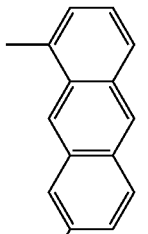
(150) 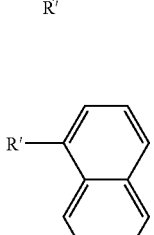
(151) 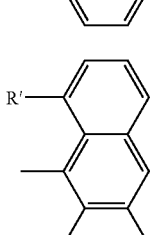
(152) 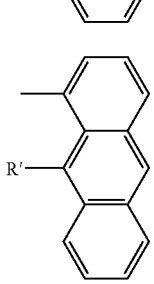

(153) 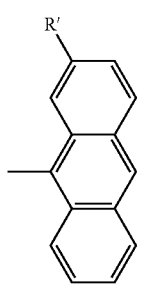

(154) 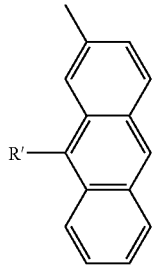

(155) 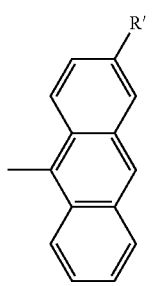

(156) 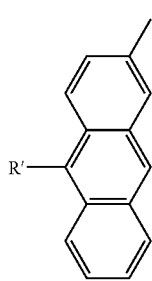

(157) 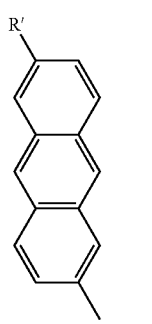

(158) 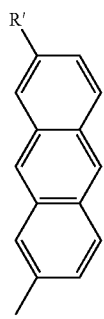

In Formulas (136) to (158), the respective condensed rings may be bonded with a bonding group including a halogen atom, a substituted or non-substituted alkyl group having 1 to 20 carbon atoms, a substituted or non-substituted alkoxy group having 1 to 20 carbon atoms, a substituted or non-substituted aryloxy group having 6 to 40 carbon atoms, a substituted or non-substituted aryl group having 6 to 40 carbon atoms or a substituted or non-substituted heteroaryl group having 3 to 40 carbon atoms, and when a plurality of bonding groups are bonded thereto, the plurality of bonding groups may be the same as or different from each other. Examples of the above respective groups include the same groups as described above. R' is the same as described above.

Preferably, $Ar^2$ and $Ar^3$ each independently represent a group selected from the group consisting of the following groups.

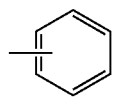 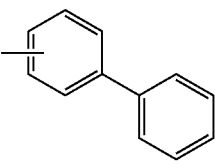

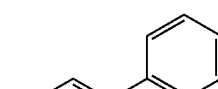 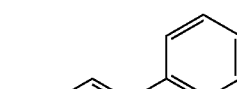

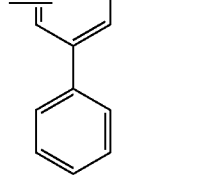

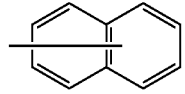 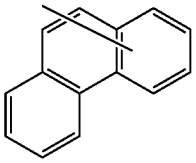

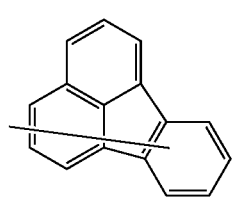 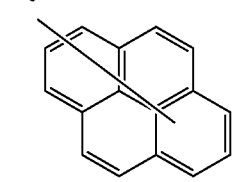

-continued
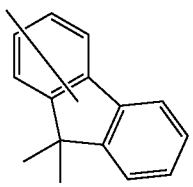
Examples of the nitrogen-containing heterocyclic derivatives of the present invention represented by Formulas (201) to (203) will be shown below, but the present invention is not limited to these exemplary compounds.
In the following tables, HAr represents the following structures in Formulas (201) to (203).
HAr—L—Ar¹—Ar²
| | HAr | L | Ar¹ | Ar² |
|---|---|---|---|---|
| 1-1 | | | | |
| 2 | | | | |
| 3 | | | | |
| 4 | | | | |

-continued

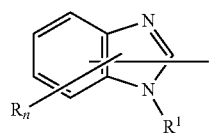 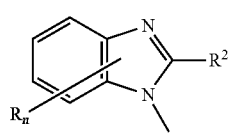 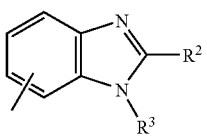

HAr—L—Ar¹—Ar²

| | HAr | L | Ar¹ | Ar² |
|---|---|---|---|---|
| 5 | 1-phenyl-2-methyl-benzimidazole | p-phenylene | 9,10-anthracenyl (dimethyl) | 3,5-diphenylphenyl |
| 6 | 1-phenyl-2-methyl-benzimidazole | p-phenylene | 9,10-anthracenyl (dimethyl) | 1-naphthyl |
| 7 | 1-phenyl-2-methyl-benzimidazole | p-phenylene | 9,10-anthracenyl (dimethyl) | 2-naphthyl |
| 8 | 1-phenyl-2-methyl-benzimidazole | p-phenylene | 9,10-anthracenyl (dimethyl) | phenanthrenyl |
| 9 | 1-phenyl-2-methyl-benzimidazole | p-phenylene | 9,10-anthracenyl (dimethyl) | fluoranthenyl |

-continued
| | | |
|---|---|---|
| 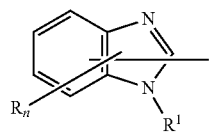 | 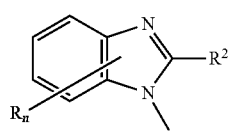 | 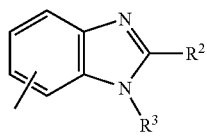 |
HAr—L—Ar$^1$—Ar$^2$
| | HAr | L | Ar$^1$ | Ar$^2$ |
|---|---|---|---|---|
| 10 | 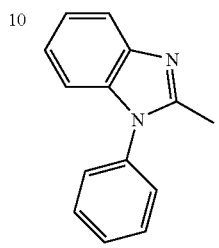 | 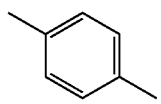 | 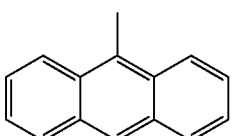 | 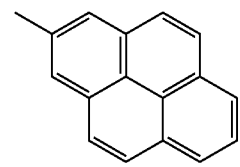 |
| 11 | 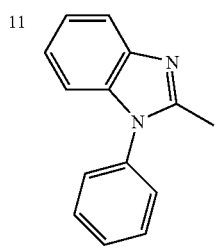 | 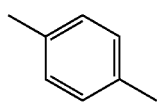 | 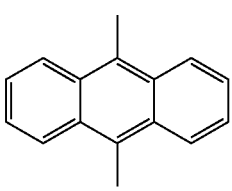 | 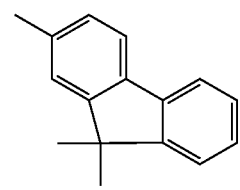 |
| 12 | 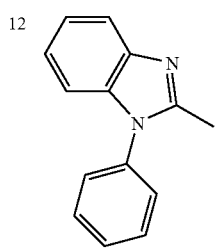 | 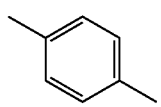 | 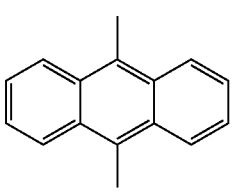 | 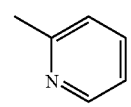 |
| 13 | 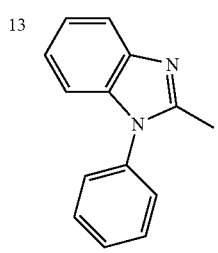 | 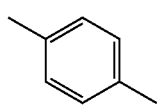 | 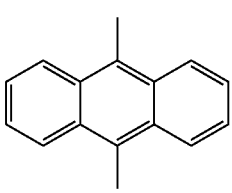 | 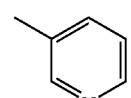 |
| 14 | 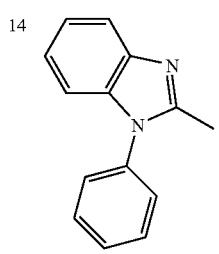 | 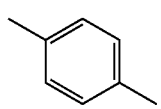 | 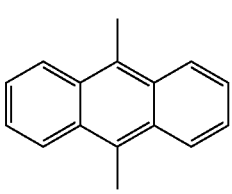 | 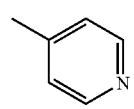 |

| | HAr | L | Ar¹ | Ar² |
|---|---|---|---|---|
| 2-1 | (1,2-dimethylbenzimidazole) | (1,4-phenylene) | (9,10-disubstituted anthracene) | (2-naphthyl) |
| 2 | (1-ethyl-2-methylbenzimidazole) | (1,4-phenylene) | (9,10-disubstituted anthracene) | (2-naphthyl) |
| 3 | (7-methyl-2-methyl-1-phenylbenzimidazole) | (1,4-phenylene) | (9,10-disubstituted anthracene) | (2-naphthyl) |
| 4 | (6-methyl-2-methyl-1-phenylbenzimidazole) | (1,4-phenylene) | (9,10-disubstituted anthracene) | (2-naphthyl) |
| 5 | (5-methyl-2-methyl-1-phenylbenzimidazole) | (1,4-phenylene) | (9,10-disubstituted anthracene) | (2-naphthyl) |
| 6 | (4-methyl-2-methyl-1-phenylbenzimidazole) | (1,4-phenylene) | (9,10-disubstituted anthracene) | (2-naphthyl) |

-continued
| HAr | L | Ar¹ | Ar² |
|---|---|---|---|
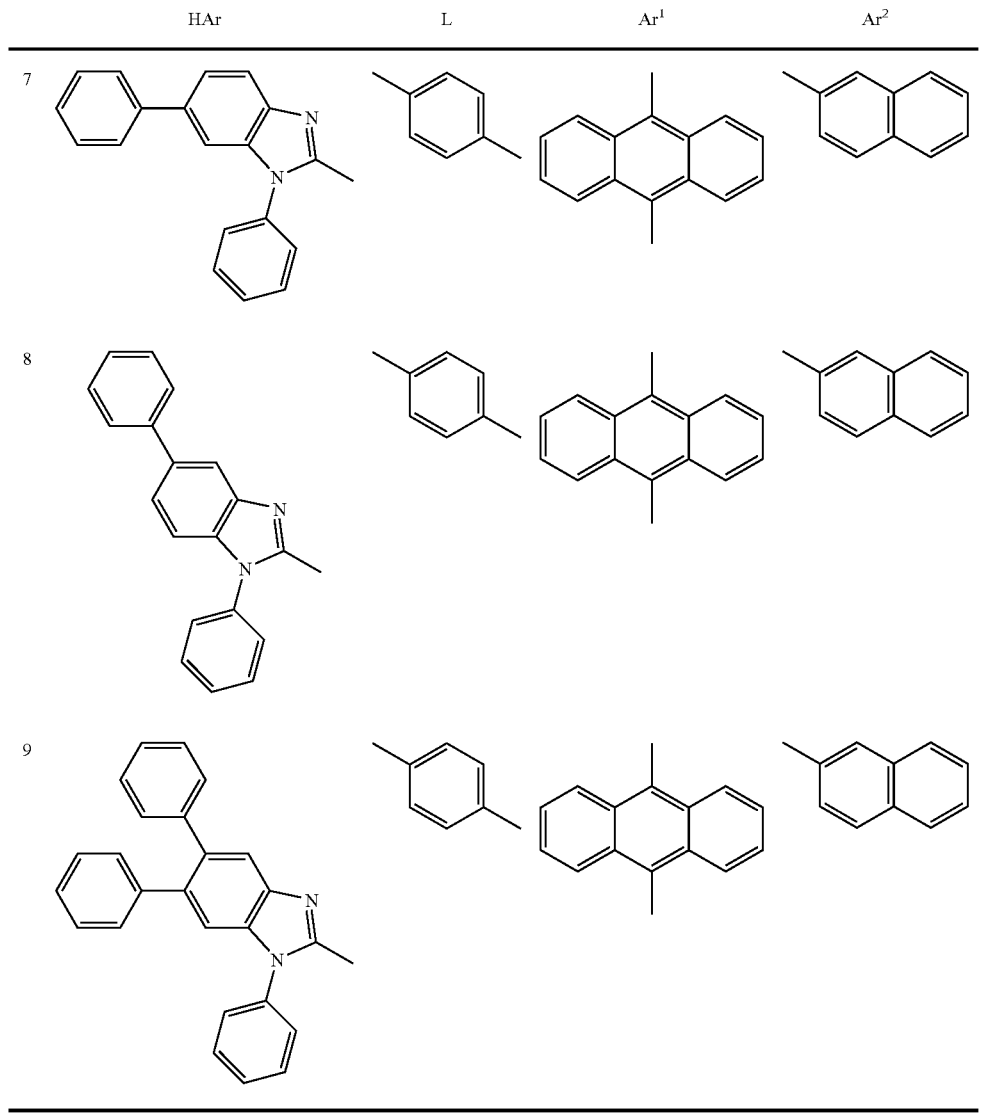
| HAr | L | Ar¹ | Ar² |
|---|---|---|---|
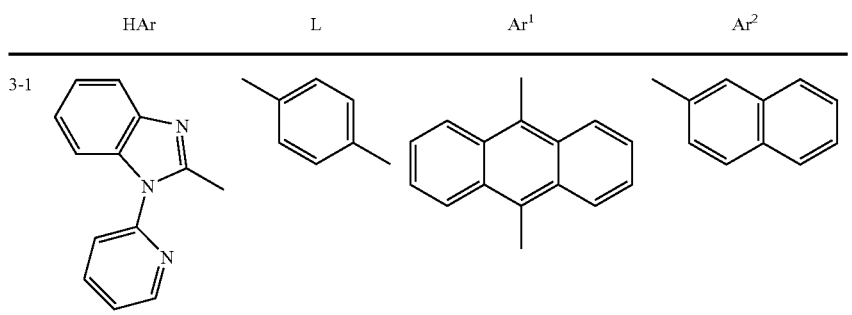

-continued

| | HAr | L | Ar¹ | Ar² |
|---|---|---|---|---|
| 2 | 2-methyl-1-(pyridin-3-yl)-1H-benzimidazole | 1,4-phenylene | 9,10-dimethylanthracene-linked | 2-naphthyl |
| 3 | 2-methyl-1-(pyridin-4-yl)-1H-benzimidazole | 1,4-phenylene | 9,10-dimethylanthracene-linked | 2-naphthyl |
| 4 | 2-methyl-1-(quinolin-8-yl)-1H-benzimidazole | 1,4-phenylene | 9,10-dimethylanthracene-linked | 2-naphthyl |
| 5 | 2-methyl-1-(quinolin-2-yl)-1H-benzimidazole | 1,4-phenylene | 9,10-dimethylanthracene-linked | 2-naphthyl |
| 6 | 2-methyl-1-(quinolin-3-yl)-1H-benzimidazole | 1,4-phenylene | 9,10-dimethylanthracene-linked | 2-naphthyl |

| HAr | L | Ar¹ | Ar² |
|---|---|---|---|
| 4-1 (1-phenyl-2-methyl-benzimidazole) | — | 9,10-dimethylanthracene | 2-methylnaphthalene |
| 2 | 1,3-phenylene (dimethyl) | 9,10-dimethylanthracene | 2-methylnaphthalene |
| 3 | 1,2-phenylene (dimethyl) | 9,10-dimethylanthracene | 2-methylnaphthalene |
| 4 | 2,5-pyridylene (dimethyl) | 9,10-dimethylanthracene | 2-methylnaphthalene |
| 5 | 2,6-pyridylene (dimethyl) | 9,10-dimethylanthracene | 2-methylnaphthalene |
| 6 | 3,5-pyridylene (dimethyl) | 9,10-dimethylanthracene | 2-methylnaphthalene |

-continued
| | HAr | L | Ar¹ | Ar² |
|---|---|---|---|---|
| 7 | 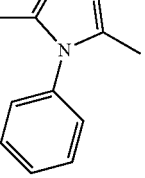 | 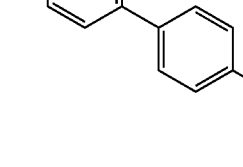 | 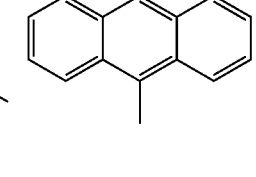 | 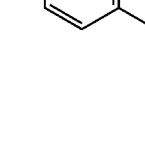 |
| 8 | 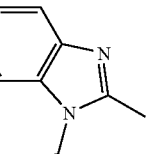 | 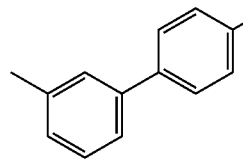 | 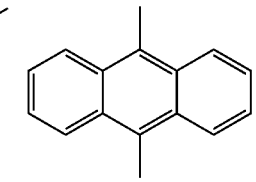 | 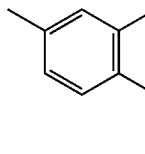 |
| 9 | 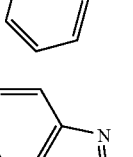 | 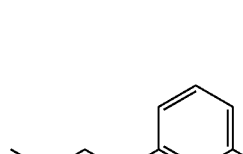 | 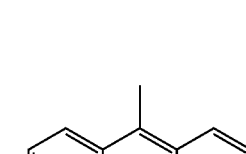 | 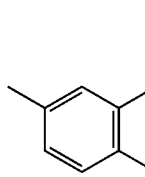 |
| 10 | 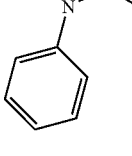 | 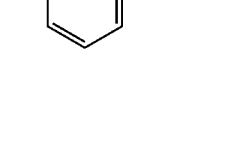 | 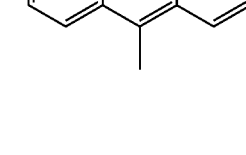 |  |
| 11 | 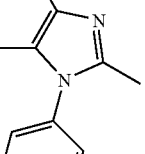 | 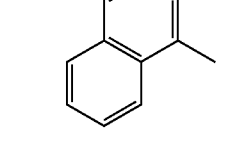 | 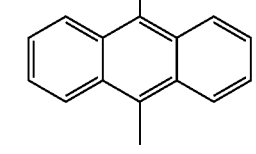 | 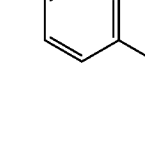 |
| 12 | 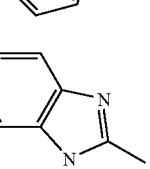 | 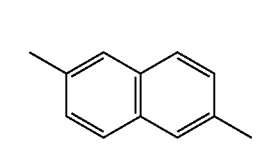 | 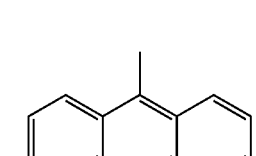 | 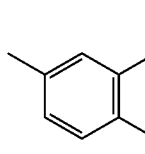 |

| | HAr | L | Ar¹ | Ar² |
|---|---|---|---|---|
| 5-1 | 1-phenyl-2-methylbenzimidazole | 1,4-phenylene | 9,10-dimethyl-2-methylanthracene | 2-naphthyl |
| 2 | 1-phenyl-2-methylbenzimidazole | 1,4-phenylene | 9,10-dimethyl-2-tert-butylanthracene | 2-naphthyl |
| 3 | 1-phenyl-2-methylbenzimidazole | 1,4-phenylene | 9,10-dimethyl-2-phenylanthracene | 2-naphthyl |
| 4 | 1-phenyl-2-methylbenzimidazole | 1,4-phenylene | 2,6,9,10-tetramethylanthracene | 2-naphthyl |
| 5 | 1-phenyl-2-methylbenzimidazole | 1,4-phenylene | 2,6-di-tert-butyl-9,10-dimethylanthracene | 2-naphthyl |
| 6 | 1-phenyl-2-methylbenzimidazole | 1,4-phenylene | 2,6-diphenyl-9,10-dimethylanthracene | 2-naphthyl |

| | HAr | L | Ar¹ | Ar² |
|---|---|---|---|---|
| 6-1 | 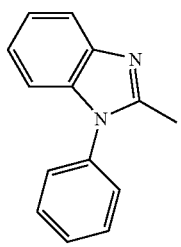 | 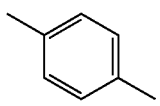 | 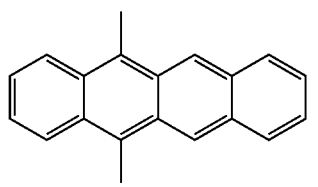 | 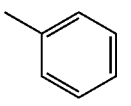 |
| 2 | 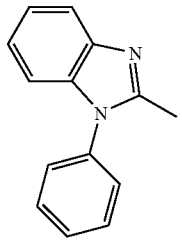 | 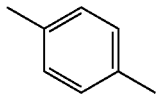 | 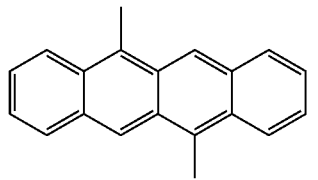 | 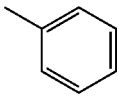 |
| 3 | 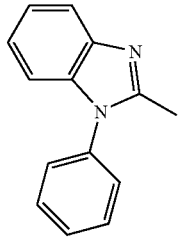 | 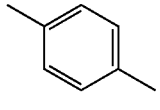 | 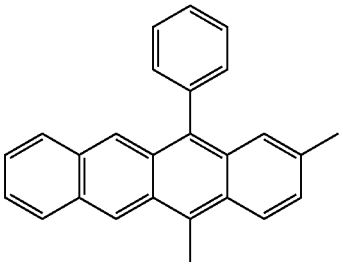 | 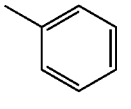 |
| 4 | 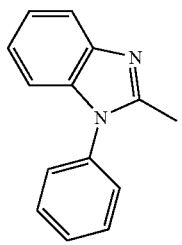 | 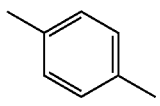 | 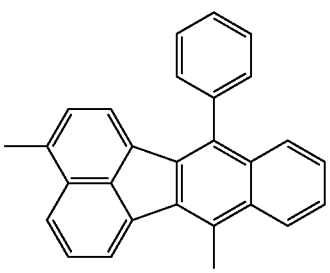 | 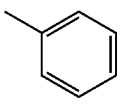 |
| 5 | 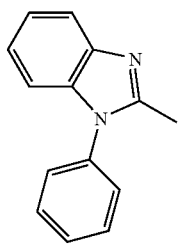 | 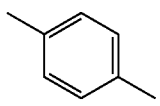 | 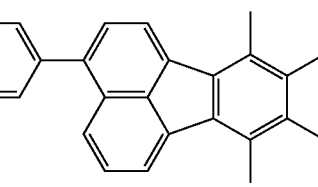 | 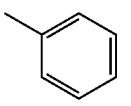 |

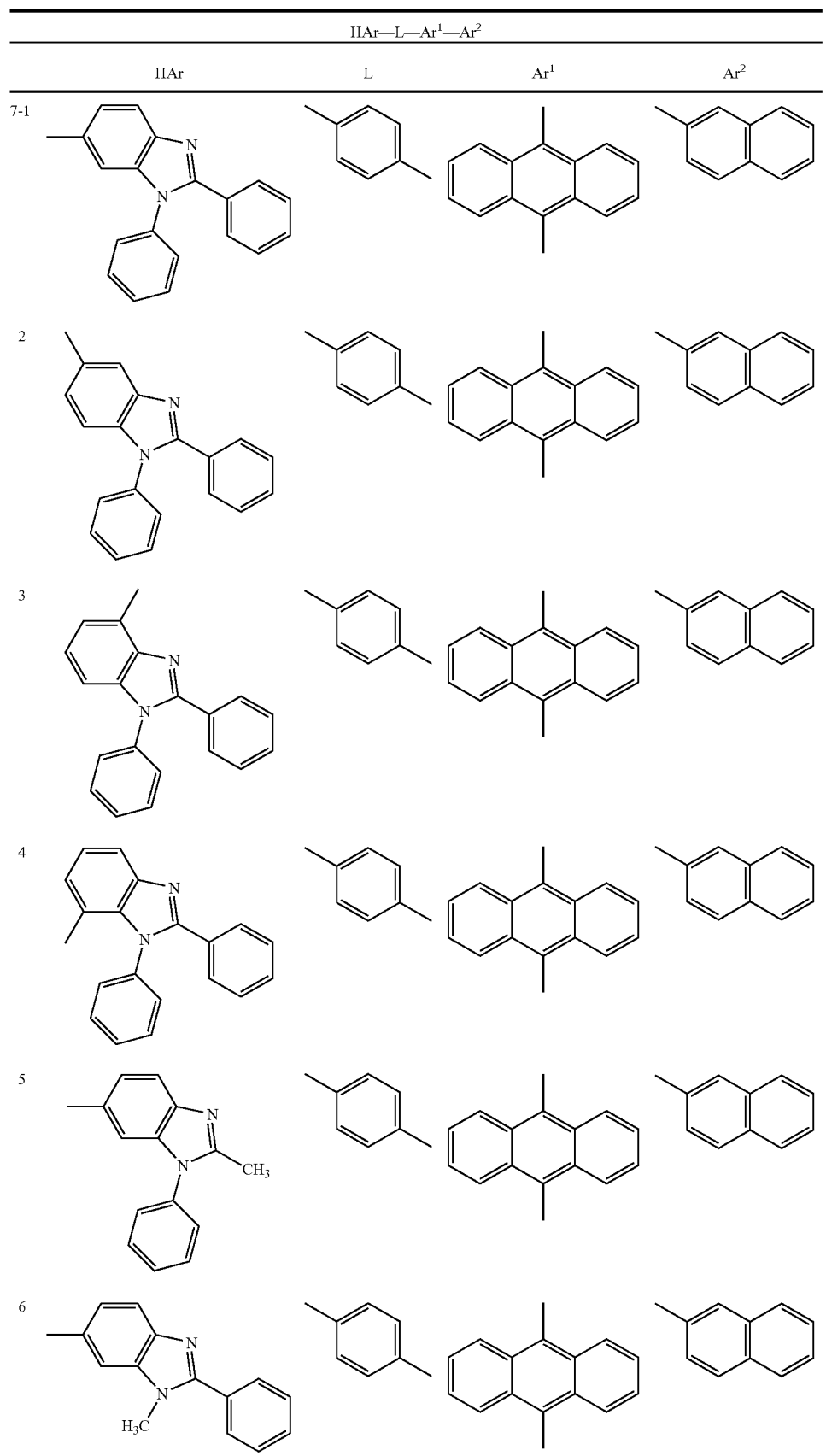

-continued
| | HAr—L—Ar¹—Ar² | | | |
|---|---|---|---|---|
| | HAr | L | Ar¹ | Ar² |
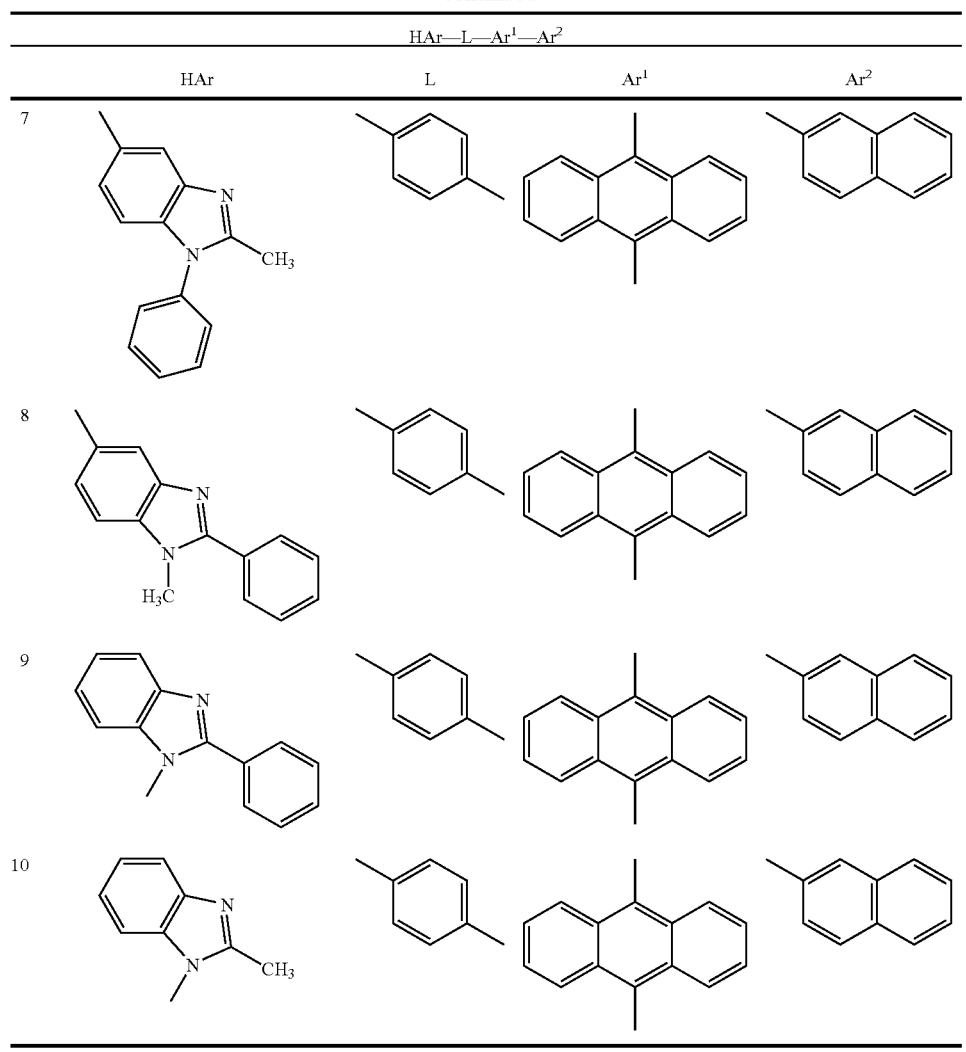
| | HAr—L—Ar¹—Ar² | | | |
|---|---|---|---|---|
| | HAr | L | Ar¹ | Ar² |
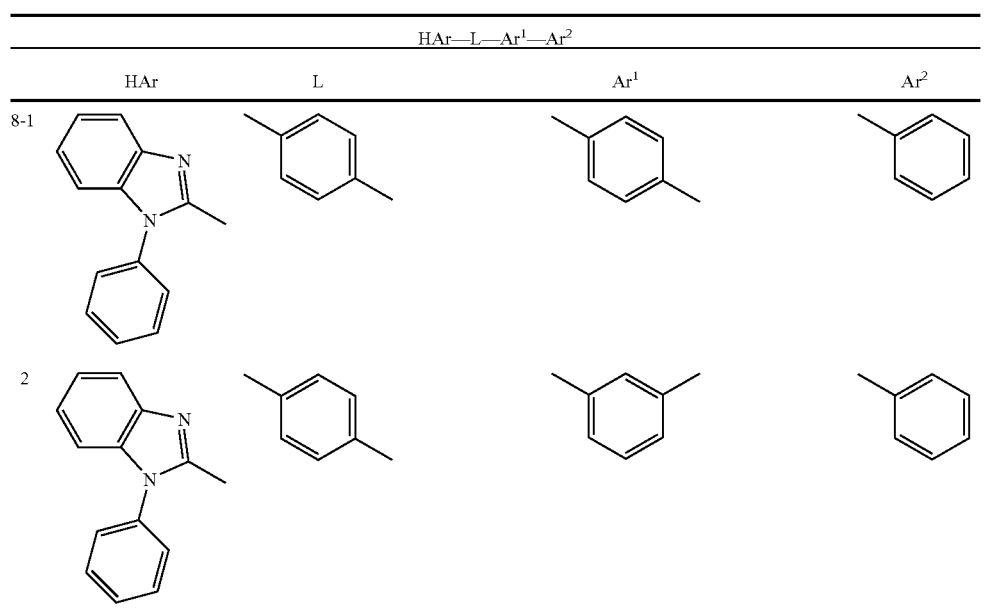

-continued
| | HAr | L | Ar¹ | Ar² |
|---|---|---|---|---|
| 3 | 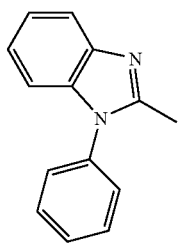 | 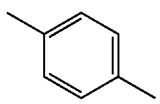 | 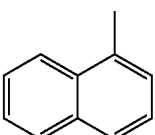 | 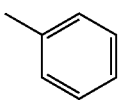 |
| 4 | 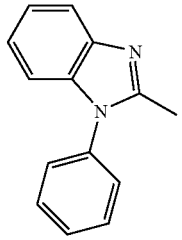 | 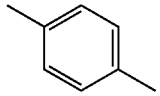 | 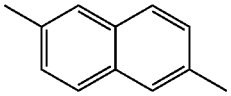 | 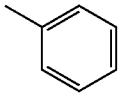 |
| 5 | 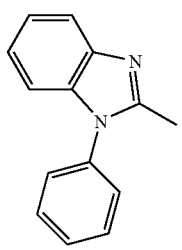 | 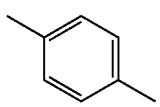 | 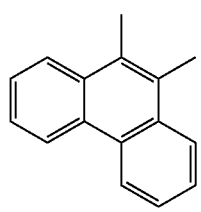 | 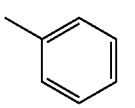 |
| 6 | 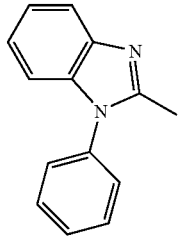 | 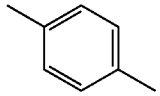 | 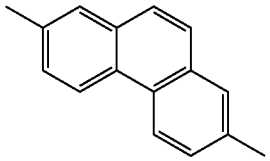 | 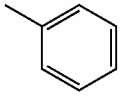 |
| 7 | 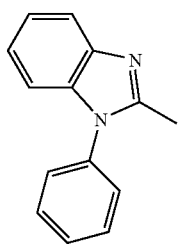 | 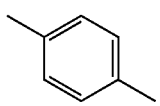 | 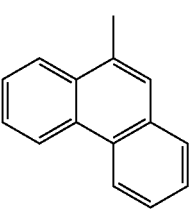 | —H |
| 8 |  | 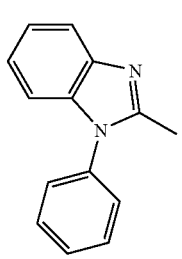 | 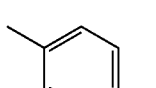 | 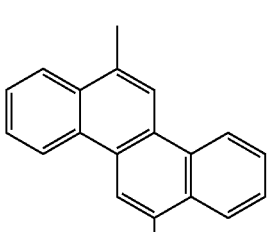 |

US 8,330,350 B2
93                                                                      94
-continued
| | HAr—L—Ar¹—Ar² | | | |
|---|---|---|---|---|
| | HAr | L | Ar¹ | Ar² |
| 9 | 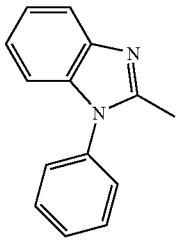 | 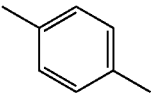 | 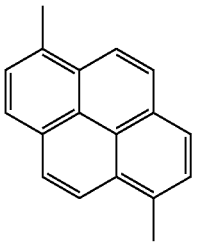 |  |
| 10 | 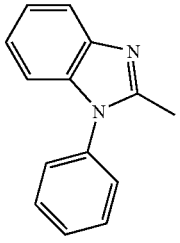 | 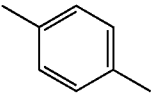 | 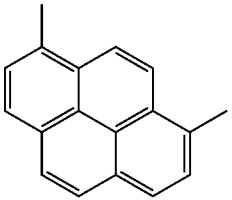 |  |
| 11 | 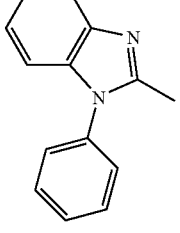 | 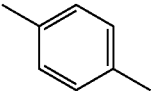 | 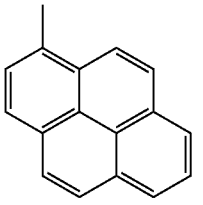 |  H |
| 12 | 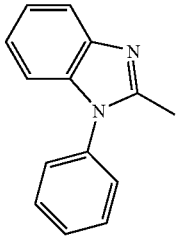 | 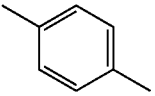 | 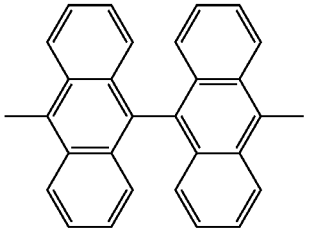 |  |
| 13 | 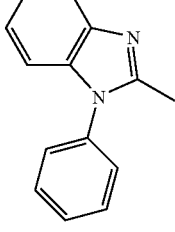 | 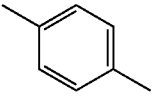 | 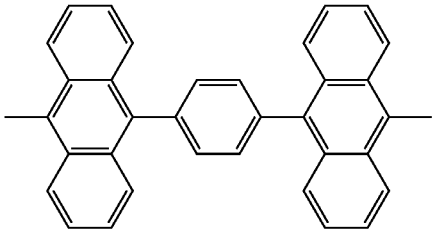 |  |

| | HAr | L | Ar¹ | Ar² |
|---|---|---|---|---|
| 9-1 | | | | |
| 2 | | | | |
| 3 | | | | |
| 4 | | | | |
| 5 | | | | |
| 6 | | | | |
| 7 | | | | |

-continued

| | HAr | L | Ar¹ | Ar² |
|---|---|---|---|---|
| 8 | 1-methyl-2-phenylbenzimidazole | p-phenylene | 9,10-anthracenyl | phenanthrenyl |
| 9 | 1-methyl-2-phenylbenzimidazole | p-phenylene | 9,10-anthracenyl | fluoranthenyl |
| 10 | 1-methyl-2-phenylbenzimidazole | p-phenylene | 9,10-anthracenyl | pyrenyl |
| 11 | 1-methyl-2-phenylbenzimidazole | p-phenylene | 9,10-anthracenyl | 9,9-dimethylfluorenyl |
| 12 | 1-methyl-2-phenylbenzimidazole | p-phenylene | 9,10-anthracenyl | 2-pyridyl |
| 13 | 1-methyl-2-phenylbenzimidazole | p-phenylene | 9,10-anthracenyl | 3-pyridyl |
| 14 | 1-methyl-2-phenylbenzimidazole | p-phenylene | 9,10-anthracenyl | 4-pyridyl |

|  | HAr—L—Ar¹—Ar² | | | |
|---|---|---|---|---|
|  | HAr | L | Ar¹ | Ar² |
| 10-1 | 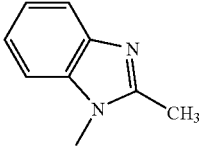 | 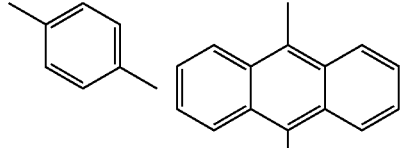 | 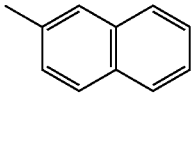 | 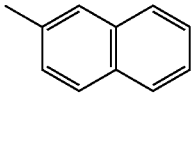 |
| 2 | 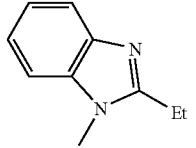 | 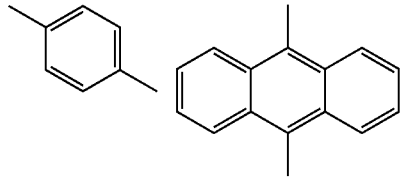 | 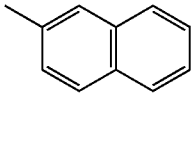 | 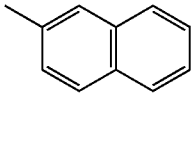 |
| 3 | 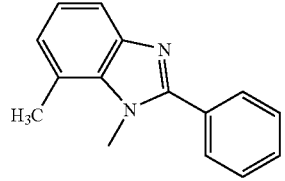 | 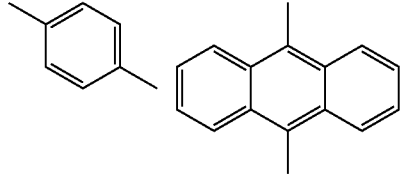 | 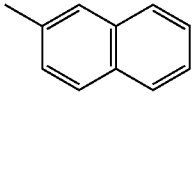 | 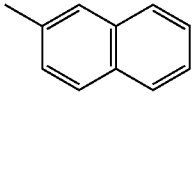 |
| 4 | 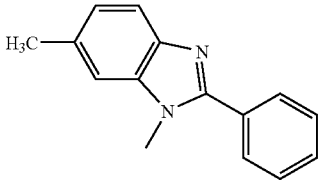 | 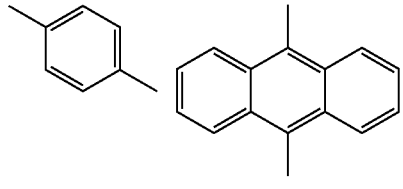 | 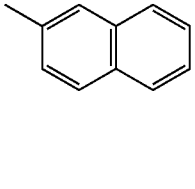 | 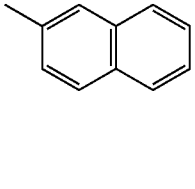 |
| 5 | 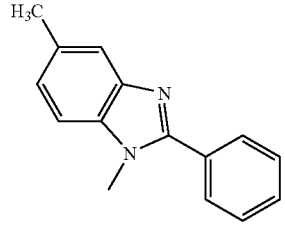 | 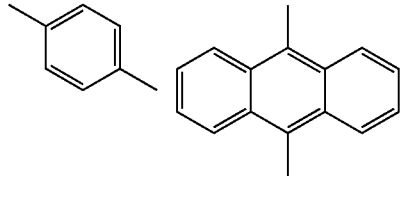 | 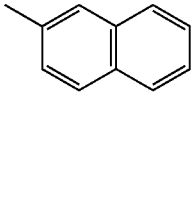 | 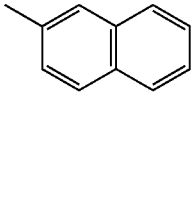 |
| 6 | 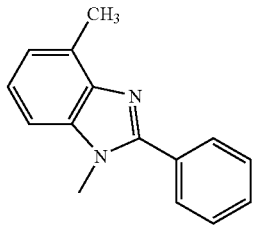 | 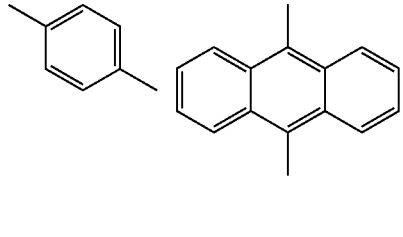 | 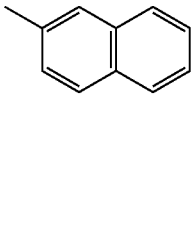 | 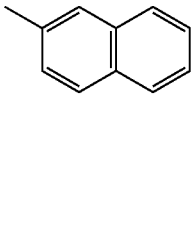 |
| 7 | 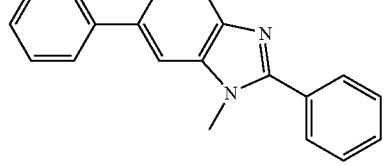 | 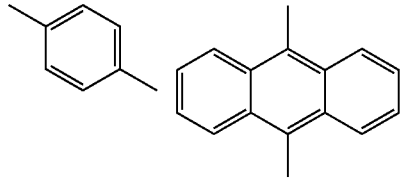 | 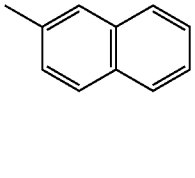 | 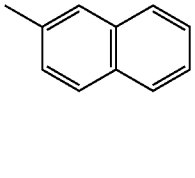 |

-continued
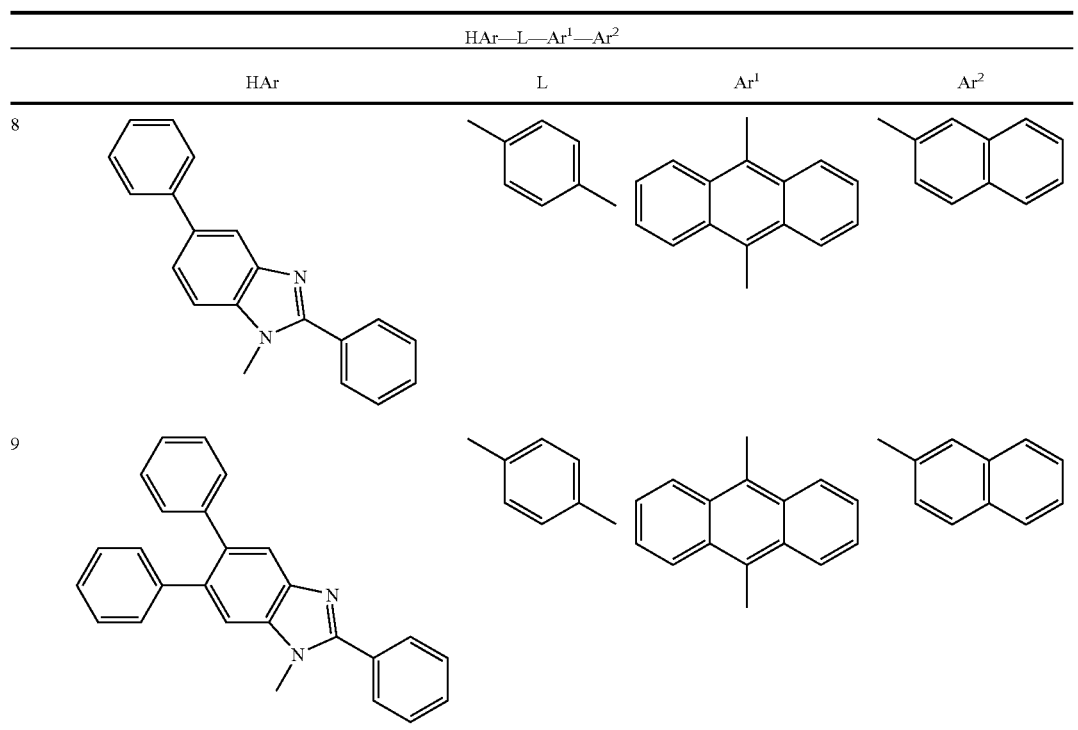
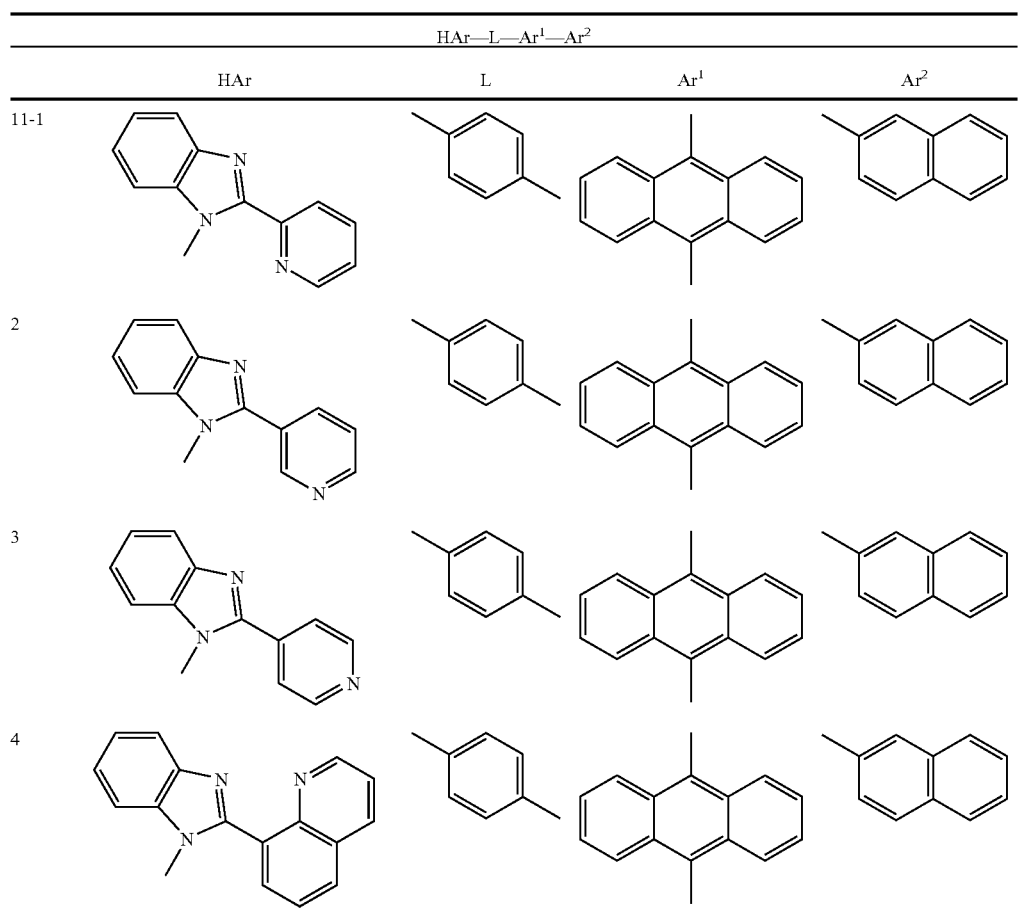

-continued
| | HAr | L | Ar¹ | Ar² |
|---|---|---|---|---|
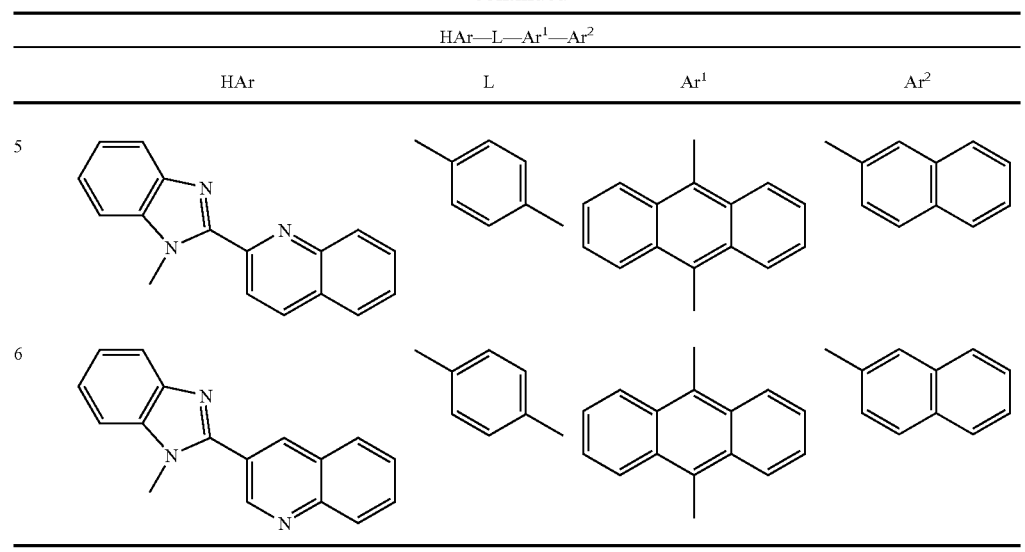
| | HAr | L | Ar¹ | Ar² |
|---|---|---|---|---|
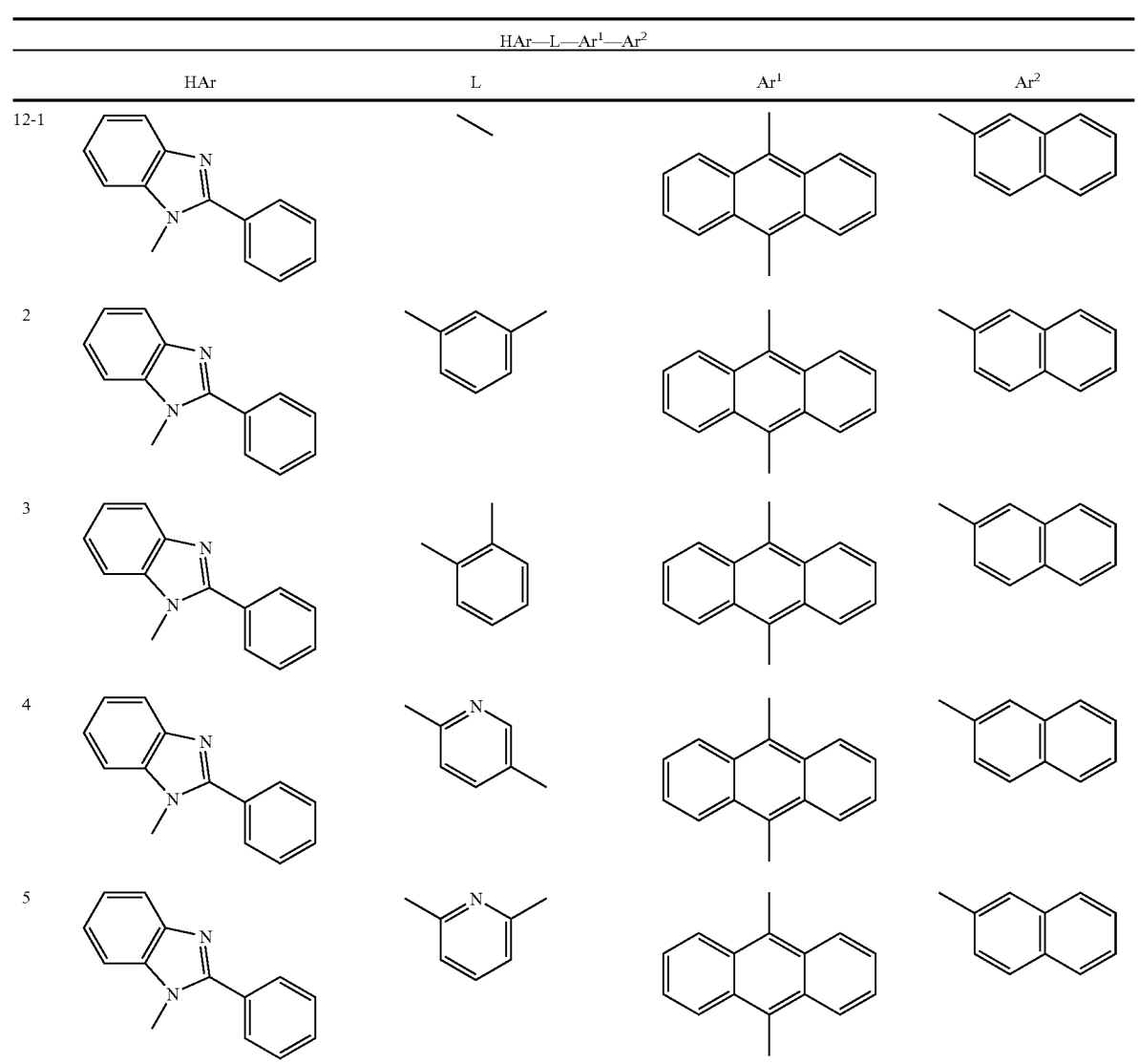

-continued
| | HAr | L | Ar¹ | Ar² |
|---|---|---|---|---|
| 6 | 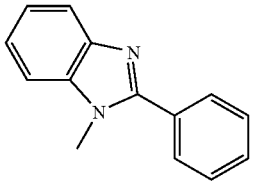 | 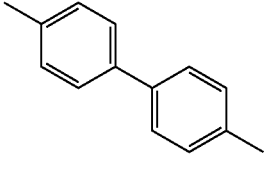 | 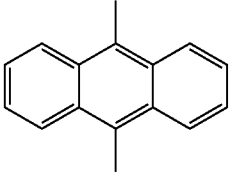 | 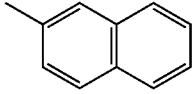 |
| 7 | 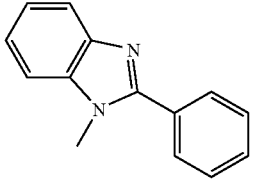 | 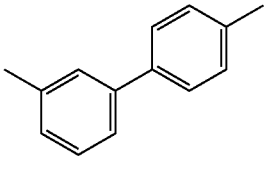 | 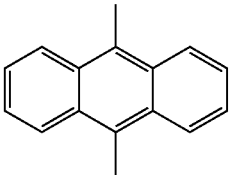 | 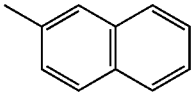 |
| 8 | 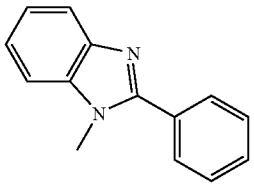 | 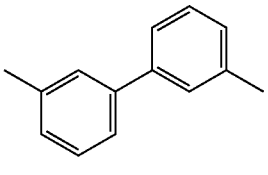 | 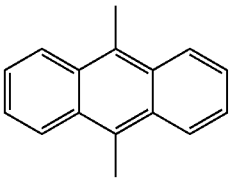 | 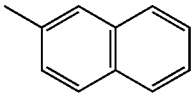 |
| 9 | 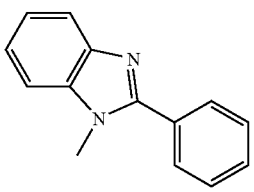 | 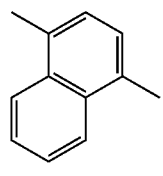 | 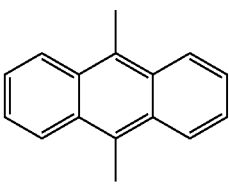 | 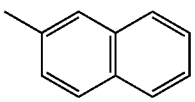 |
| 10 | 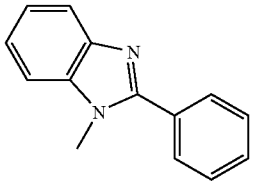 | 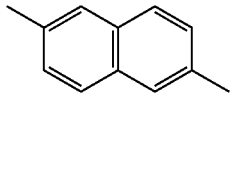 | 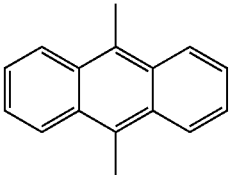 | 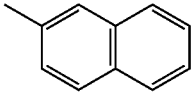 |
| 11 | 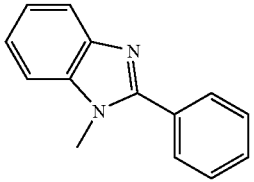 | 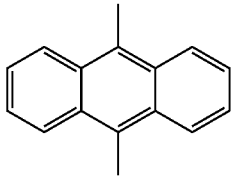 | 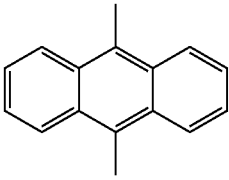 | 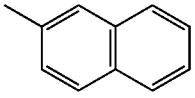 |

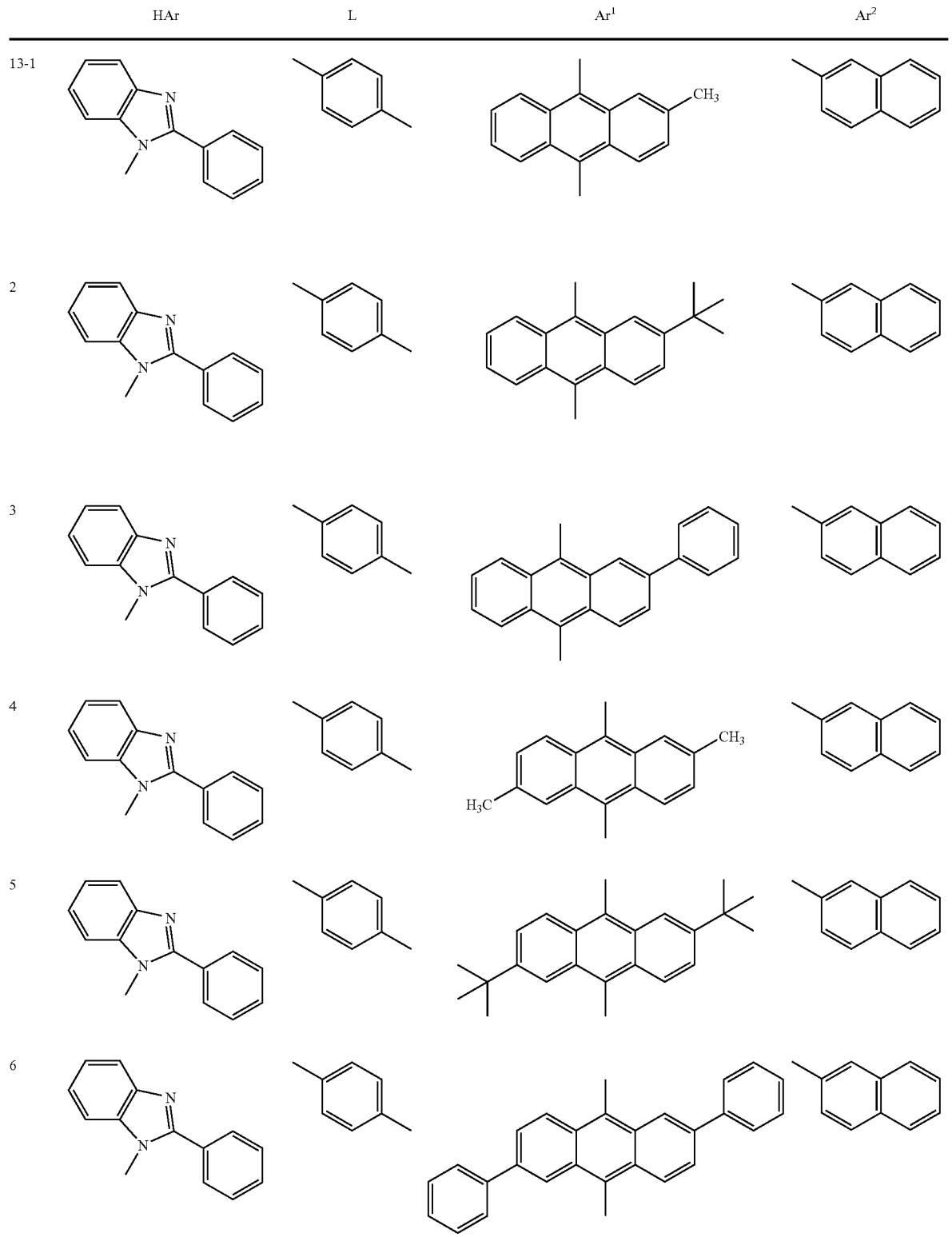

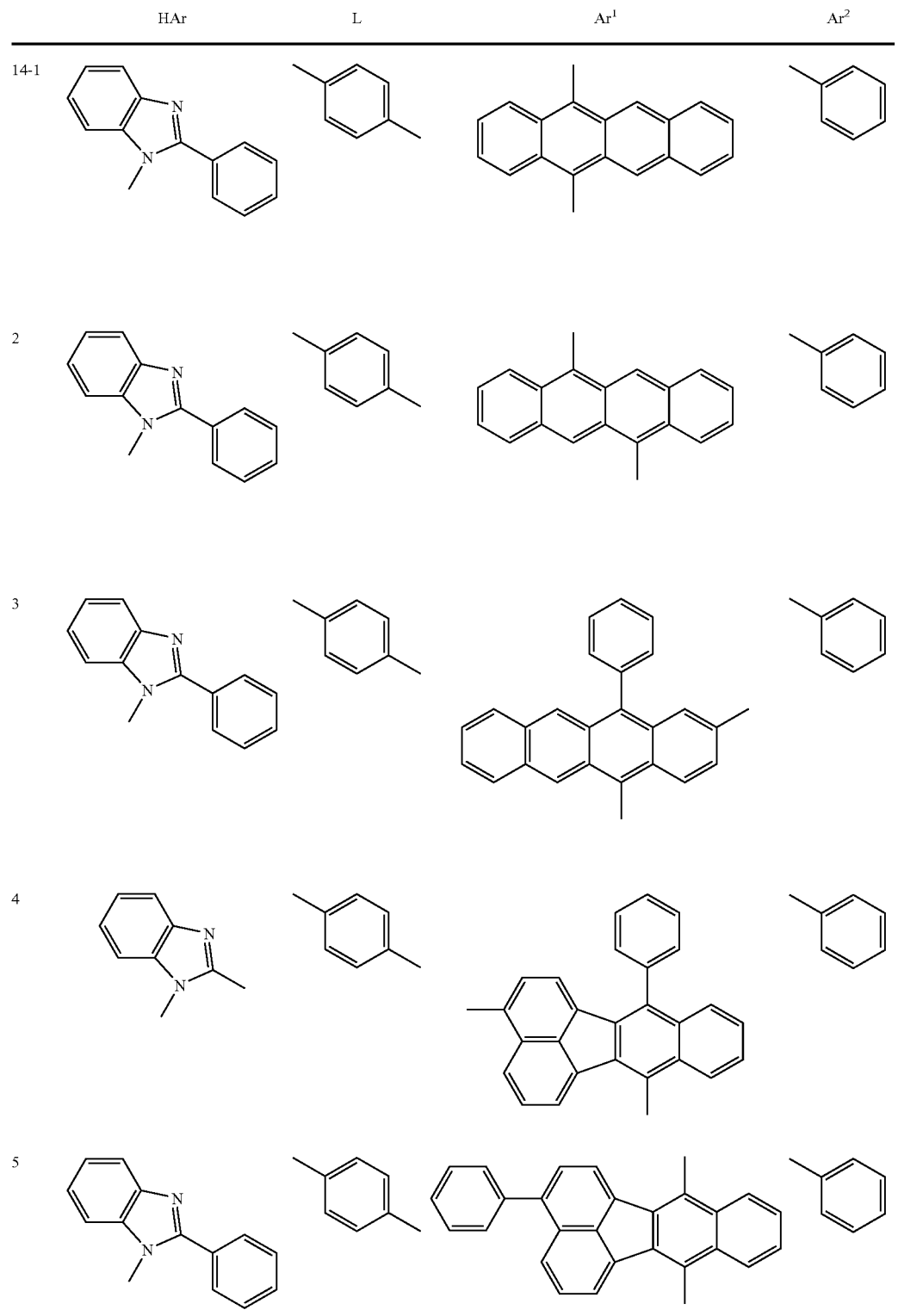

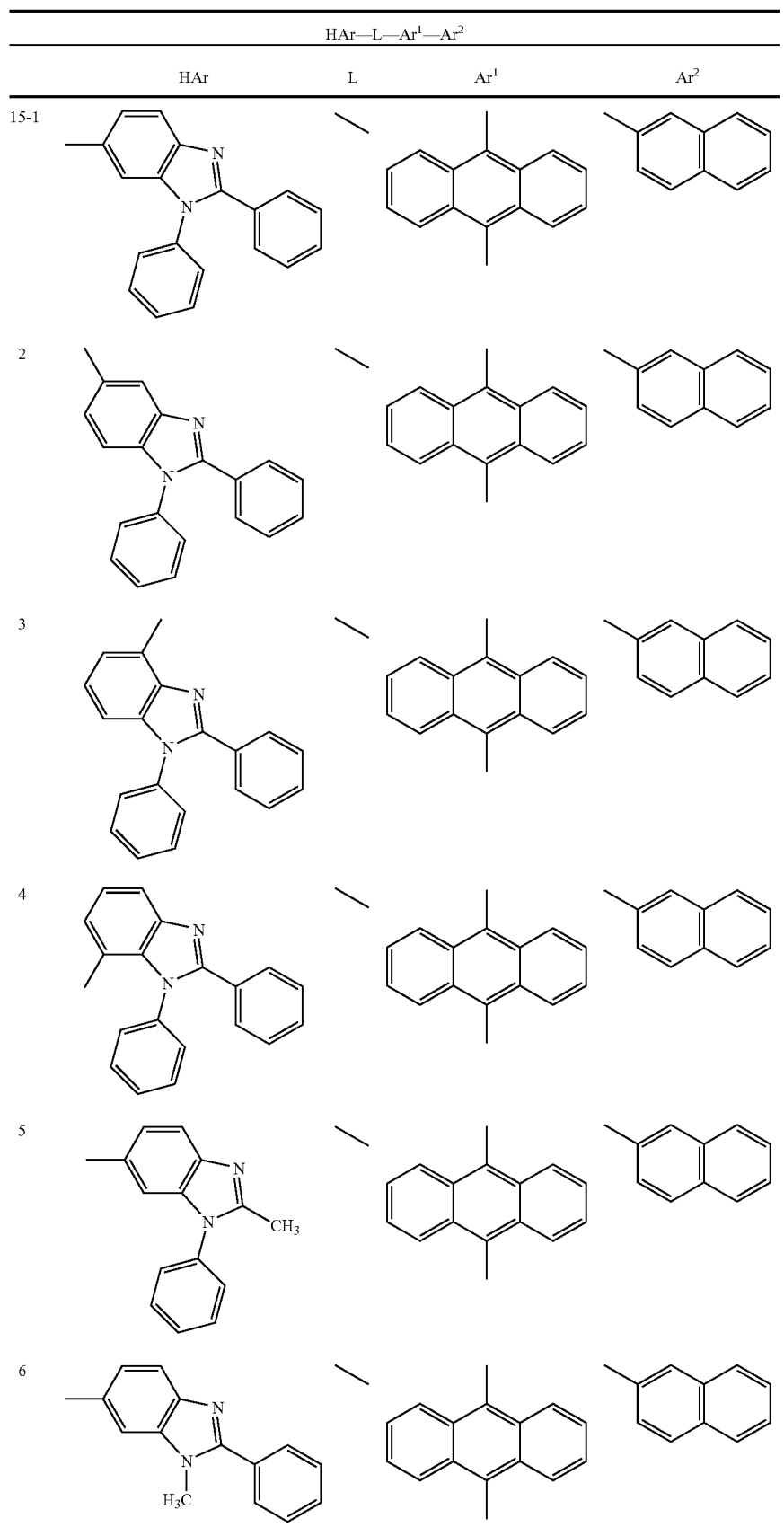

-continued
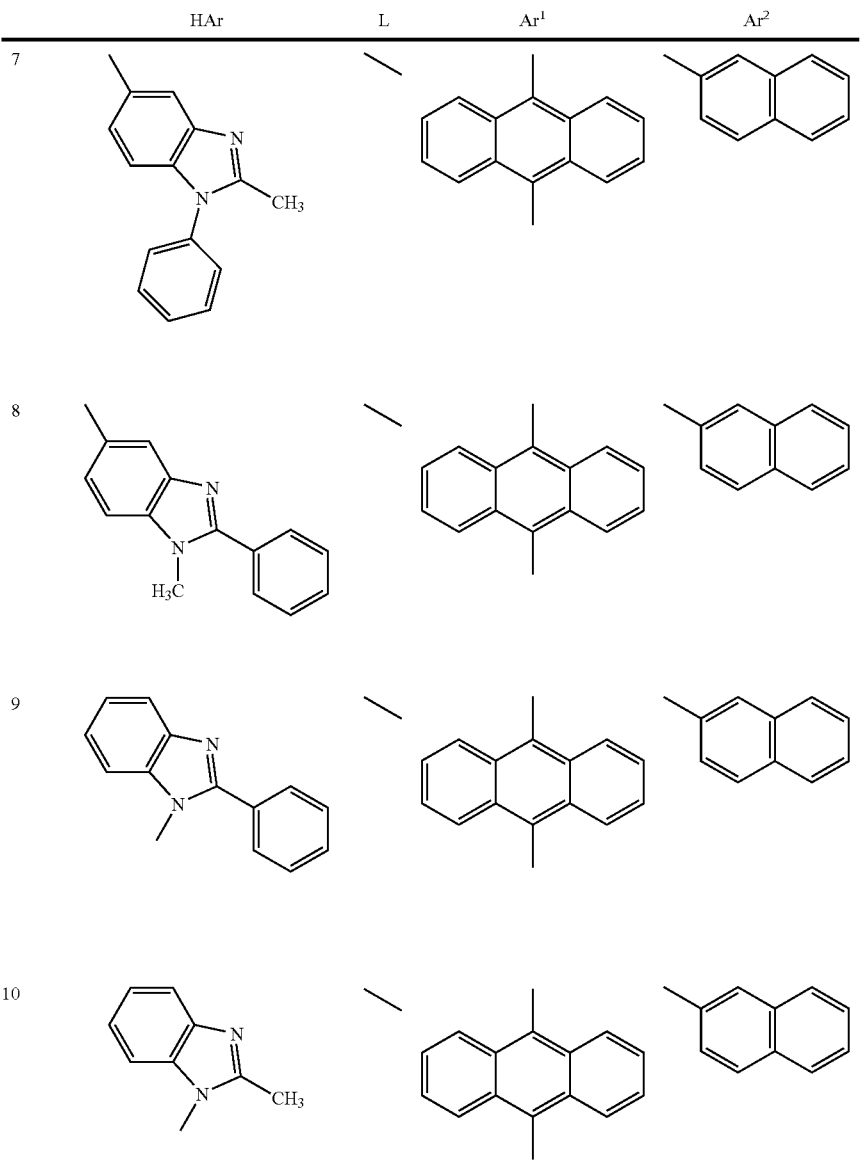
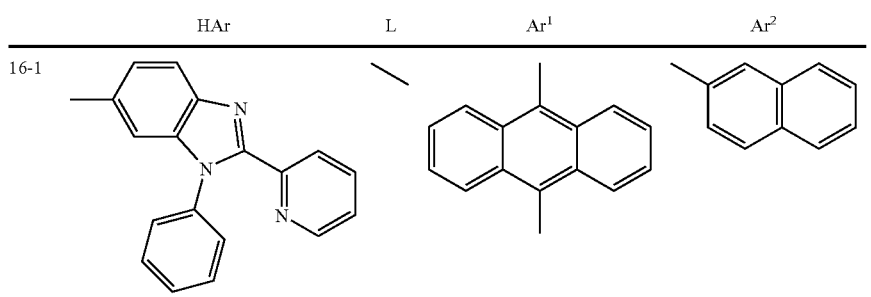

-continued

| | HAr | L | Ar¹ | Ar² |
|---|---|---|---|---|
| | HAr—L—Ar¹—Ar² | | | |

2, 3, 4, 5, 6, 7 — structural entries (benzimidazole derivatives, anthracene, naphthalene)

-continued
| | HAr | L | Ar¹ | Ar² |
|---|---|---|---|---|
| 8 | 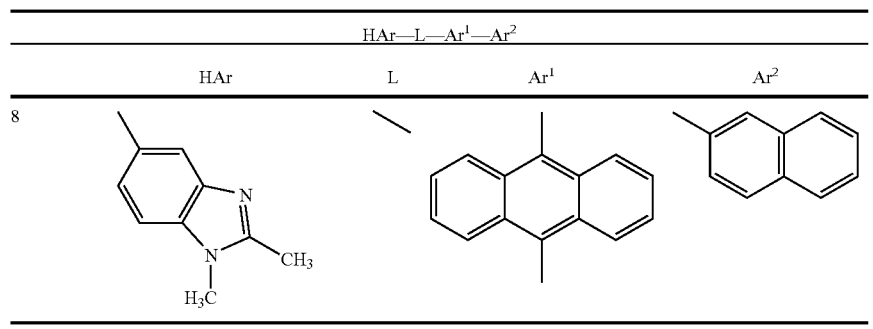 | | | |
15
| | HAr | L | Ar¹ | Ar² |
|---|---|---|---|---|
| 17-1 | | | | |
| 2 | | | | |
| 3 | | | | |
| 4 | | | | |
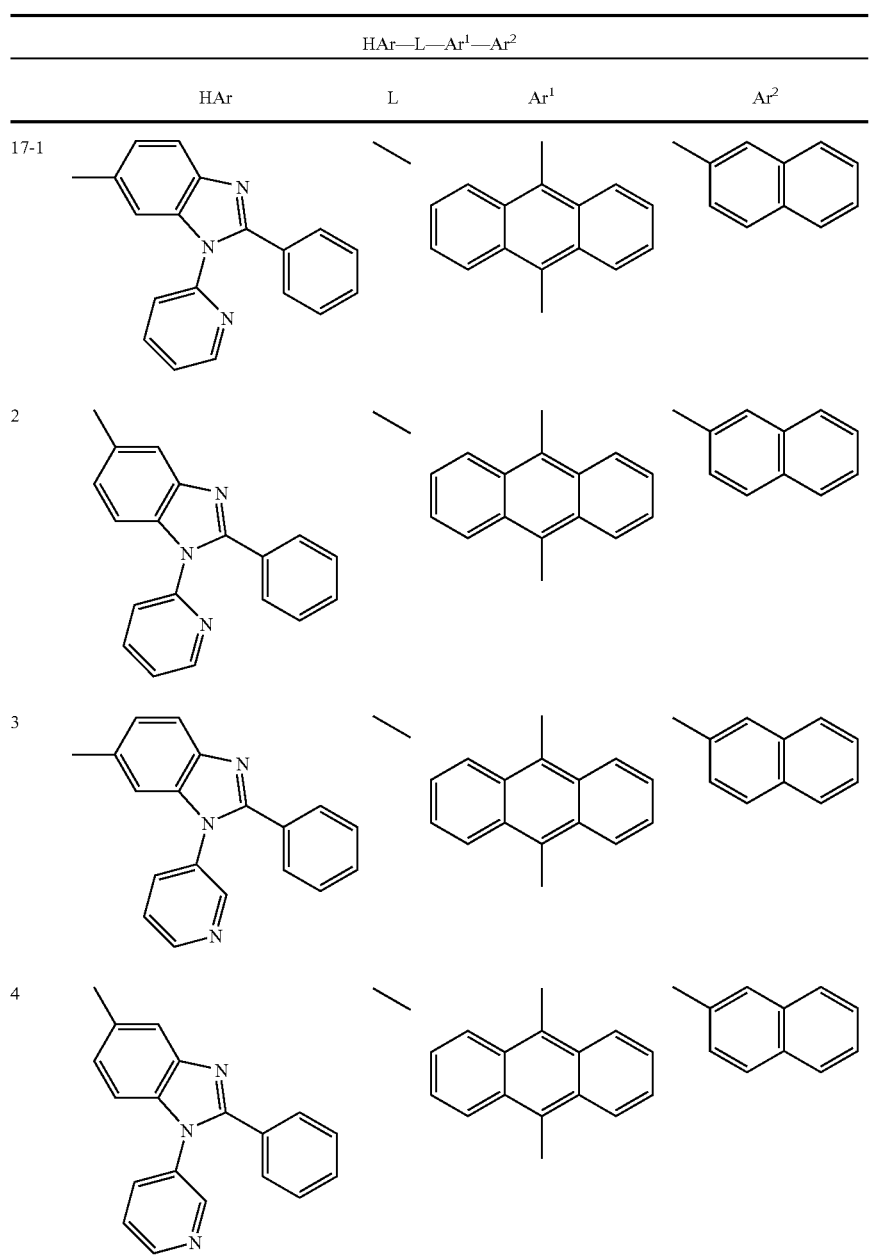

-continued

| HAr | L | Ar¹ | Ar² |
|---|---|---|---|

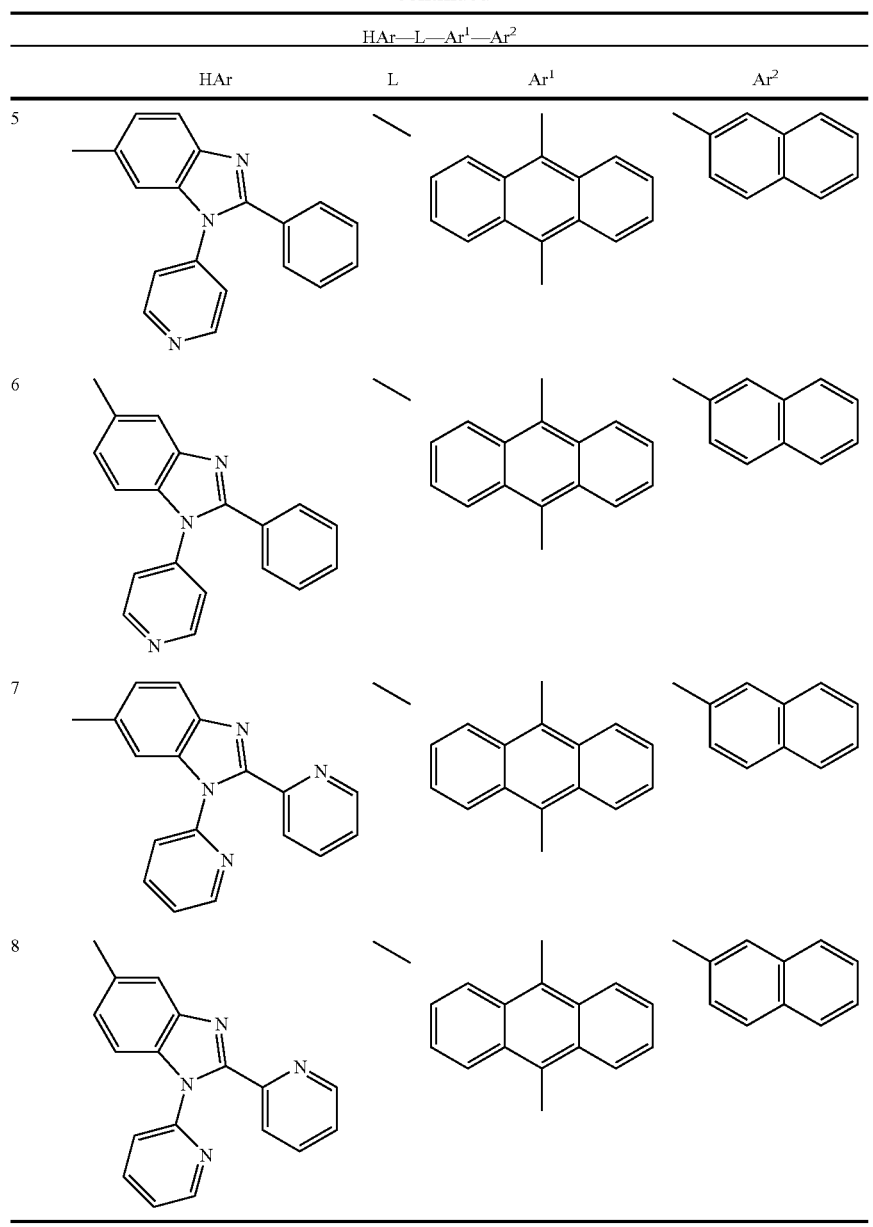

Among the above examples, (1-1), (1-5), (1-7), (2-1), (3-1), (4-2), (4-6), (7-2), (7-7), (7-8), (7-9), (9-1) and (9-7) are particularly preferred.

A film thickness of the electron injecting layer or the electron transporting layer is not specifically limited, and the thickness is preferably 1 to 100 nm.

The electron injecting layer preferably includes an inorganic compound such as an insulator or a semiconductor in addition to the nitrogen-containing cyclic derivative. The electron injecting layer including the insulator or the semiconductor can effectively prevent an electric current from leaking and enhance the electron injectability.

Preferable examples of the above insulator is at least one metal compound selected from a group consisting of alkali metal chalcogenides, alkali earth metal chalcogenides, halides of alkali metals and halides of alkali earth metals. If the electron injecting layer includes the above alkali metal chalcogenides and the like, the electron injectability can favorably further be enhanced. Specifically, the preferred alkali metal chalcogenides include, for example, $Li_2O$, $K_2O$, $Na_2S$, $Na_2Se$ and $Na_2O$, and the preferred alkali earth metal chalcogenides include, for example, CaO, BaO, SrO, BeO, BaS and CaSe. The preferred halides of alkali metals include, for example, LiF, NaF, KF, LiCl, KCl and NaCl. The preferred halides of alkali earth metals include, for example, fluorides such as $CaF_2$, $BaF_2$, $SrF_2$, $MgF_2$ and $BeF_2$ and halides other than the fluorides.

Examples of the semiconductor includes a single one of or a combination of two or more of oxides, nitrides or nitride oxides containing at least one element of Ba, Ca, Sr, Yb, Al, Ga, In, Li, Na, Cd, Mg, Si, Ta, Sb and Zn. The inorganic compound included in the electron injecting layer is preferably a microcrystalline or amorphous insulating thin film. If the electron injecting layer includes the above insulating thin film, the more homogeneous thin film is formed, thereby reducing pixel defects such as dark spots. The above inorganic compound includes the alkali metal chalcogenides, the alkali earth metal chalcogenides, the halides of alkali metals and the halides of alkali earth metals.

When the above insulator or semiconductor is used, a preferred thickness of the layer concerned is 0.1 to 15 nm. The electron injecting layer in the present invention also preferably contains the reductive dopant described above.

An aromatic amine compound, for example, an aromatic amine derivative represented by the following general Formula (I) is suitably used in the hole injecting layer or the hole transporting layer (including the hole injecting and transporting layer).

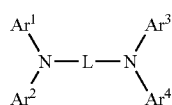 (I)

In Formula (I), $Ar^1$ to $Ar^4$ represent a substituted or non-substituted aryl group having 6 to 50 ring carbon atoms or a substituted or non-substituted heteroaryl group having 5 to 50 ring atoms.

Examples of the substituted or non-substituted aryl group having 6 to 50 ring carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl) phenyl, 3-methyl-2-naphthyl, 4-methyl-1-naphthyl, 4-methyl-1-anthryl, 4'-methylbiphenylyl, 4"-t-butyl-p-terphenyl-4-yl, fluoranthenyl, fluorenyl and the like.

Examples of the substituted or non-substituted heteroaryl group having 5 to 50 ring atoms include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthryldinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl1-indolyl, 4-t-butyl1-indolyl, 2-t-butyl3-indolyl, 4-t-butyl3-indolyl and the like. Preferable examples thereof are phenyl, naphthyl, biphenyl, anthranyl, phenanthryl, pyrenyl, chrysenyl, fluoranthenyl, fluorenyl and the like.

L is a linkage group. Specifically, the linkage group is a substituted or non-substituted arylene group having 6 to 50 ring carbon atoms, a substituted or non-substituted heteroarylene group having 5 to 50 ring atoms or a divalent group obtained by combining two or more arylene groups or heteroarylene groups via a single bond, an ether bond, a thioether bond, an alkylene group having 1 to 20 carbon atoms, an alkenylene group having 2 to 20 carbon atoms or an amino group. The arylene group having 6 to 50 ring carbon atoms includes, for example, 1,4-phenylene, 1,2-phenylene, 1,3-phenylene, 1,4-naphthylene, 2,6-naphthylene, 1,5-naphthylene, 9,10-anthranylene, 9,10-phenanthrenylene, 3,6-phenanthrenylene, 1,6-pyrenylene, 2,7-pyrenylene, 6,12-chrysenylene, 4,4'-biphenylene, 3,3'-biphenylene, 2,2'-biphenylene, 2,7-fluorenylene and the like. The arylene group having 5 to 50 ring atoms includes, for example, 2,5-thiophenylene, 2,5-silolylene, 2,5-oxadiazolylene and the like. Preferable examples thereof are 1,4-phenylene, 1,2-phenylene, 1,3-phenylene, 1,4-naphthylene, 9,10-anthranylene, 6,12-chrysenylene, 4,4'-biphenylene, 3,3'-biphenylene, 2,2'-biphenylene and 2,7-fluorenylene.

When L is a linkage group including two or more arylene groups or heteroarylene groups, the adjacent arylene groups or heteroarylene groups may be combined with each other via a divalent group to form a new ring. The examples of the divalent group forming the ring include tetramethylene, pentamethylene, hexamethylene, diphenylmethane-2,2'-diyl, diphenylethane-3,3'-diyl, diphenylpropane-4,4'-diyl and the like.

Substituents for $Ar^1$ to $Ar^4$ and L are a substituted or non-substituted aryl group having 6 to 50 ring carbon atoms, a substituted or non-substituted heteroaryl group having 5 to 50 ring atoms, a substituted or non-substituted alkyl group having 1 to 50 carbon atoms, a substituted or non-substituted cycloalkyl group having 3 to 50 carbon atoms, a substituted or non-substituted alkoxy group having 1 to 50 carbon atoms, a substituted or non-substituted aralkyl group having 7 to 50 carbon atoms, a substituted or non-substituted aryloxy group having 6 to 50 ring carbon atoms, a substituted or non-substituted heteroaryloxy group having 5 to 50 ring atoms, a substituted or non-substituted arylthio group having 6 to 50 ring carbon atoms, a substituted or non-substituted heteroarylthio group having 5 to 50 ring atoms, a substituted or non-substituted alkoxycarbonyl group having 2 to 50 carbon atoms, an amino group substituted with a substituted or non-substituted aryl group having 6 to 50 ring carbon atoms or a substituted or non-substituted heteroaryl group having 5 to 50 ring carbon atoms, a halogen group, a cyano group, a nitro group a hydroxyl group and the like.

Examples of the substituted or non-substituted aryl group having 6 to 50 ring carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, fluoranthenyl, fluorenyl and the like.

Example of the substituted or non-substituted heteroaryl group having 5 to 50 ring atoms include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthryldinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl1-indolyl, 4-t-butyl1-indolyl, 2-t-butyl3-indolyl, 4-t-butyl3-indolyl and the like.

Examples of the substituted or non-substituted alkyl group having 1 to 50 carbon atoms includes methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl and the like.

Examples of the substituted or non-substituted cycloalkyl group having 3 to 50 carbon atoms include cyclopropyl, cyclobutyl, cyclopentyl, cyclohexyl, 4-methylcyclohexyl, 1-adamantyl, 2-adamantyl, 1-norbornyl, 2-norbornyl and the like.

The substituted or non-substituted alkoxy group having 1 to 50 carbon atoms is a group represented by —OY. Examples of Y include methyl, ethyl propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl and the like.

Examples of the substituted or non-substituted aralkyl group having 7 to 50 carbon atoms include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, 1-chloro-2-phenylisopropyl and the like.

The substituted or non-substituted aryloxy group having 6 to 50 ring carbon atoms is represented by —OY', and examples of Y' include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl and the like.

The substituted or non-substituted heteroaryloxy group having 5 to 50 ring atoms is represented by —OZ', and examples of Z' include 2-pyrrolyl, 3-pyrrolyl, pyrazinyl, 2-pyridinyl, 3-pyridinyl, 4-pyridinyl, 2-indolyl, 3-indolyl, 4-indolyl, 5-indonyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl. 2-t-butyl1-indolyl, 4-t-butyl1-indolyl, 2-t-butyl3-indolyl, 4-t-butyl3-indolyl and the like.

The substituted or non-substituted arylthio group having 6 to 50 ring carbon atoms is represented by —SY", and examples of Y" include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl and the like.

The substituted or non-substituted heteroarylthio group having 5 to 50 ring atoms is represented by —SZ", and examples of Z" include 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7- phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl1-indolyl, 4-t-butyl1-indolyl, 2-t-butyl3-indolyl and 4-t-butyl3-indolyl and the like.

The substituted or non-substituted alkoxylcarbonyl group having 2 to 50 carbon atoms is represented by —COOZ, and examples of Z include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl the like.

The amino group substituted with a substituted or non-substituted aryl group having 6 to 50 ring carbon atoms or a substituted or non-substituted heteroaryl group having 5 to 50 ring atoms is represented by —NPQ, and examples of P and Q include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indonyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl3-indolyl, 4-t-butyl3-indolyl and the like.

The specific examples of the compound represented by Formula (I) will be shown below but the compound represented by Formula (I) is not limited to them.

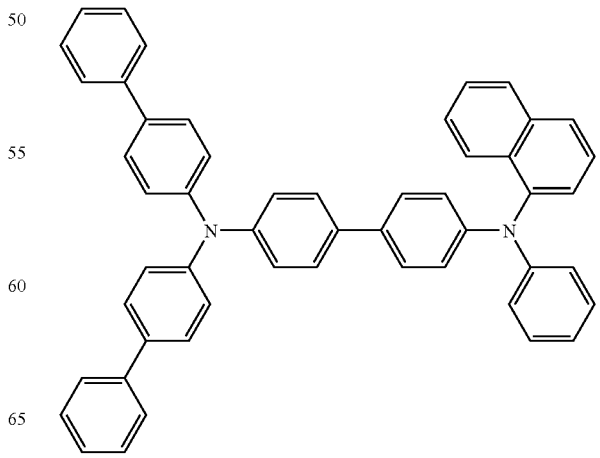

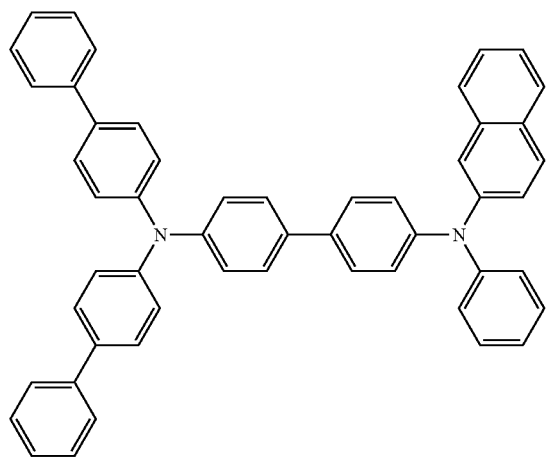
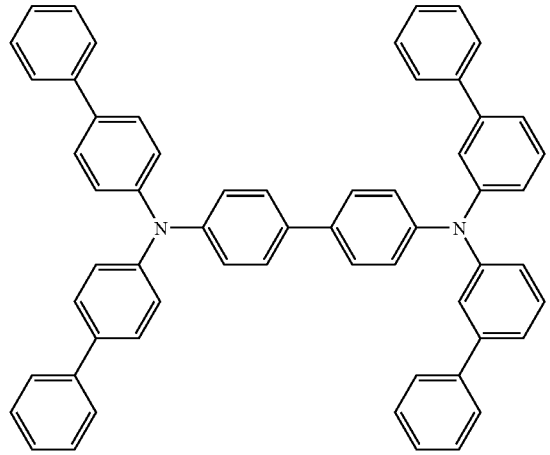
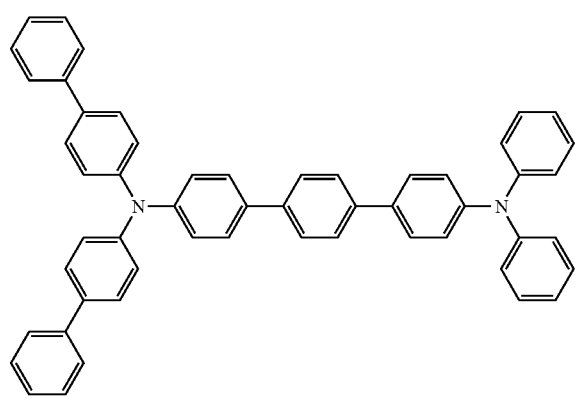
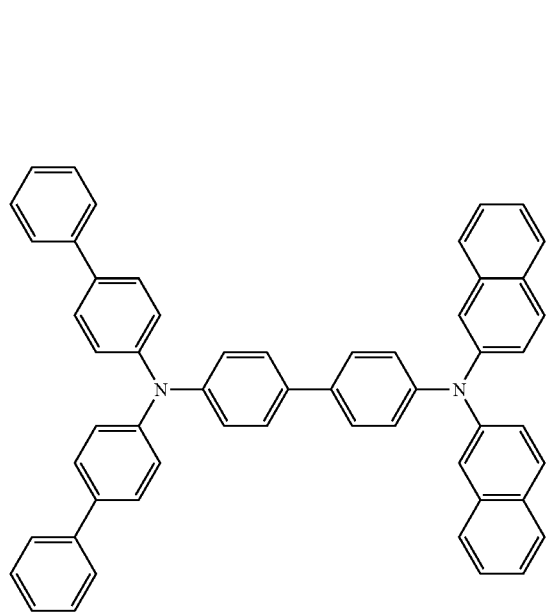
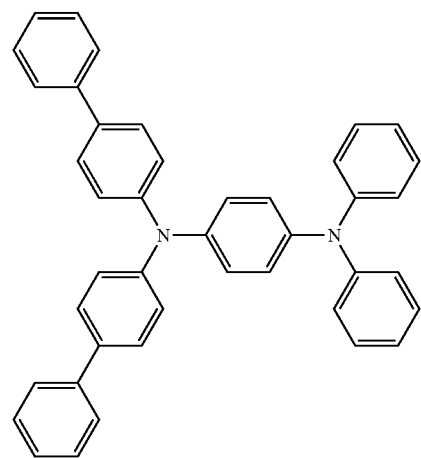
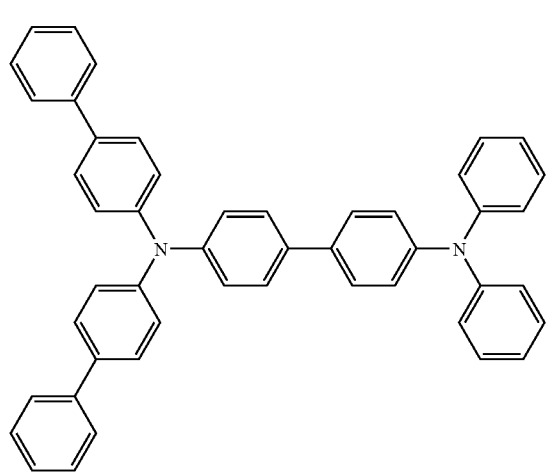

131
-continued
132
-continued
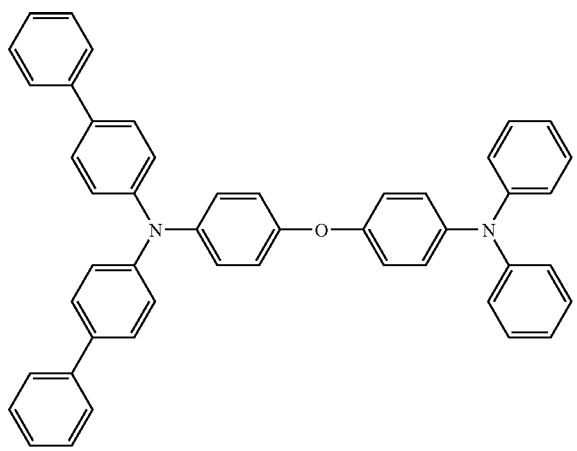
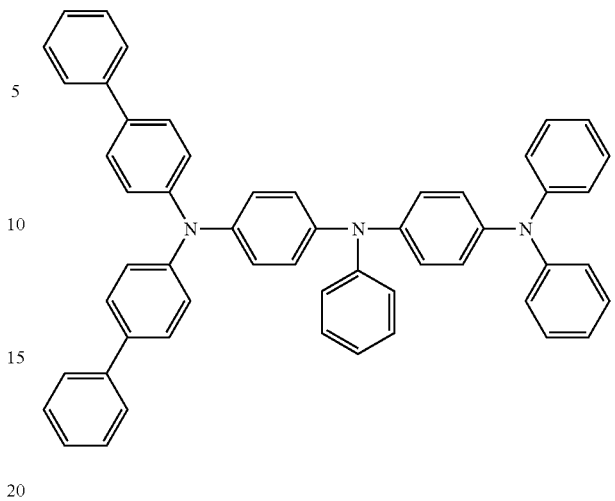
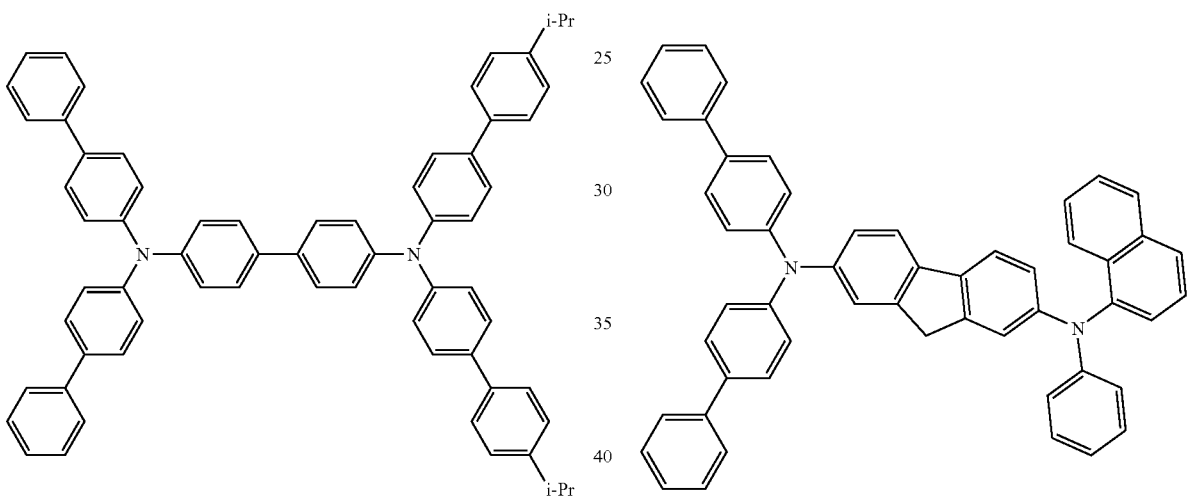
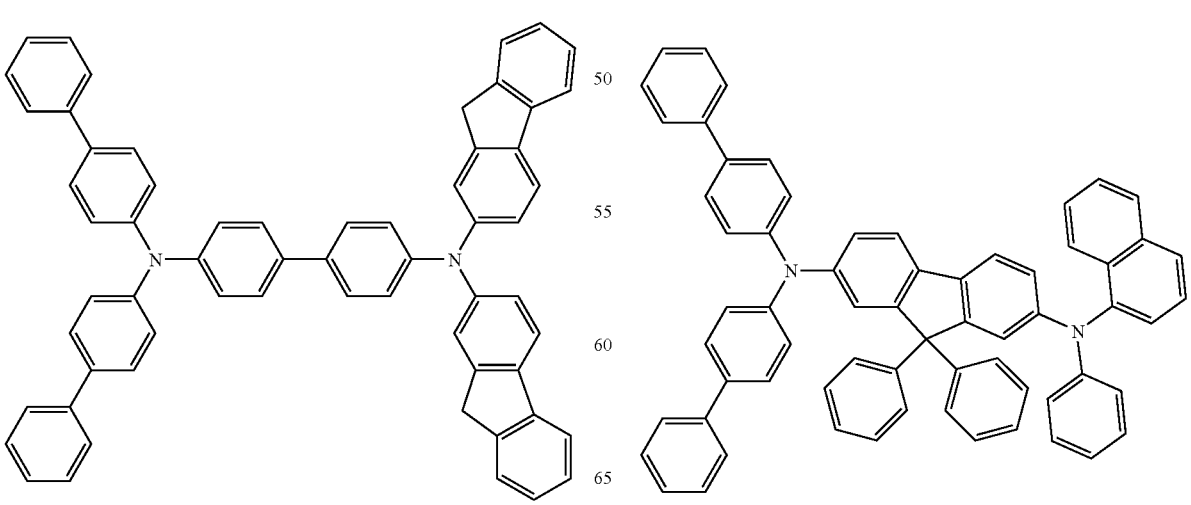

133
-continued
134
-continued
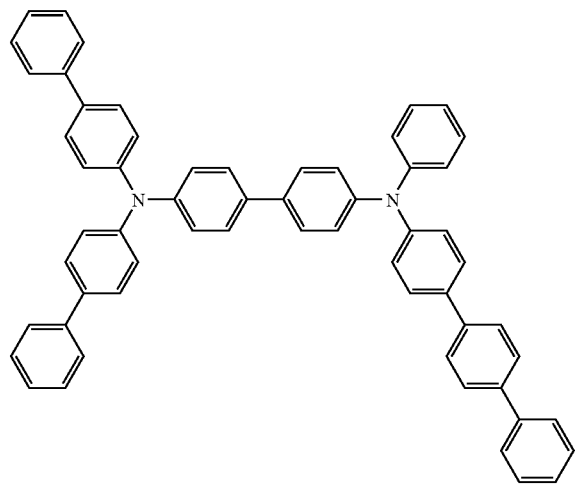
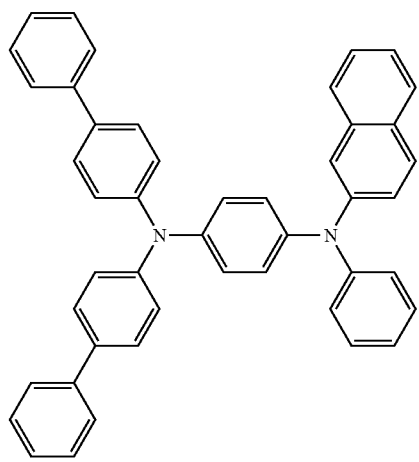
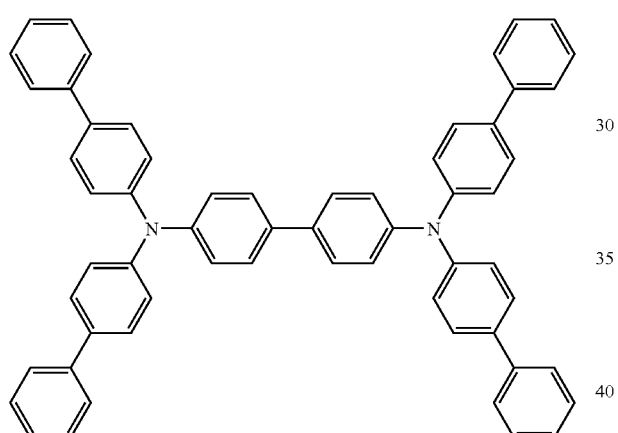
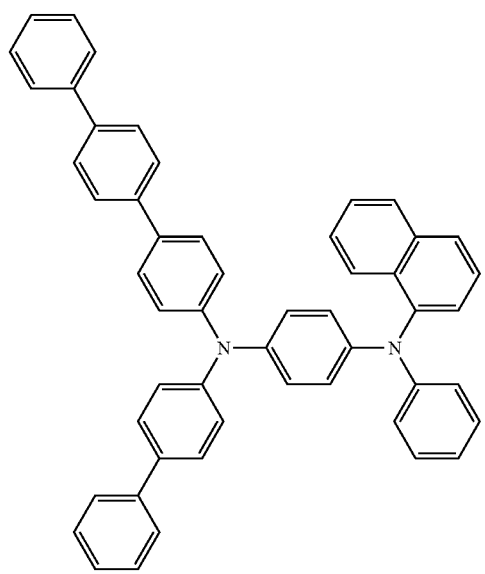
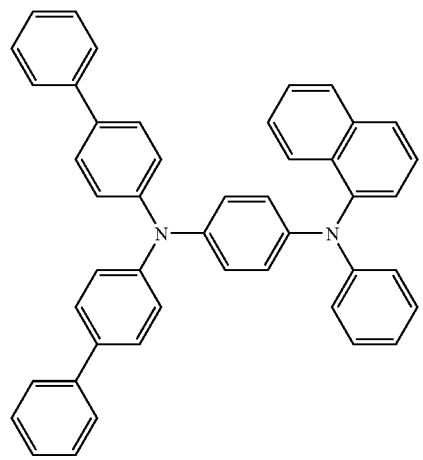
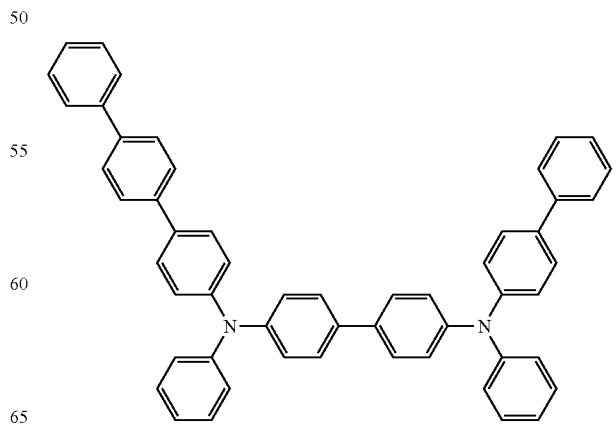

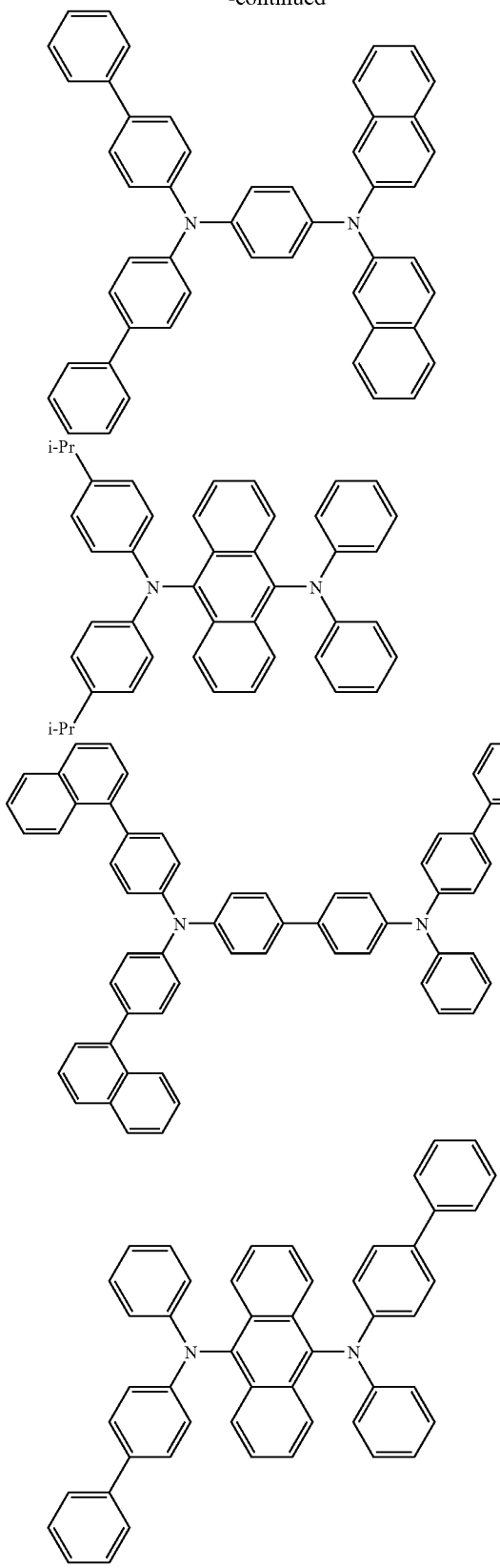

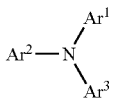

In Formula (II), definition of $Ar^1$ to $Ar^3$ is the same as definition of $Ar^1$ to $Ar^4$ in Formula (I). Examples of the compound represented by Formula (II) are shown below but the compound represented by Formula (II) is not limited to them.

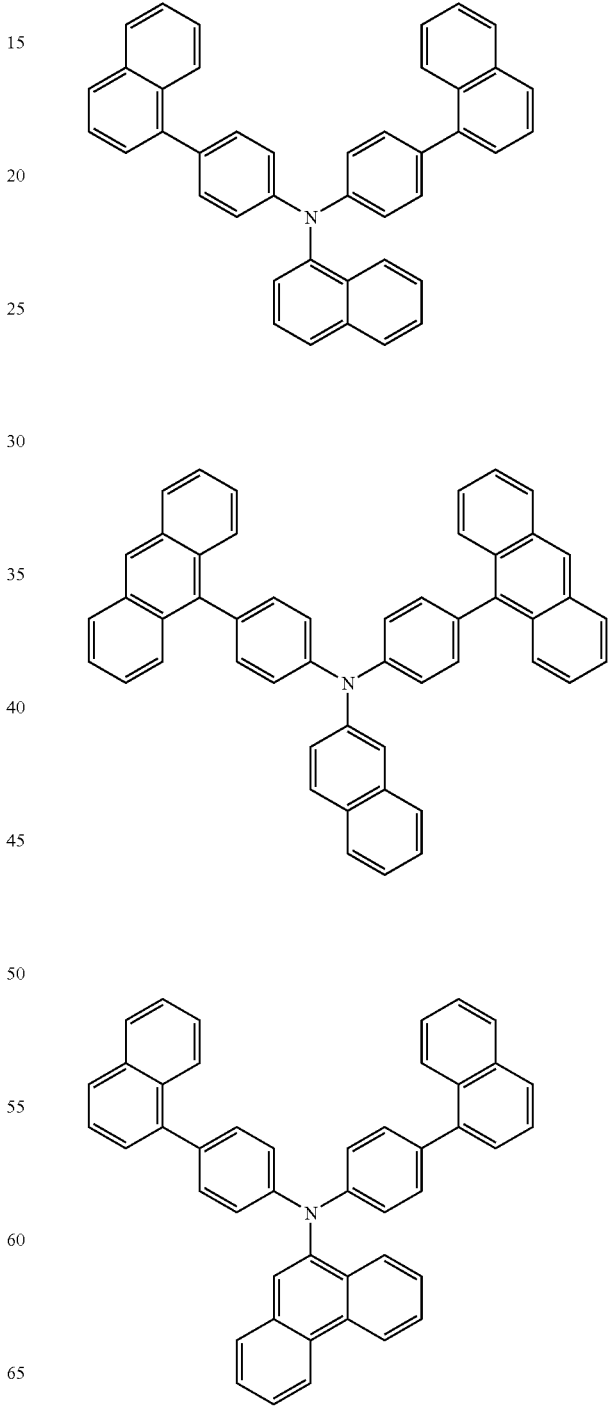

An aromatic amine represented by the following Formula (II) is also suitably used for forming the hole injecting layer or the hole transporting layer.

137
-continued
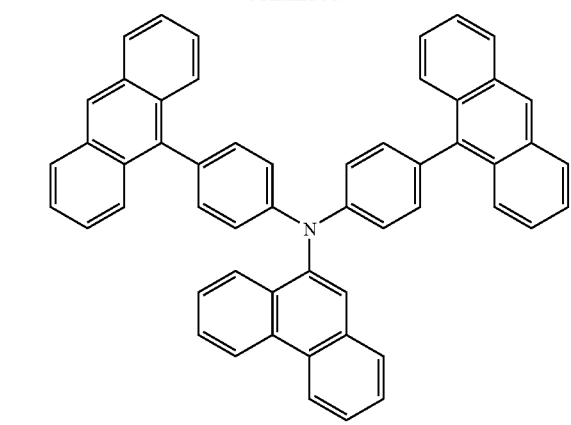
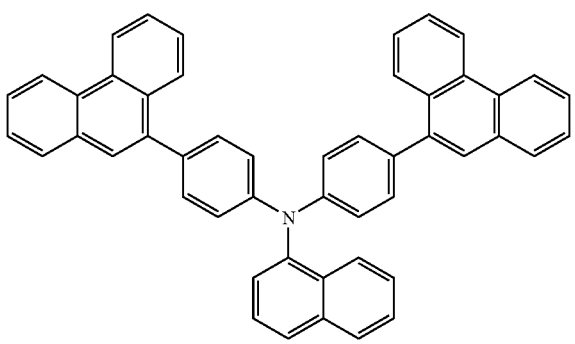
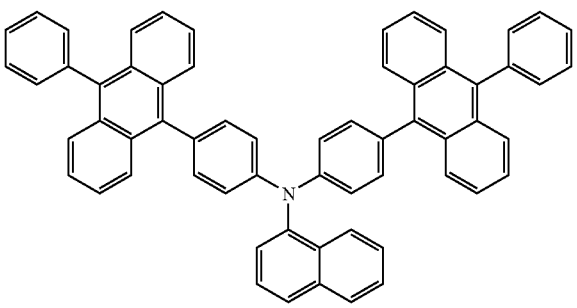
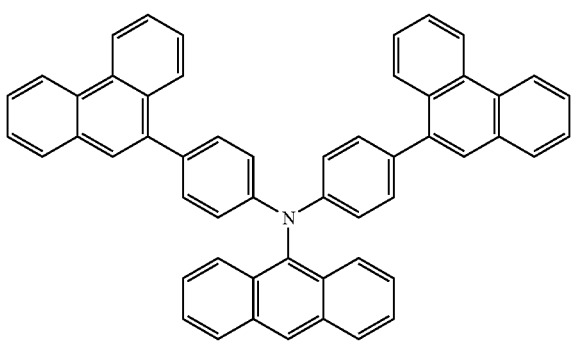
138
-continued
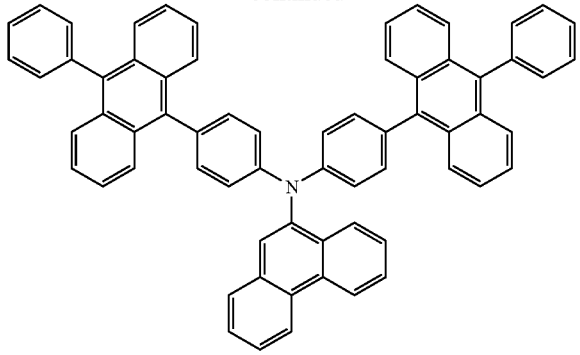
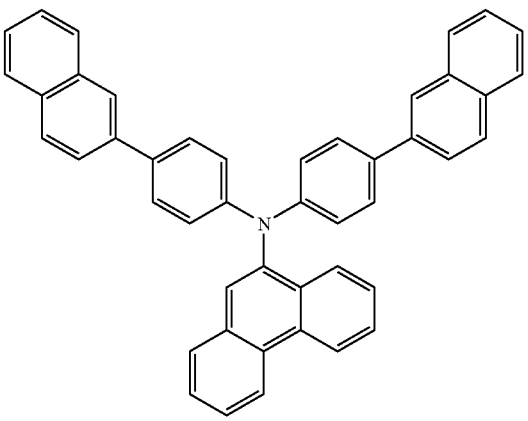
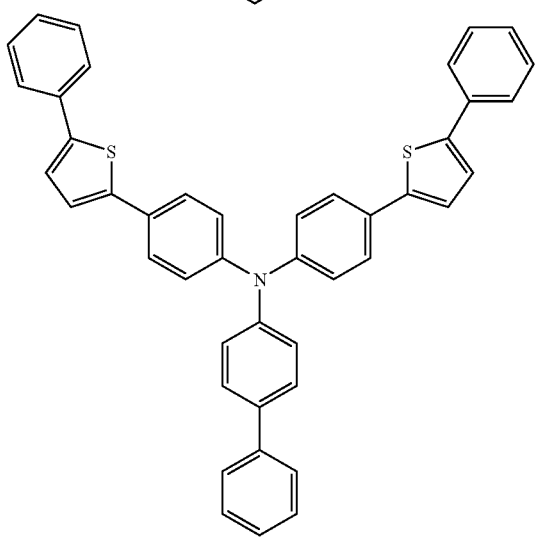
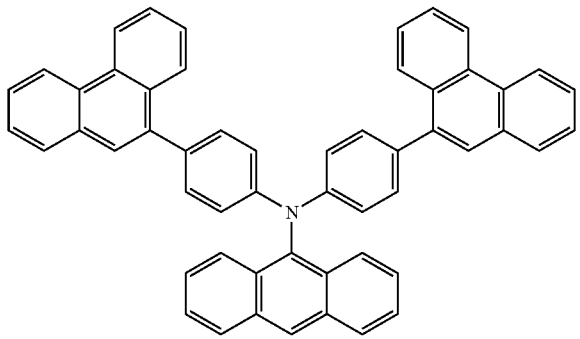

-continued

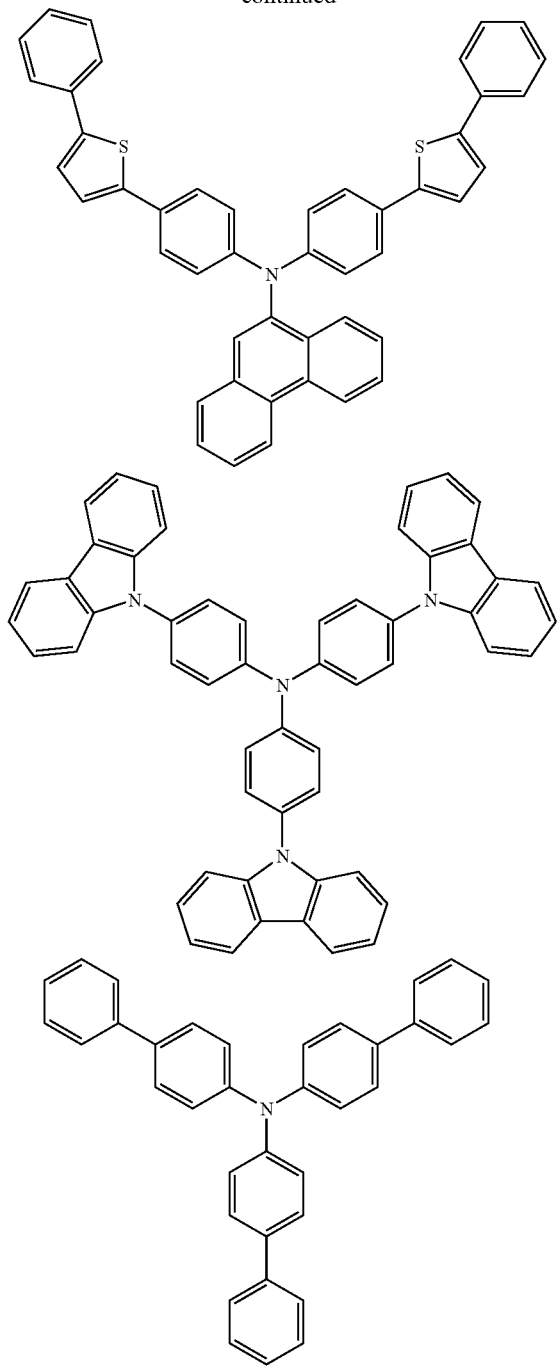

The present invention is not limited to the above description, and modifications that do not deviate from the scope of the present invention shall be included in the present invention.

For example, the following modifications are examples of suitable modifications of the present invention.

In the present invention, the emitting layer preferably contains a charge-injecting auxiliary material.

When the host material having a broad energy gap is used to form the emitting layer, a difference in ionization potential (Ip) between the host material and the hole injecting/transporting layer becomes so large that holes can hardly be injected into the emitting layer, and that the drive voltage required for the satisfactory luminance may be raised.

In the above case, addition of a hole injectable/transportable charge-injecting auxiliary material to the emitting layer makes it easy to inject holes into the emitting layer and can reduce the drive voltage.

For example, any conventional hole injecting/transporting material can be used as the charge-injecting auxiliary material.

Examples thereof include triazole derivatives (refer to U.S. Pat. No. 3,112,197 and the like), oxadiazole derivatives (refer to U.S. Pat. No. 3,189,447 and the like), imidazole derivatives (refer to JP-B-37-16096 and the like), polyarylalkane derivatives (refer to U.S. Pat. No. 3,615,402, ditto U.S. Pat. No. 3,820,989 and ditto U.S. Pat. No. 3,542,544, Japanese Patent Publication No. 45-555 and ditto No. 51-10983, Japanese Patent Application Laid-Open No. 51-93224, ditto No. 55-17105, ditto No. 56-4148, ditto No. 55-108667, ditto No. 55-156953 and ditto No. 56-36656), pyrazoline derivatives and pyrazolone derivatives (refer to U.S. Pat. No. 3,180,729 and ditto U.S. Pat. No. 4,278,746, Japanese Patent Application Laid-Open No. 55-88064, ditto No. 55-88065, ditto No. 49-105537, ditto No. 55-51086, ditto No. 56-80051, ditto No. 56-88141, ditto No. 57-45545, ditto No. 54-112637 and ditto No. 55-74546 and the like), phenylenediamine derivatives (refer to U.S. Pat. No. 3,615,404, Japanese Patent Publication No. 51-10105, ditto No. 46-3712 and ditto No. 47-25336, Japanese Patent Application Laid-Open No. 54-53435, ditto No. 54-110536 and ditto No. 54-119925 and the like), arylamine derivatives (refer to U.S. Pat. No. 3,567,450, ditto U.S. Pat. No. 3,180,703, ditto U.S. Pat. No. 3,240,597, ditto U.S. Pat. No. 3,658,520, ditto U.S. Pat. No. 4,232,103, ditto U.S. Pat. No. 4,175,961 and ditto U.S. Pat. No. 4,012,376, Japanese Patent Publication No. 49-35702 and ditto No. 39-27577. Japanese Patent Application Laid-Open No. 55-144250, ditto No. 56-119132 and ditto No. 56-22437, West German Patent No. 1,110,518 and the like), amino-substituted chalcone derivatives (refer to U.S. Pat. No. 3,526,501 and the like), oxazole derivatives (disclosed in U.S. Pat. No. 3,257,203 and the like), styrylanthracene derivatives (refer to Japanese Patent Application Laid-Open No. 56-46234 and the like), fluorenone derivatives (refer to Japanese Patent Application Laid-Open No. 54-110837 and the like), hydrazone derivatives (refer to U.S. Pat. No. 3,717,462, Japanese Patent Application Laid-Open No. 54-59143, ditto No. 55-52063, ditto No. 55-52064, ditto No. 55-46760, ditto No. 55-85495, ditto No. 57-11350 and ditto No. 57-148749, Japanese Patent Application Laid-Open No. 02-311591 and the like), stilbene derivatives (refer to Japanese Patent Application Laid-Open No. 61-210363, ditto No. 61-228451, ditto No. 61-14642, ditto No. 61-72255, ditto No. 62-47646, ditto No. 62-36674, ditto No. 62-10652, ditto No. 62-30255, ditto No. 60-93455, ditto No. 60-94462, ditto No. 60-174749 and ditto No. 60-175052 and the like), silazane derivatives (U.S. Pat. No. 4,950,950), polysilane base (Japanese Patent Application Laid-Open No. 02-204996), aniline base copolymers (Japanese Patent Application Laid-Open No. 02-282263), conductive polymer oligomers (particularly, thiophene oligomers) disclosed in Japanese Patent Application Laid-Open No. 01-211399 and the like.

The compounds described above are examples of the hole injecting material. The hole injecting material is preferably a porphyrin compound (disclosed in Japanese Patent Application Laid-Open No. 63-295695 or the like), an aromatic tertiary amine compound or a styrylamine compound (refer to U.S. Pat. No. 4,127,412, Japanese Patent Application Laid-Open No. 53-27033, ditto No. 54-58445, ditto No.

54-149634, ditto No. 54-64299, ditto No. 55-79450, ditto No. 55-144250, ditto No. 56-119132, ditto No. 61-295558, ditto No. 61-98353 and ditto No. 63-295695 and the like), and the aromatic tertiary amine compounds are particularly preferred.

In addition, compounds having two condensed aromatic rings in a molecule which are described in U.S. Pat. No. 5,061,569 such as 4,4'-bis(N-(1-naphthyl)-N-phenylamino) biphenyl (hereinafter abbreviated as NPD) and 4,4',4"-tris(N-(3-methylphenyl)-N-phenylamino)triphenylamine (hereinafter abbreviated as MTDATA) in which three triphenylamine units are connected in the form of a star burst type, which is described in Japanese Patent Application Laid-Open No. 04-308688.

Hexaazatriphenylene derivatives and the like described in Japanese Patent Publication No. 3614405 and 3571977 or U.S. Pat. No. 4,780,536 can also be suitably used as the hole injecting material.

Further, inorganic compounds such as p-type Si, and p-type SiC can also be used as the hole injecting material.

The forming methods of each layer of the organic EL device of the present invention are not specifically limited. A conventional forming method such as a vacuum vapor deposition or a spin coating can be used. The organic thin-film layer containing the compound represented by Formula (1), which is used for the organic EL device of the present invention, may be formed by a conventional coating method such as vacuum deposition, molecular beam epitaxy (MBE method) and coating methods using a solution such as a dipping, spin coating, casting, bar coating, and roll coating.

Although the thickness of each organic layer of the organic EL device is not particularly limited, the thickness is generally preferably in a range of several nanometers to 1 μm because excessively-thinned film likely entails defects such as a pin hole while excessively-thickened film requires high voltage to be applied and deteriorates efficiency.

SYNTHESIS EXAMPLE

Next, a manufacturing method of the host material according to the present invention will be described with reference to synthesis example(s). However, the present invention is not limited to such synthesis examples.

Synthesis Example 1

Synthesis of Compound A15

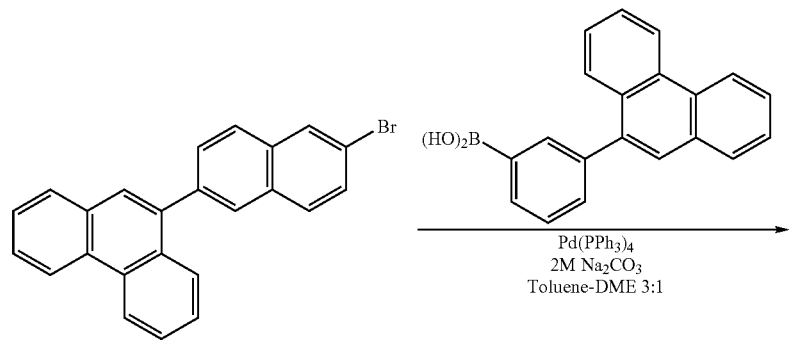

(A15)

Under an argon gas atmosphere, 8.0 g (21 mmol) of 2-bromo-6-(9-phenanthryl)naphthalene, 6.2 g (21 mmol) of 3-(9-phenanthryl) phenylboronic acid, 490 mg (0.42 mmol) of tetrakis(triphenylphosphine)palladium(0), 150 mL of toluene, 50 mL of dimethoxyethane and 30 mL of 2M sodium carbonate solution were mixed, and stirred for 12 hours at 90 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 6.4 g of the compound A15 was obtained at an yield of 55%.

Mass-spectrum analysis consequently showed that m/e was equal to 556 while a calculated molecular weight was 556.69.

Synthesis Example 2

Synthesis of Compound A16

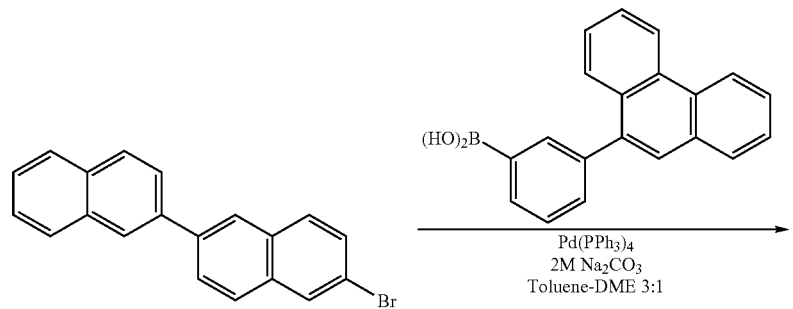

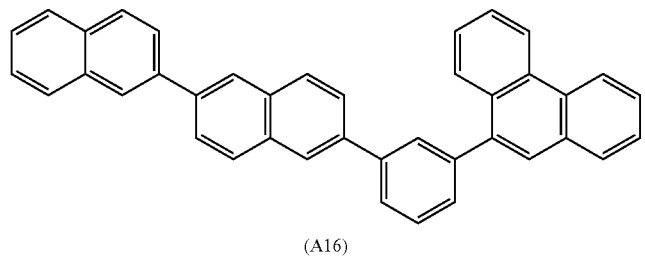

(A16)

Under an argon gas atmosphere, 10.0 g (30 mmol) of 2-bromo-6-(2-naphthyl)naphthalene, 8.9 g (30 mmol) of 3-(9-phenanthryl)phenylboronic acid, 700 mg (0.60 mmol) of tetrakis(triphenylphosphine)palladium(0), 200 mL of toluene, 65 mL of dimethoxyethane and 42 mL of 2M sodium carbonate solution were mixed, and stirred for 12 hours at 90 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 7.8 g of the compound A16 was obtained at an yield of 51%.

Mass-spectrum analysis consequently showed that m/e was equal to 506 while a calculated molecular weight was 506.63.

Synthesis Example 3

Synthesis of Compound A24

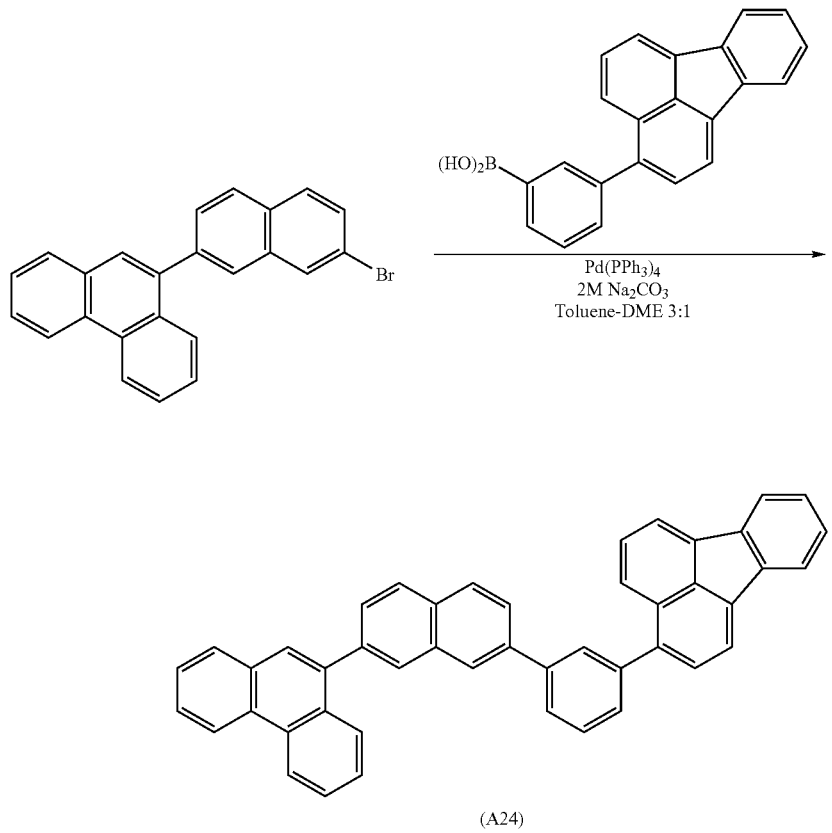

(A24)

Under an argon gas atmosphere, 8.0 g (21 mmol) of 2-bromo-6-(9-phenanthryl)naphthalene, 6.8 g (21 mmol) of 3-(3-fluoranthenyl)phenylboronic acid, 490 mg (0.42 mmol) of tetrakis(triphenylphosphine)palladium(0), 150 mL of toluene, 50 mL of dimethoxyethane and 30 mL of 2M sodium carbonate solution were mixed, and stirred for 12 hours at 90 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 4.9 g of the compound A24 was obtained at an yield of 40%.

Mass-spectrum analysis consequently showed that m/e was equal to 580 while a calculated molecular weight was 580.71.

Synthesis Example 4

Synthesis of Compound B2

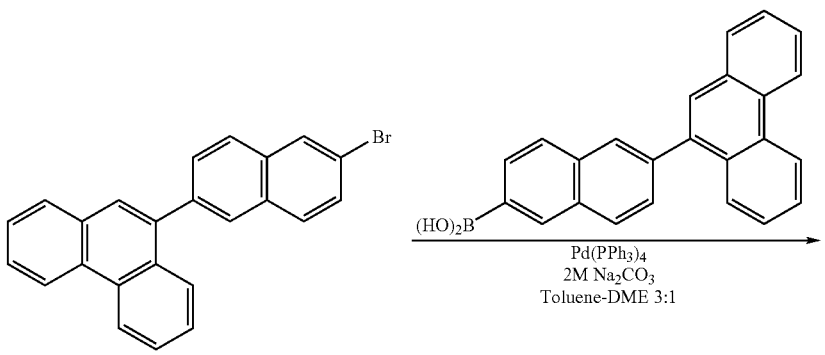

-continued

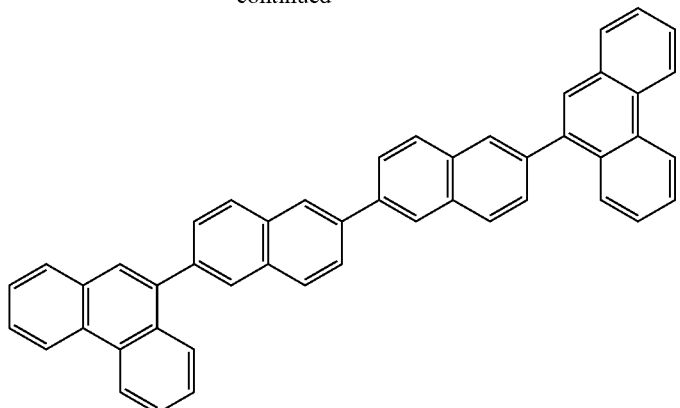

(B2)

Under an argon gas atmosphere, 8.0 g (21 mmol) of 2-bromo-6-(9-phenanthryl)naphthalene, 7.3 g (21 mmol) of 2-(9-phenanthryl)naphthylboronic acid, 490 mg (0.42 mmol) of tetrakis(triphenylphosphine)palladium(0), 150 mL of toluene, 50 mL of dimethoxyethane and 30 mL of 2M sodium carbonate solution were mixed, and stirred for 12 hours at 90 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 4.0 g of the compound B2 was obtained at an yield of 32%.

Mass-spectrum analysis consequently showed that m/e was equal to 606 while a calculated molecular weight was 606.75.

Synthesis Example 5

Synthesis of Compound B8

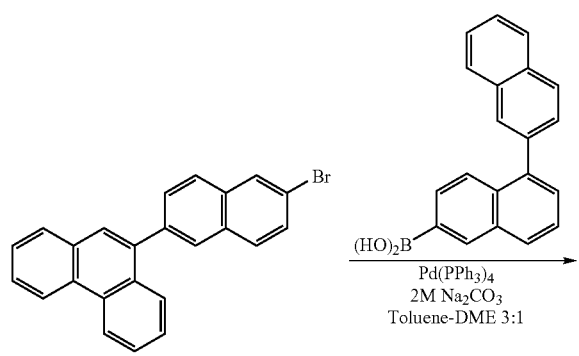

-continued

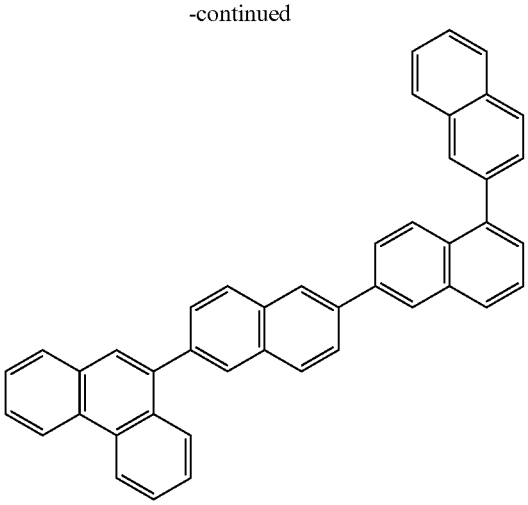

(B8)

Under an argon gas atmosphere, 8.0 g (21 mmol) of 2-bromo-6-(9-phenanthryl)naphthalene, 6.3 g (21 mmol) of 1-(2-naphthyl)-6 naphthylboronic acid, 490 mg (0.42 mmol) of tetrakis(triphenylphosphine)palladium(0), 150 mL of toluene, 50 mL of dimethoxyethane and 30 mL of 2M sodium carbonate solution were mixed, and stirred for 12 hours at 90 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 5.7 g of the compound B8 was obtained at an yield of 49%.

Mass-spectrum analysis consequently showed that m/e was equal to 556 while a calculated molecular weight was 556.69.

Synthesis Example 6

Synthesis of Compound B10

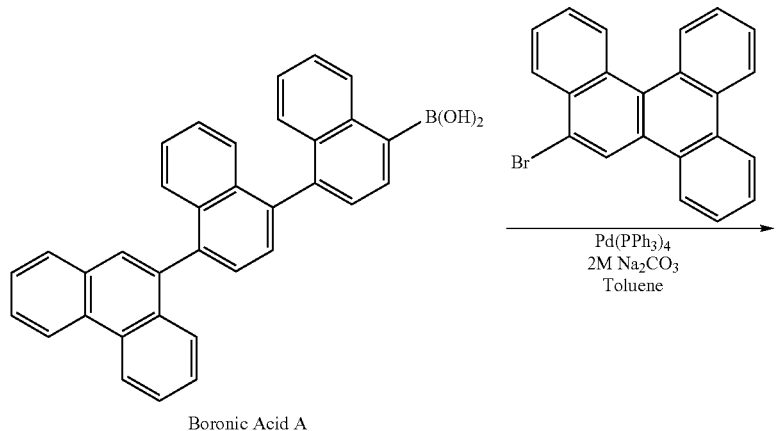

Boronic Acid A

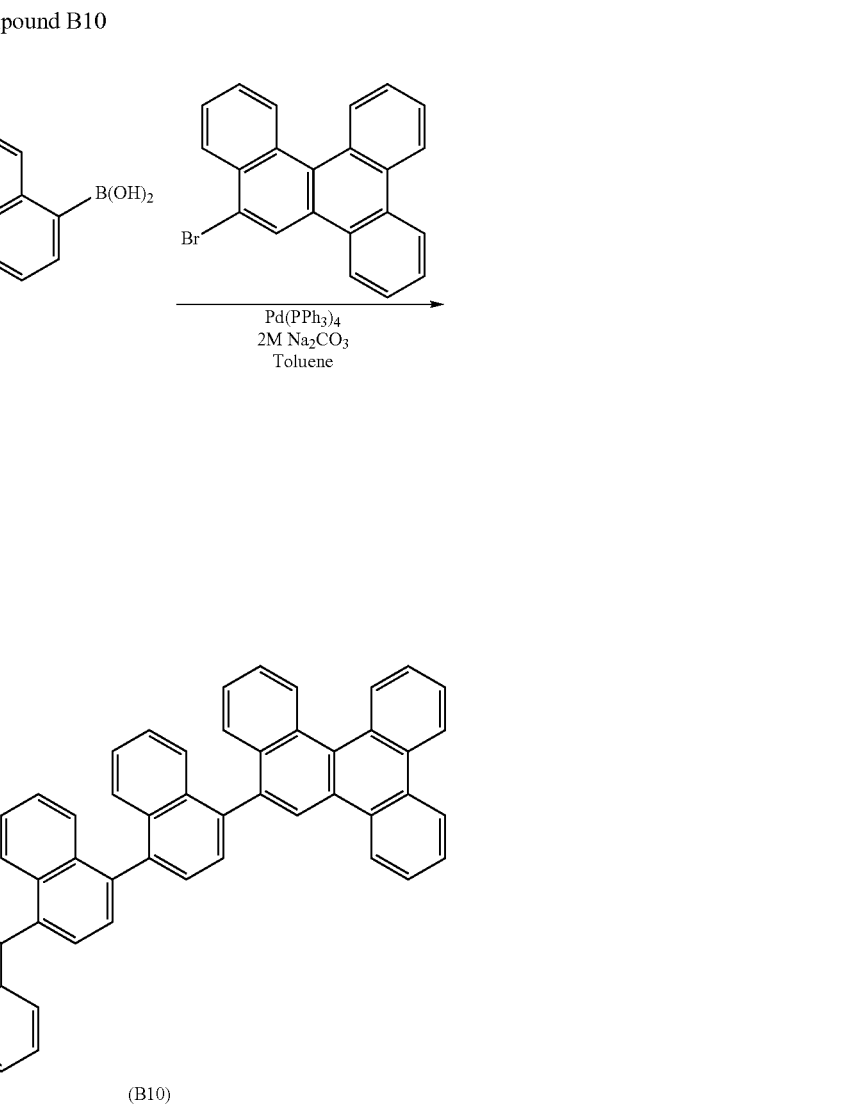

(B10)

Under an argon gas atmosphere, 6.4 g (13 mmol) of boronic acid A, 4.6 g (13 mmol) of benzochrysene bromide, 300 mg (0.26 mmol) of tetrakis(triphenylphosphine)palladium(0), 150 mL of toluene and 20 mL of 2M sodium carbonate solution were mixed, and stirred for 10 hours at 110 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 3.2 g of the compound B10 was obtained at an yield of 35%.

Mass-spectrum analysis consequently showed that m/e was equal to 706 while a calculated molecular weight was 706.87.

Synthesis Example 7

Synthesis of Compound C7

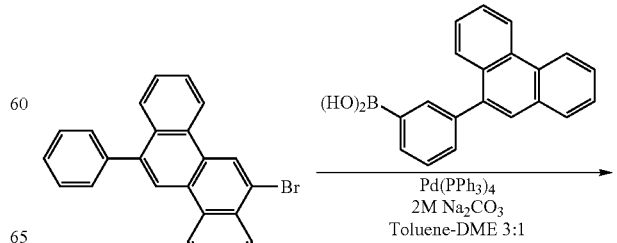

-continued

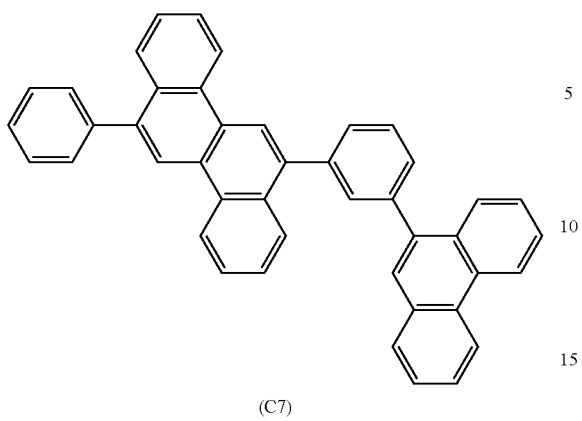

(C7)

-continued

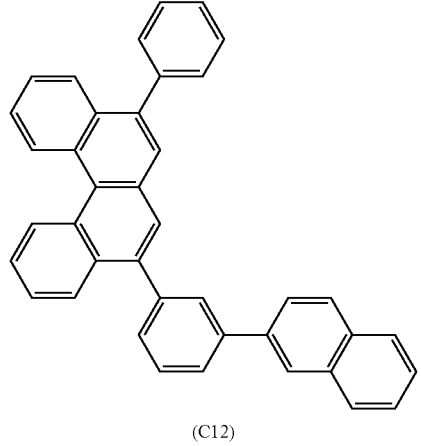

(C12)

Under an argon gas atmosphere, 10.0 g (26 mmol) of 6-bromo-12-phenylchrysene, 7.8 g (26 mmol) of 3-(9-phenanthryl)phenylboronic acid, 640 mg (0.55 mmol) of tetrakis(triphenylphosphine)palladium(0), 200 mL of toluene, 65 mL of dimethoxyethane and 40 mL of 2M sodium carbonate solution were mixed, and stirred for 12 hours at 90 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 4.2 g of the compound C7 was obtained at an yield of 29%.

Mass-spectrum analysis consequently showed that m/e was equal to 556 while a calculated molecular weight was 556.69.

Synthesis Example 8

Synthesis of Compound C12

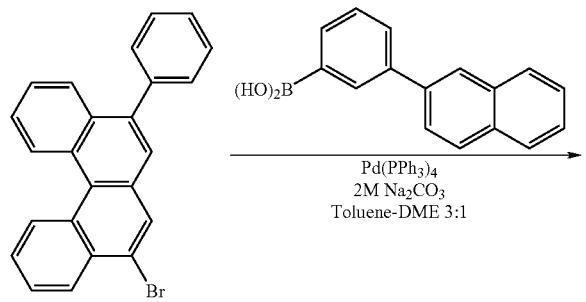

Under an argon gas atmosphere, 6.0 g (16 mmol) of 2-bromo-9-phenylbenz[c]phenanthrene, 3.9 g (16 mmol) of 3-(2-naphthyl)phenylboronic acid, 380 mg (0.32 mmol) of tetrakis(triphenylphosphine)palladium(0), 150 mL of toluene, 50 mL of dimethoxyethane and 25 mL of 2M sodium carbonate solution were mixed, and stirred for 12 hours at 90 degrees C. Subsequently, the reaction mixture was cooled down to room temperature, added with water and stirred for one hour at room temperature. Then, the reaction mixture was extracted by toluene. After liquid separation, organic phase thereof was cleansed with saturated saline solution and dried with anhydrous sodium sulfate. The solvent was distilled away under reduced pressure, and the residue was refined by silica-gel column chromatography and recrystallized by toluene, such that 2.1 g of the compound C12 was obtained at an yield of 26%.

Mass-spectrum analysis consequently showed that m/e was equal to 506 while a calculated molecular weight was 506.63.

A machine used in the measurement of mass spectrometry and measurement conditions thereof in the above synthesis examples will be described below.

Machine: JSM-700 (manufactured by Japan Electron Optics Laboratories Ltd.)
Conditions: accelerating voltage of 8 kV
Scan range m/z of 50 to 3000
Emitter type: carbon
emitter current: 0 mA→2 mA/minute→40 mA (maintained for 10 minutes)

EXAMPLES

Next, the present invention will be described in further detail by exemplifying Example(s) and Comparative(s). However, the present invention is not limited by the description of Example(s).

Note that solid-property values of each material, which is shown in the Table below, are measured in the following manner.

Triplet energy gap Eg was defined based on phosphorescence spectrum.

Specifically, each material was dissolved in an EPA solvent (diethylether:isopentane:ethanol=5:5:2 in volume ratio) with a concentration of 10 μmol/L, thereby forming a sample for phosphorescence measurement.

Then, the sample for phosphorescence measurement was put into a quartz cell, cooled to 77K and irradiated with exciting light, so that phosphorescence radiated therefrom was measured in terms of its wavelength.

A tangent line was drawn to be tangent to a rising section adjacent to short-wavelength of the obtained phosphorescence spectrum, a wavelength value thereof was converted into energy value, and the converted energy value was defined as the triplet energy gap Eg(T).

For the measurement, a commercially-available measuring equipment F-4500 (manufactured by Hitachi, Ltd.) was used.

Structures of compounds used in Examples and Comparatives will be shown below.

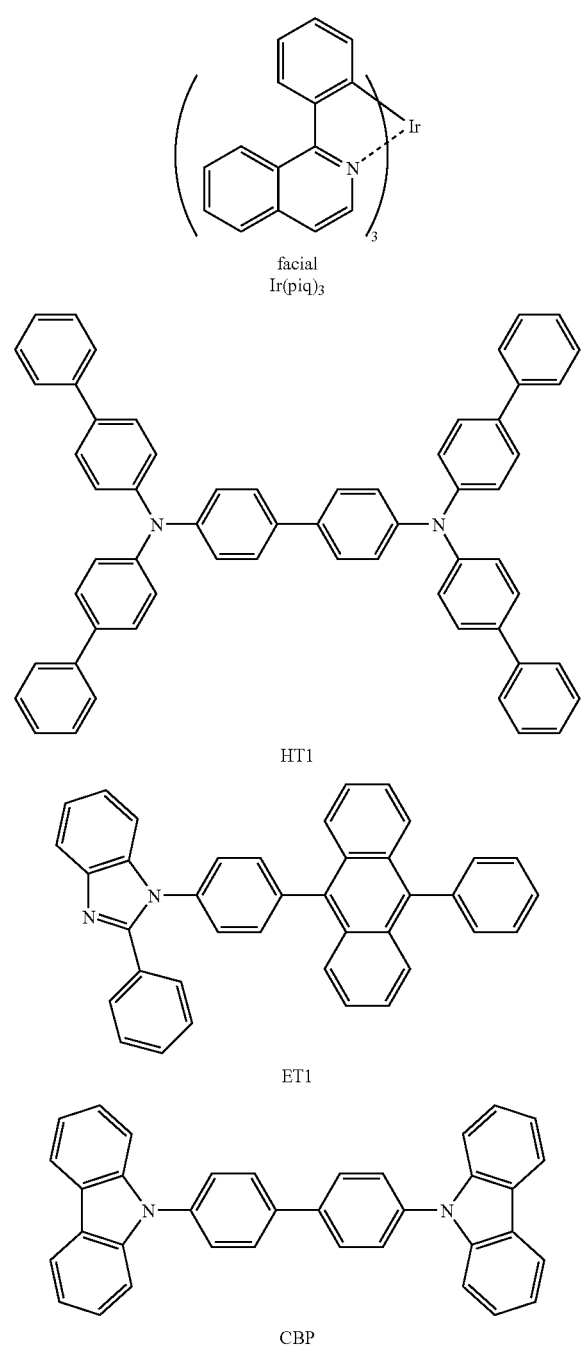

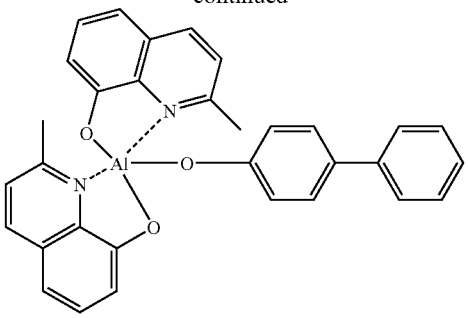

BAlq (A)

(B)

Example 1

Manufacturing of Organic EL Device

A glass substrate (size: 25 mm×75 mm×0.7 mm thick) having an ITO transparent electrode (manufactured by Asahi Glass Co., Ltd) was ultrasonic-cleaned in isopropyl alcohol for five minutes, and then UV/ozone-cleaned for 30 minutes. After the glass substrate having the transparent electrode line was cleaned, the glass substrate was mounted on a vacuum deposition apparatus, so that 50-nm thick film of HT1 was initially formed to cover a surface of the glass substrate where the transparent electrode line was provided. The HT1 film serves as a hole injecting/transporting layer. Subsequently to the formation of the hole injecting/transporting layer, 40-nm thick film of the compound B24 and a film of Ir(piq)$_3$ as a phosphorescent dopant were co-evaporated by resistance heating so that Ir(piq)$_3$ was contained therein with a content of 10 mass %. The co-deposited film serves as an emitting layer (phosphorescent emitting layer). After the film of the emitting layer was formed, 40-nm thick film of ET1 was formed. The film of ET1 serves as an electron transporting layer. Then, 0.5-nm thick film of LiF was formed as an electron-injecting electrode (cathode) at a film-forming speed of 1 nm/min. Metal (Al) was vapor-deposited on the LiF film to form a 150-nm thick metal cathode, thereby providing the organic EL device.

Examples 2 to 10 and Comparatives 1 to 4

The organic EL devices according respectively to Examples 2 to 10 and Comparatives 1 to 4 were formed by the same method as Example 1 except that host compounds shown in Table 1 were respectively used in place of the compound B24.

[Evaluation on Emitting Performance of Organic EL Device]

The organic EL devices according to Examples 1 to 10 and Comparatives 1 to 4 each were driven by direct-current electricity to emit light, so that voltage at a current density of 10 mA/cm$^2$, luminous efficiency and time elapsed until the initial luminance intensity of 3000 cd/m$^2$ was reduced to the half (i.e., time until half-life) were measured for each organic EL device. Then, pixel uniformity when each organic EL device was driven at 70 degrees C. was visually checked, among which devices having uniform pixels are rated as G while devices having ununiform pixels are rated as N. The results of the evaluation are shown in Table 1.

TABLE 1

| | Host Material | Eg (T) of Host Material (eV) | Voltage (V) | Luminous Efficiency (cd/A) | Time until Half-life (hour) | Pixel Uniformity when Driven at 70° C. |
|---|---|---|---|---|---|---|
| Example 1 | Compound B24 | 2.45 | 4.5 | 10.0 | 7000 | G |
| Example 2 | Compound B15 | 2.48 | 4.3 | 9.8 | 9000 | G |
| Example 3 | Compound A15 | 2.47 | 4.3 | 12.3 | 12500 | G |
| Example 4 | Compound A16 | 2.44 | 4.7 | 10.4 | 11500 | G |
| Example 5 | Compound A24 | 2.38 | 4.4 | 10.0 | 10500 | G |
| Example 6 | Compound B2 | 2.48 | 4.4 | 9.8 | 9500 | G |
| Example 7 | Compound B8 | 2.48 | 4.5 | 10.6 | 10000 | G |
| Example 8 | Compound B10 | 2.35 | 4.8 | 11.2 | 9000 | G |
| Example 9 | Compound C7 | 2.41 | 4.8 | 9.4 | 8800 | G |
| Example 10 | Compound C12 | 2.38 | 4.7 | 9.6 | 7800 | G |
| Comparative 1 | CBP | 2.81 | 5.7 | 6.3 | 1200 | N |
| Comparative 2 | BALq | 2.28 | 5.3 | 7.0 | 2300 | N |
| Comparative 3 | Compound A | 2.51 | 5.2 | 7.5 | 3800 | N |
| Comparative 4 | Compound B | 2.65 | 5.1 | 8.7 | 3400 | N |

As is clearly understood from Table 1, the organic EL device according to each of Examples 1 to 10, which was formed of the host material according to the present invention, has been found to be excellent in luminous efficiency with its external quantum efficiency being high, and to have considerably long lifetime.

Comparative 1 required high voltage and exhibited considerably short lifetime.

Comparative 2 required less high voltage but exhibited short lifetime.

Comparatives 3 and 4 required less high voltage but exhibited shorter lifetime than Examples 1 to 10.

The combination of the materials according to the present invention enables the luminous efficiency to be enhanced because the triplet energy gap of the host material and the triplet energy gap of the dopant are well-balanced, and enables the device to have a longer lifetime than a device provided by a conventional combination of materials because the emitting material is highly tolerant of the holes and electrons with the host material not being substituted by nitrogen-containing ring(s) or nitrogen atom(s). In addition, since the thin film(s) is favorably thermostable, a device that is stable even when driven at 70 degrees C. can be obtained.

The priority application Numbers JP2007-179109, JP2007-179120 and JP2007-179121 upon which this patent application is based are hereby incorporated by reference.

What is claimed is:

1. An organic electroluminescence device, comprising:
   a cathode;
   an anode; and
   a single-layered or multilayered organic thin-film layer provided between the cathode and the anode, wherein
   the organic thin-film layer comprises at least one emitting layer, and
   the at least one emitting layer comprises at least one phosphorescent material with a maximum wavelength of 570 to 720 nm and a host material represented by a Formula (1) as follows, $$Ra\text{—}Ar^1\text{—}Ar^2\text{—}Rb \tag{1}$$

wherein
   Ra is a substituted or non-substituted fluoranthene ring,
   Ar$^1$ is a substituted or non-substituted benzene ring,
   Ar$^2$ is a substituted or non-substituted naphthalene ring, and
   Rb represents a substituted or non-substituted phenanthrene ring, and
   substituents for Ra, Rb, Ar$^1$ and Ar$^2$ are not aryl groups.

2. The organic electroluminescence device according to claim 1, wherein, when Ra, Rb, Ar$^1$ or Ar$^2$ in the Formula (1) has one or plural substituent(s), the one or plural substituent(s) is an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom.

3. The organic electroluminescence device according to claim 1, wherein an excited triplet energy of the host material is in a range of 2.0 eV to 2.8 eV.

4. The organic electroluminescence device according to claim 1, wherein the phosphorescent material comprises a metal complex, and the metal complex comprises: a metal atom selected from a group consisting of Ir, Pt, Os, Au, Cu, Re and Ru; and a ligand.

5. The organic electroluminescence device according to claim 4, wherein the metal complex has an ortho-metal bond.

6. The organic electroluminescence device according to claim 1, wherein the organic thin-film layer comprises an electron transporting layer or an electron injecting layer between the cathode and the emitting layer, and
   the electron transporting layer or the electron injecting layer contains an aromatic ring having a nitrogen-containing six-membered or five-membered ring skeleton or a condensed aromatic ring compound having a nitrogen-containing six-membered or five-membered ring skeleton.

7. The organic electroluminescence device according to claim 1, wherein a reductive dopant is present at an interfacial region between the cathode and the organic thin-film layer.

8. The organic electroluminescence device according to claim 1, wherein, when Ra, Rb, Ar$^1$ or Ar$^2$ in the Formula (1)

has one or plural substituent(s), the one or plural substituent(s) is an alkyl group having 1 to 20 carbon atoms.

9. The organic electroluminescence device according to claim 1, wherein, when Ra, Rb, $Ar^1$ or $Ar^2$ in the Formula (1) has one or plural substituent(s), the one or plural substituent(s) a haloalkyl group having 1 to 20 carbon atoms.

10. The organic electroluminescence device according to claim 1, wherein, when Ra, Rb, $Ar^1$ or $Ar^2$ in the Formula (1) has one or plural substituent(s), the one or plural substituent(s) a cycloalkyl group having 5 to 18 carbon atoms.

11. The organic electroluminescence device according to claim 1, wherein, when Ra, Rb, $Ar^1$ or $Ar^2$ in the Formula (1) has one or plural substituent(s), the one or plural substituent(s) a silyl group having 3 to 20 carbon atoms.

12. The organic electroluminescence device according to claim 1, wherein, when Ra, Rb, $Ar^1$ or $Ar^2$ in the Formula (1) has one or plural substituent(s), the one or plural substituent(s) a cyano group.

13. The organic electroluminescence device according to claim 1, wherein, when Ra, Rb, $Ar^1$ or $Ar^2$ in the Formula (1) has one or plural substituent(s), the one or plural substituent(s) a halogen atom.

14. The organic electroluminescence device according to claim 1, wherein the phosphorescent material comprises a metal complex, and the metal complex comprises: Ir and a ligand.

15. The organic electroluminescence device according to claim 1, wherein the phosphorescent material comprises a metal complex, and the metal complex comprises: Pt and a ligand.

* * * * *